(12) United States Patent
Hoffman et al.

(10) Patent No.: US 7,075,696 B2
(45) Date of Patent: Jul. 11, 2006

(54) CORRECTION OF BIREFRINGENCE IN CUBIC CRYSTALLINE OPTICAL SYSTEMS

(75) Inventors: Jeffrey M. Hoffman, Tucson, AZ (US); James P. McGuire, Jr., Pasadena, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/251,959

(22) Filed: Oct. 18, 2005

(65) Prior Publication Data

US 2006/0050400 A1 Mar. 9, 2006

Related U.S. Application Data

(63) Continuation of application No. 10/921,345, filed on Aug. 19, 2004, which is a continuation of application No. 10/371,266, filed on Feb. 20, 2003, now Pat. No. 6,917,458, which is a continuation of application No. 10/071,375, filed on Feb. 7, 2002, now Pat. No. 6,683,710.

(60) Provisional application No. 60/295,212, filed on Jun. 1, 2001, now abandoned, provisional application No. 60/296,694, filed on Jun. 6, 2001, now abandoned, provisional application No. 60/299,497, filed on Jun. 20, 2001, now abandoned, provisional application No. 60/299,603, filed on Jun. 20, 2001, now abandoned, provisional application No. 60/335,093, filed on Oct. 30, 2001, now abandoned, provisional application No. 60/332,183, filed on Nov. 21, 2001, now abandoned.

(51) Int. Cl.
*G02F 1/03* (2006.01)
*G02B 27/28* (2006.01)
*G03B 27/54* (2006.01)

(52) U.S. Cl. .......................... 359/256; 359/499; 355/67

(58) Field of Classification Search ................. 359/251, 359/252, 256, 494, 497, 499, 500, 501; 355/67
See application file for complete search history.

(56) References Cited

U.S. PATENT DOCUMENTS 3,758,201 A 9/1973 MacNeille (Continued)

FOREIGN PATENT DOCUMENTS

DE 101 23 725 11/2002

(Continued)

OTHER PUBLICATIONS

English translation of U.S. Appl. No. 60/308,844, filed Aug. 1, 2001 (filed in USPTO on Oct. 23, 2003).

(Continued)

*Primary Examiner*—Scott J. Sugarman
*Assistant Examiner*—William Choi
(74) *Attorney, Agent, or Firm*—Pillsbury Winthrop Shaw Pittman, LLP

(57) ABSTRACT

A lithographic apparatus includes a projection system, which includes a plurality of cubic crystalline optical elements that each impart retardance to a beam of radiation. The optical elements are aligned along an optical axis of the projection system and include two adjacent crystalline optical elements having a common crystalline lattice direction oriented along the optical axis. A first of the two adjacent elements is rotated about the optical axis with respect to a second of the adjacent elements with a predetermined rotation angle. The crystalline optical elements are selected and positioned along the optical axis and the rotation angle is selected such that, for each of two substantially perpendicular polarization states of the beam of radiation having a radiation wavelength of about 193 nm, the patterned beam of radiation has less than about 0.012 waves RMS of wavefront aberration across an exit pupil of the projection system.

19 Claims, 55 Drawing Sheets

U.S. PATENT DOCUMENTS

| | | | |
|---|---|---|---|
| 4,239,329 | A | 12/1980 | Matsumoto |
| 4,534,649 | A | 8/1985 | Downs |
| 4,576,479 | A | 3/1986 | Downs |
| 5,033,830 | A | 7/1991 | Jameson |
| 5,410,375 | A | 4/1995 | Fiala |
| 5,537,260 | A | 7/1996 | Williamson |
| 5,719,698 | A | 2/1998 | Hiraiwa et al. |
| 6,081,382 | A | 6/2000 | Omura |
| 6,084,708 | A | 7/2000 | Schuster |
| 6,137,626 | A | 10/2000 | Takaoka |
| 6,172,380 | B1 | 1/2001 | Noguchi et al. |
| 6,195,213 | B1 | 2/2001 | Omura et al. |
| 6,201,634 | B1 | 3/2001 | Sakuma et al. |
| 6,252,712 | B1 | 6/2001 | Furter et al. |
| 6,259,508 | B1 | 7/2001 | Shigematsu |
| 6,324,003 | B1 | 11/2001 | Martin |
| 6,366,404 | B1 | 4/2002 | Hiraiwa et al. |
| 6,411,384 | B1 | 6/2002 | Sakuma et al. |
| 6,417,974 | B1 | 7/2002 | Schuster |
| 6,455,862 | B1 | 9/2002 | van der Veen et al. |
| 6,583,931 | B1 | 6/2003 | Hiraiwa et al. |
| 6,665,126 | B1 * | 12/2003 | Shafer et al. ............... 359/649 |
| 6,672,109 | B1 | 1/2004 | Hiraiwa |
| 6,683,710 | B1 | 1/2004 | Hoffman et al. |
| 6,683,729 | B1 | 1/2004 | Schuster |
| 6,697,199 | B1 | 2/2004 | Gerhard et al. |
| 6,728,043 | B1 | 4/2004 | Gruner et al. |
| 6,775,063 | B1 | 8/2004 | Shiraishi |
| 6,844,972 | B1 | 1/2005 | McGuire, Jr. |
| 2001/0026006 | A1 | 10/2001 | Noble et al. |
| 2002/0085176 | A1 | 7/2002 | Hiraiwa et al. |
| 2002/0149848 | A1 | 10/2002 | Labus |
| 2002/0149855 | A1 | 10/2002 | Schuster |
| 2002/0186355 | A1 | 12/2002 | Omura |
| 2003/0000453 | A1 | 1/2003 | Unno et al. |
| 2003/0007253 | A1 | 1/2003 | Schuster et al. |
| 2003/0011893 | A1 | 1/2003 | Shiraishi et al. |
| 2003/0012724 | A1 | 1/2003 | Burnett et al. |
| 2003/0021026 | A1 | 1/2003 | Allan et al. |
| 2003/0025894 | A1 | 2/2003 | Owa et al. |
| 2003/0053036 | A1 | 3/2003 | Fujishima et al. |
| 2003/0058421 | A1 | 3/2003 | Omura et al. |
| 2003/0063393 | A1 | 4/2003 | Omura |
| 2003/0067679 | A1 | 4/2003 | Allan et al. |
| 2003/0086071 | A1 | 5/2003 | McGuire, Jr. |
| 2003/0086156 | A1 | 5/2003 | McGuire, Jr. |
| 2003/0086157 | A1 | 5/2003 | McGuire, Jr. |
| 2003/0086171 | A1 | 5/2003 | McGuire |
| 2003/0089299 | A1 | 5/2003 | Obara et al. |
| 2003/0091934 | A1 | 5/2003 | Allan et al. |
| 2003/0112501 | A1 | 6/2003 | Sakuma |
| 2003/0128349 | A1 | 7/2003 | Unno |
| 2003/0147061 | A1 | 8/2003 | Omura |
| 2003/0168597 | A1 | 9/2003 | Webb et al. |
| 2003/0197946 | A1 | 10/2003 | Omura |
| 2004/0001244 | A1 | 1/2004 | Schuster |
| 2004/0004757 | A1 | 1/2004 | Schuster |
| 2004/0004771 | A1 | 1/2004 | Omura |
| 2004/0005266 | A1 | 1/2004 | Sakuma et al. |
| 2004/0036961 | A1 | 2/2004 | McGuire, Jr. |
| 2004/0036971 | A1 | 2/2004 | McGuire, Jr. |
| 2004/0036985 | A1 | 2/2004 | McGuire, Jr. |
| 2004/0105170 | A1 | 6/2004 | Krahmer et al. |
| 2004/0136084 | A1 | 7/2004 | Unno |

FOREIGN PATENT DOCUMENTS

| | | |
|---|---|---|
| DE | 101 23 727 | 11/2002 |
| DE | 101 27 320 | 12/2002 |
| DE | 101 25 487 | 1/2003 |
| DE | 102 10 782 | 10/2003 |
| EP | 0828172 A1 | 3/1998 |
| EP | 1063684 A1 | 12/2000 |
| EP | 1115019 A2 | 7/2001 |
| EP | 1139138 | 10/2001 |
| JP | 2000-331927 A | 11/2000 |
| JP | 2002-302628 | 10/2002 |
| JP | 2003-050349 | 2/2003 |
| WO | WO 01/01182 | 1/2001 |
| WO | WO 02/093209 A2 | 11/2002 |
| WO | WO 02/093257 | 11/2002 |
| WO | WO 02/097508 A1 | 12/2002 |
| WO | WO 02/099500 | 12/2002 |
| WO | WO 03/001271 A1 | 1/2003 |
| WO | WO 03/003429 | 1/2003 |
| WO | WO 03/007046 | 1/2003 |
| WO | WO 03/009021 | 1/2003 |
| WO | WO 03/009050 A1 | 1/2003 |
| WO | WO 03/009062 | 1/2003 |
| WO | WO 03046634 | 6/2003 |
| WO | WO 03/077007 | 9/2003 |
| WO | WO 03/077011 | 9/2003 |
| WO | WO 03/088330 | 10/2003 |
| WO | WO 04/008254 | 1/2004 |

OTHER PUBLICATIONS

Burnett et al., "Intrinsic Birefringence in 157 nm Materials," Proc. 2$^{nd}$, Intl. Symp on 157 nm Lithography, 2001, pp. 1-13, International SEMATECH, Austin, Texas.

Burnett et al., "Intrinsic Birefringence in 157 nm Materials," Proceedings of the International Symposium on 157 nm Lithography, Dana Point, CA, May 15, 2001, XP002218849, pp. 1-13.

Burnett et al., "Intrinsic Birefringence in Calcium Fluoride," preprinted handed out at 2$^{nd}$ International Symposium on 157 nm Lithography, Dana Point, CA, May 15, 2001, XP002232195, pp. 1-17.

Burnett et al., "Alternative Materials Development (LITJ216) Final Report—Stress Birefringence, Intrinsic Birefringence, and Index Properties of 157 nm Refractive Materials," International SEMATECH, Feb. 28, 2002, 33 pages.

Krahmer, "Intrinsic Birefringence in $CaF_2$," at $CaF_2$ Birefringence Workshop, Intl SEMATECH, Jul. 18, 2001, pp. 1-9.

Morton et al., "Testing Optical Damage for 157 nm Lithography," Semiconductor International, http://www.e-insite.net/semicoductor/index.asp?layout=article&stt (Feb. 2002).

Hand, "157 nm Optics Demand a Bag of Tricks," Semiconductor International, http://www.e-insite.net/semiconducotr/index.asp?layout=article&stt (Feb. 2001).

Shiraishi et al. "Current Status of Nikon's Investigation on $CaF_2$ Intrinsic Birefringence," International-SEMATECH Calcium Fluoride Birefringence Workshop, Jul. 18, 2001, pp. 1-15.

Burnett et al., "Intrinsic Birefringence in Calcium Fluoride," National Institute of Standards and Technology, Gaithersburg, Maryland 20899, submitted for publication to Physical Review Letters (May 11, 2001), pp. 1-12.

Burnett et al., "Minimizing spatial-dispersion-induced birefringence in crystals for precision optics by using mixed crystals of materials with t opposite sign of the birefringence," National Institute of Standards and Technology, Gaithersburg, MD 20899, http//physics.nist.gov/Divisions/Div842/Gp3/DUVMatChar/birefring.ht (Jul. 12, 2001), pp. 1-3.

Burnett et al., "Intrinsic birefringence in calcium fluoride and barium fluoride," Physical Review B, vol. 64, May 14, 2001, pp. 241102-241102-4.

J. Dyson, "Unit magnification optical system without Seidel aberrations," J. Opt. Soc. Am., vol. 49, 1959, p. 713 as described by R. Kingslake, "Lens Design Fundamentals," Institute of Optics, University of Rochester, Academic Press, Inc. 1978, pp. 320-321.

Yeh et al. "Optics of Liquid Crystal Displays," John Wiley & Sons, Inc., 1999, pp. 380-385.

Burnett et al., "Intrinsic Birefringence in 157 nm Materials," *National Institute of Standards and Technology*, SEMATECH Calcium Fluoride Birefringence Workshop, Jul. 18, 2001, Slides.

Burnett et al., "Intrinsic Birefringence in 157 nm Materials," *National Institute of Standards and Technology*, Slides.

Chiba et al., "New Generation Projection Optics for ArF Lithography," *Optical Microlithography XV*, Proceedings of SPIE, vol. 4691, 2002, pp. 679-686.

Matsumoto et al., "Analysis of Imaging Performance Degradation," *Optical Microlithography XVI*, Proceedings of SPIE, vol. 5040, 2003, pp. 131-138.

Matsuyama et al., "High NA and Low Residual Aberration Projection Lens for DUV Scanner," *Optical Microlithography XV*, Proceedings of SPIE, vol. 4691, 2002, pp. 687-695.

Matsuyama et al., "Microlithographic Lens for DUV Scanner," *International Optical Design Conference 2002*, Proceedings of SPIE, vol. 4832, 2002, pp. 170-174.

Matsuyama et al., "Nikon Projection Lens Update," *Nikon Corporation*, SPIE Microlithography 5377-65, Feb. 27, 2004, Slides 1-25.

Matsuyama et al., "Nikon Projection Lens Update," Precision Equipment Company, *Nikon Corporation*.

Miyawaki et al., "Development of 157nm Exposure Tools," *Canon*, 157nm Technical Data Review, Dec. 11-13, 2001, Slides 1-22.

Nakano et al., "The Development of 193nm-Immersion Exposure Tools," *Canon*, International Symposium on Immersion & 157nm Lithography, Aug. 3, 2004, Slides 1-25.

Nattermann et al., "Birefringence of $CAF_2$" *Schott Lithotec*, Jul. 23, 2001, Slides.

Nogawa, "Development Status of 157nm Exposure Tools," *Canon Inc.*, Semiconductor Production Equipment Development Center, Slides 1-26.

Nogawa et al., "System Design of a 157nm Scanner," *Canon Inc.*

Unno et al., "Analyses of Imaging Performance Degradation Caused by Birefringence Residual in Lens Materials," *Optical Microlithography XIV*, Proceedings of SPIE, vol. 4346, 2001, pp. 1306-1317.

Owa et al., "Nikon F2 Exposure Tool," *Nikon Corporation*, 157nm Data Review, Dec. 2001, Slides 1-24.

Owa et al., "Nikon F2 Exposure Tool," *Nikon Corporation*, 3rd 157nm Symposium, Sep. 4, 2002, Slides 1-25.

Shiraishi et al., "Progress of Nikon's F2 Exposure Tool Development," *Optical Microlithography XV*, Proceedings of SPIE, vol. 4691, 2002, pp. 594-601.

Shiraishi et al., "Current Status of F2 Exposure Tool Development," Precision Company, *Nikon Corporation*, NGL Workshop 2003, Jul. 10, 2003, pp. P1-P29.

Suzuki et al., "Influence of the Intrinsic Birefringence in F2 Projection System," *Canon Inc.*, Calcium Fluoride Birefringence Workshop, Jul. 18, 2001, Slides.

Takahashi, "Current Status and Future Plan for 157nm Lithography," *Canon Inc.*, Litho Forum Los Angeles, International SEMATECH, Jan. 27-29, 2004, Slides.

Tirri et al., "Intrinsic Birefringence Impact on the ASML Wilton 157nm Lens," *ASML*, Wilton, Connecticut, Intrinsic Biref Sematech, Jul. 17, 2001, Slides 1-15.

Van Peski, "Lens Design Software CODE V® Modification," *International SeMaTech*, Jul. 18, 2001, Slides.

Walker, "Simulation of Intrinsic Birefringence of $CaF_2$ in Code V®," *Optical Research Associates*, SEMATECH Calcium Fluoride Birefringence Workshop, Jul. 18, 2001, Slides.

Wang, "157 nm Birefringence Measurement System Using PEM Technology," *Hinds Instruments*, Slides.

Ware, "Pushing ArF to the Limits!," *Canon USA*, DNS Lithography Breakfast Forum at SEMICON West 2003, Jul. 2003, Slides.

Webb, Intrinsic Birefringence Workshop, *Corning*, Corning Tropel, Jul. 18, 2001, Slides.

Zeiss et al., "Intrinsic Birefringence in $CaF_2$," *Zeiss*, $CaF_2$ Birefringence Workshop, Slides.

"Business and Technology Update," *Canon Europa N.V.*, Amstelveen, Slides.

Memorandum from C. Van Peski to Exposure Tool Manufacturers and Lens Designers, Regarding Birefringence of Calcium Fluoride, May 7, 2001, XP-002218848.

Memorandum from C. Van Peski to PAG Members, Regarding Birefringence of Calcium Fluoride, May 7, 2001.

U.S. Appl. No. 60/306,206, filed Jul. 18, 2001, (priority document for WO 03/009050 A1).

Kingslake, "Lens Design Fundamentals," 1978, pp. 320-321, Academic Press, Inc., San Diego, California.

U.S. Appl. No. 60/308,844, filed Aug. 1, 2001, (Japanese Language).

* cited by examiner

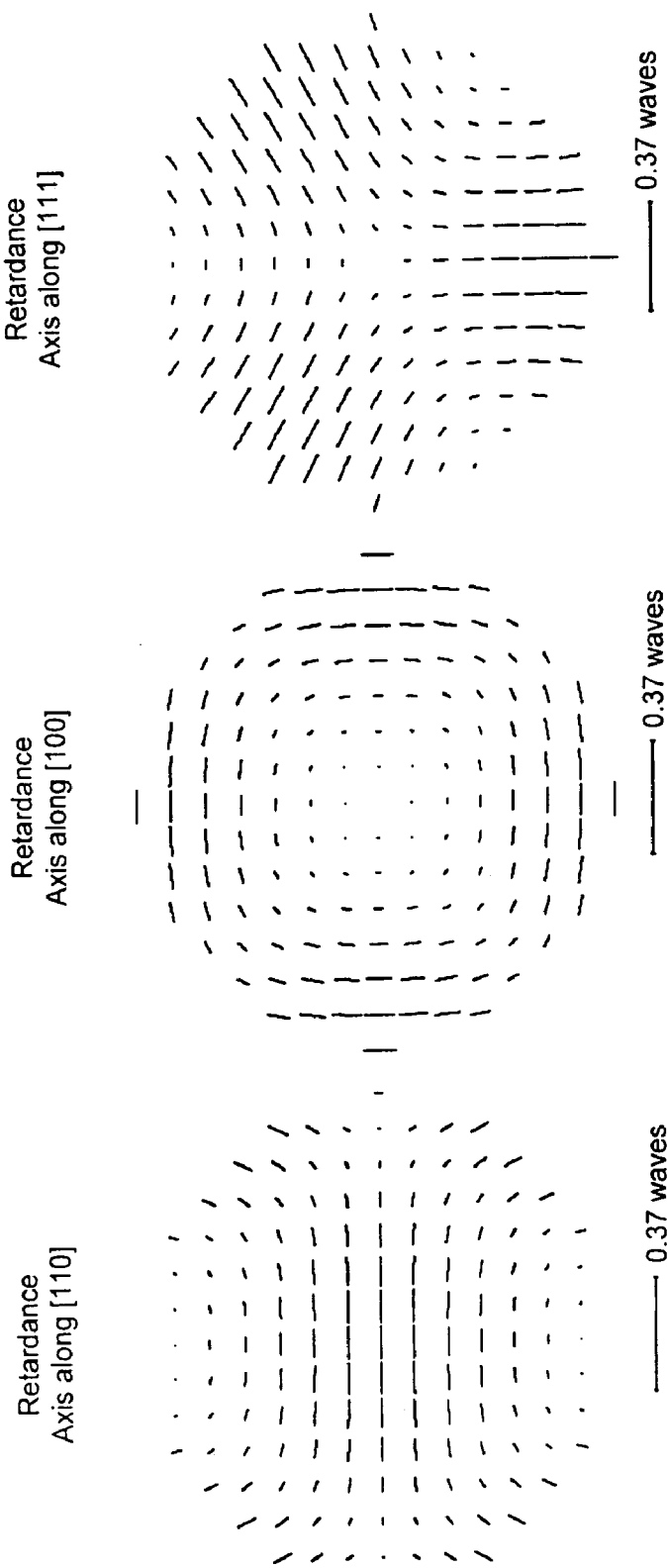

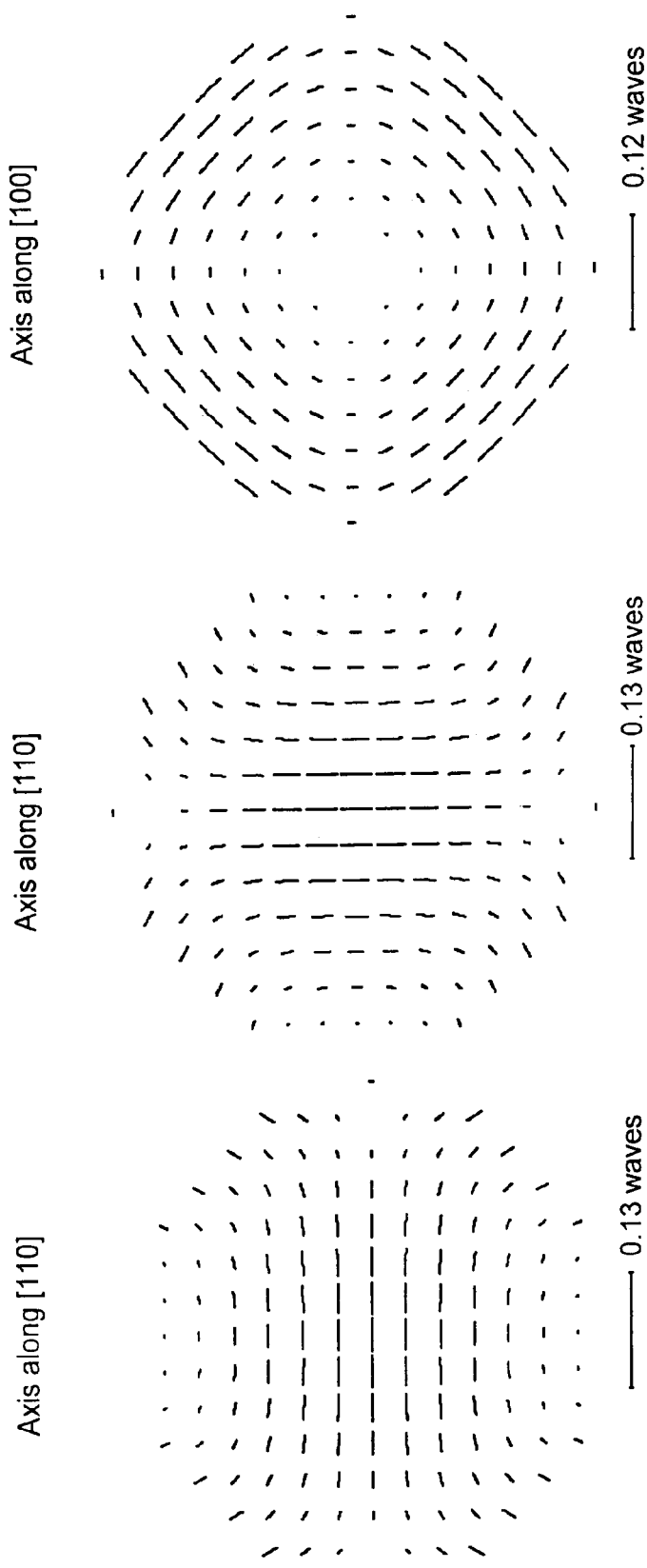

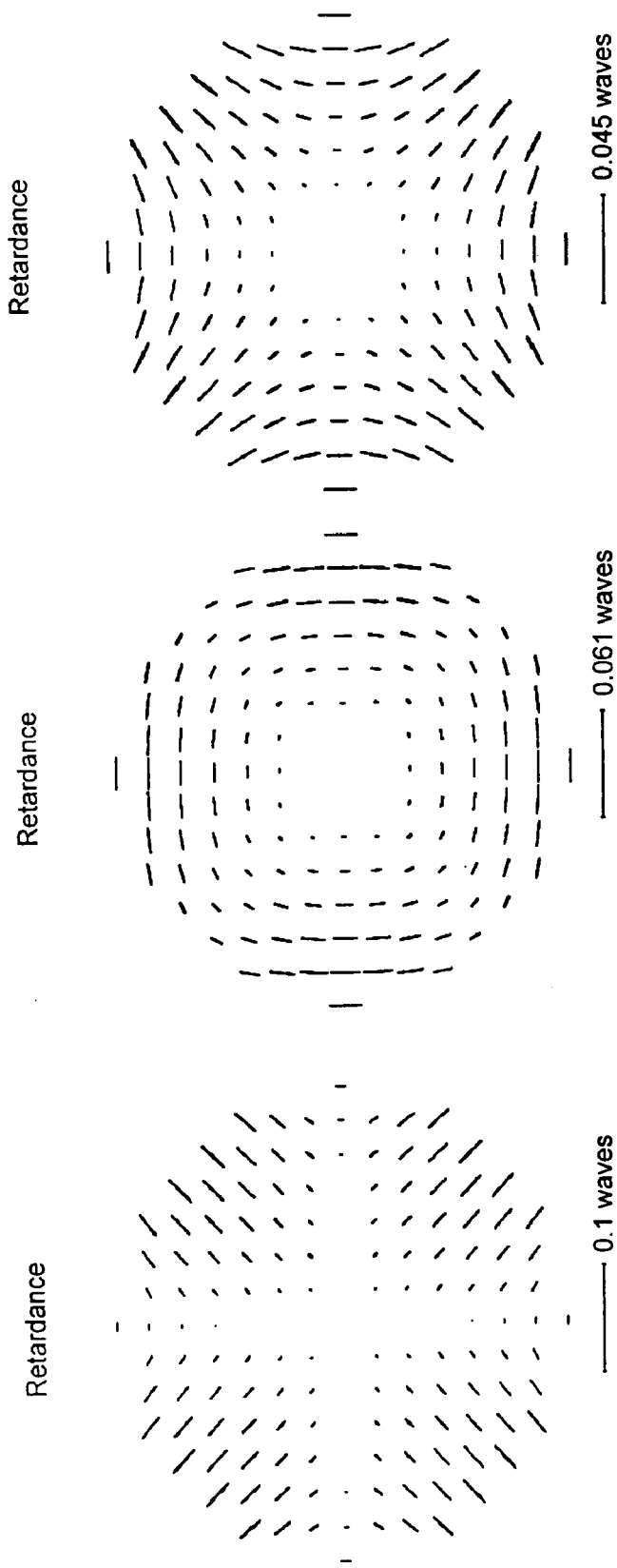

Retardance due to stress-induced birefringence

— 0.054 waves

Net Retardance

— 0.024 waves

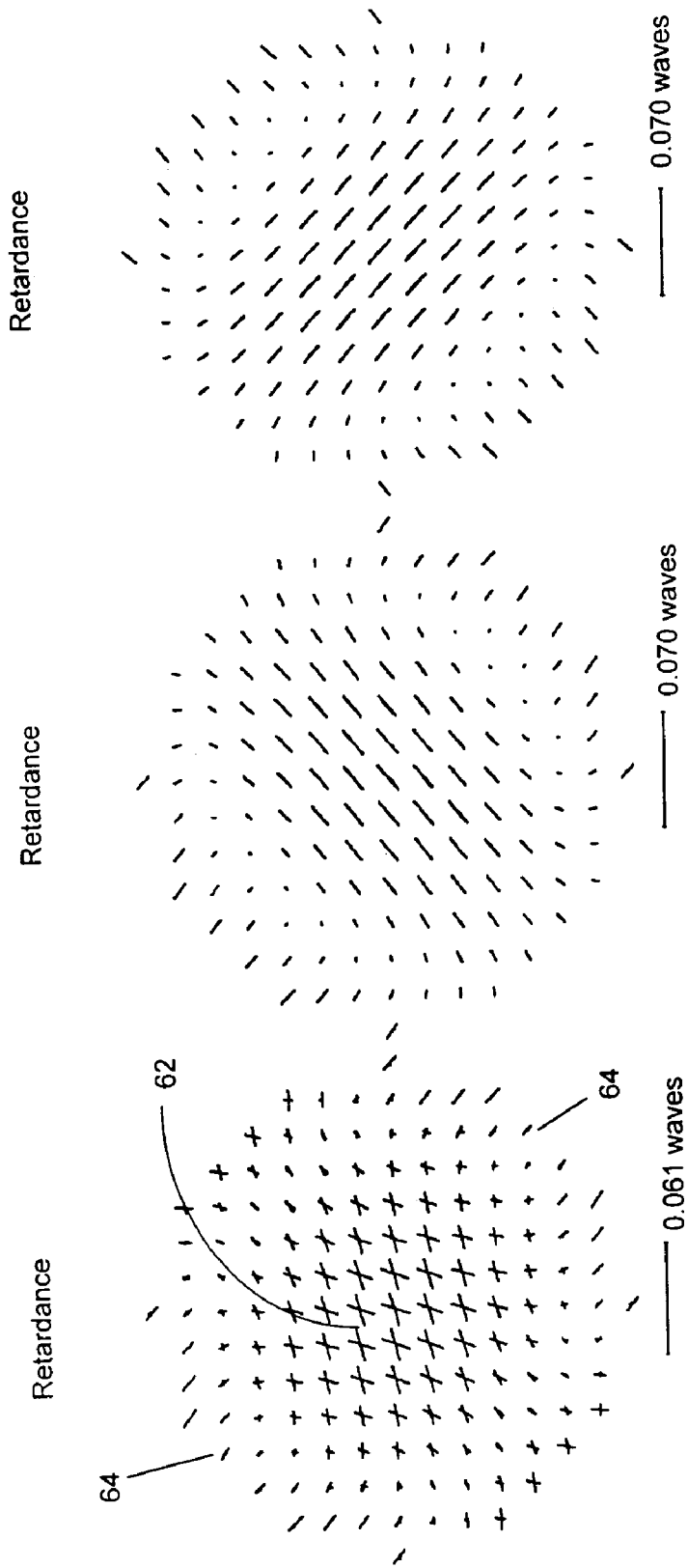

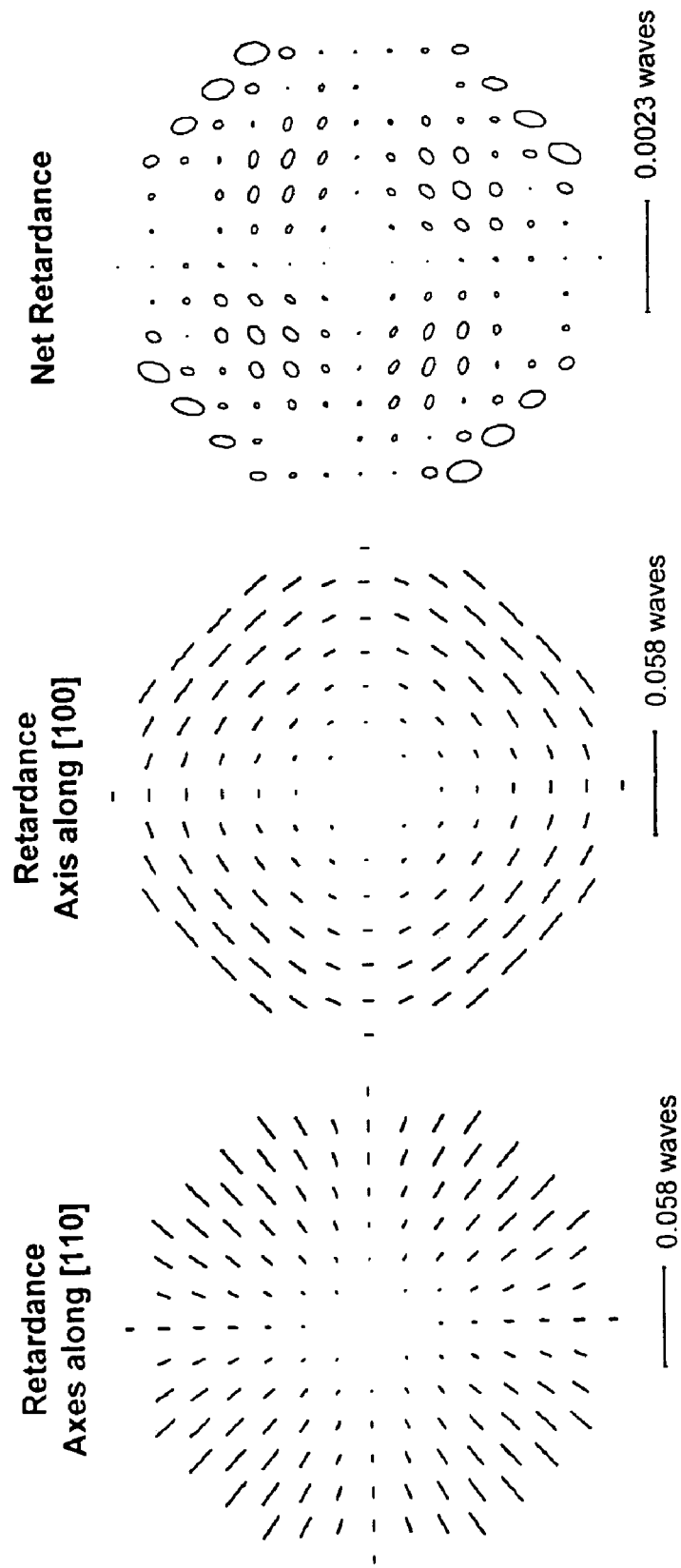

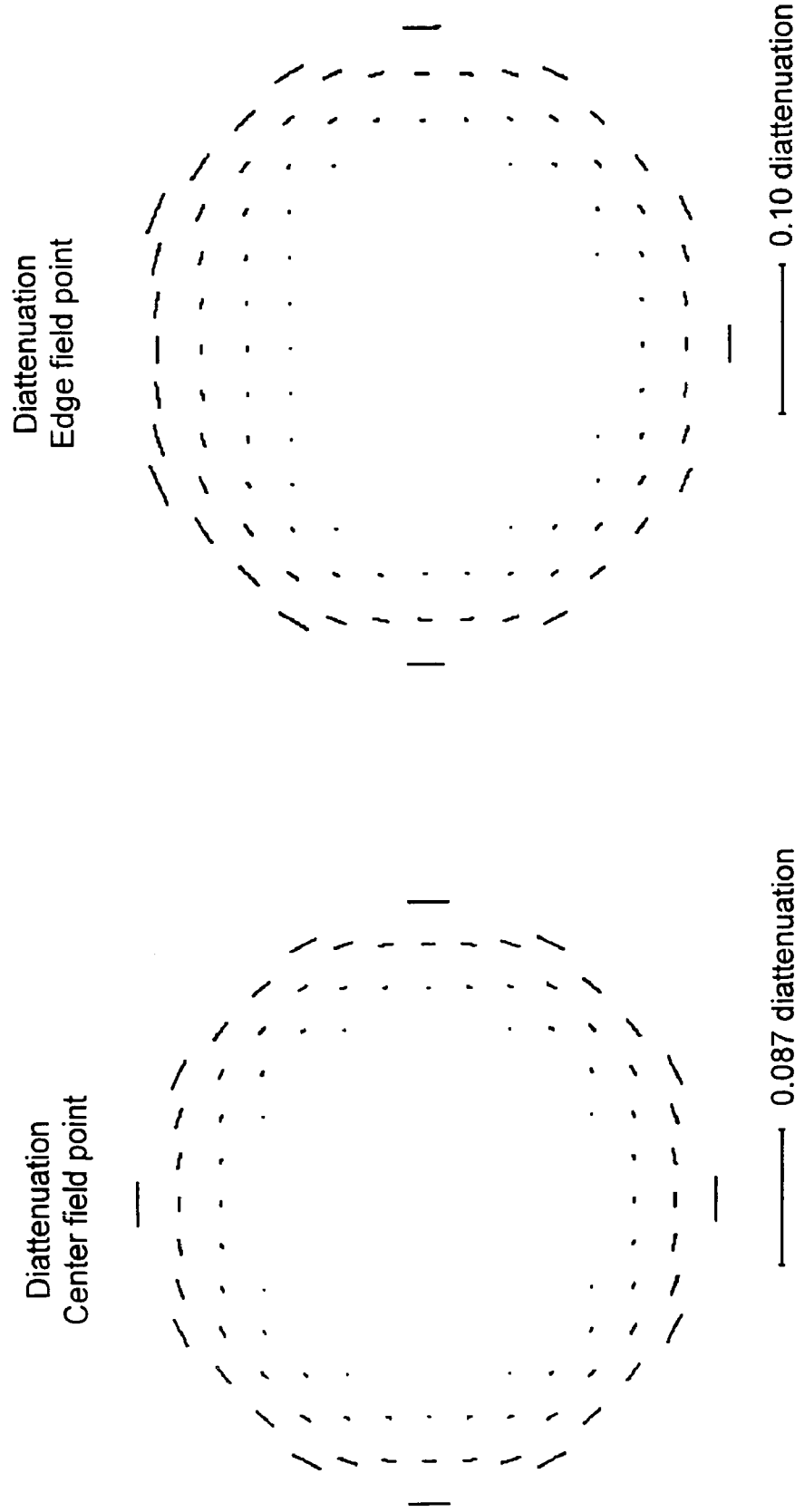

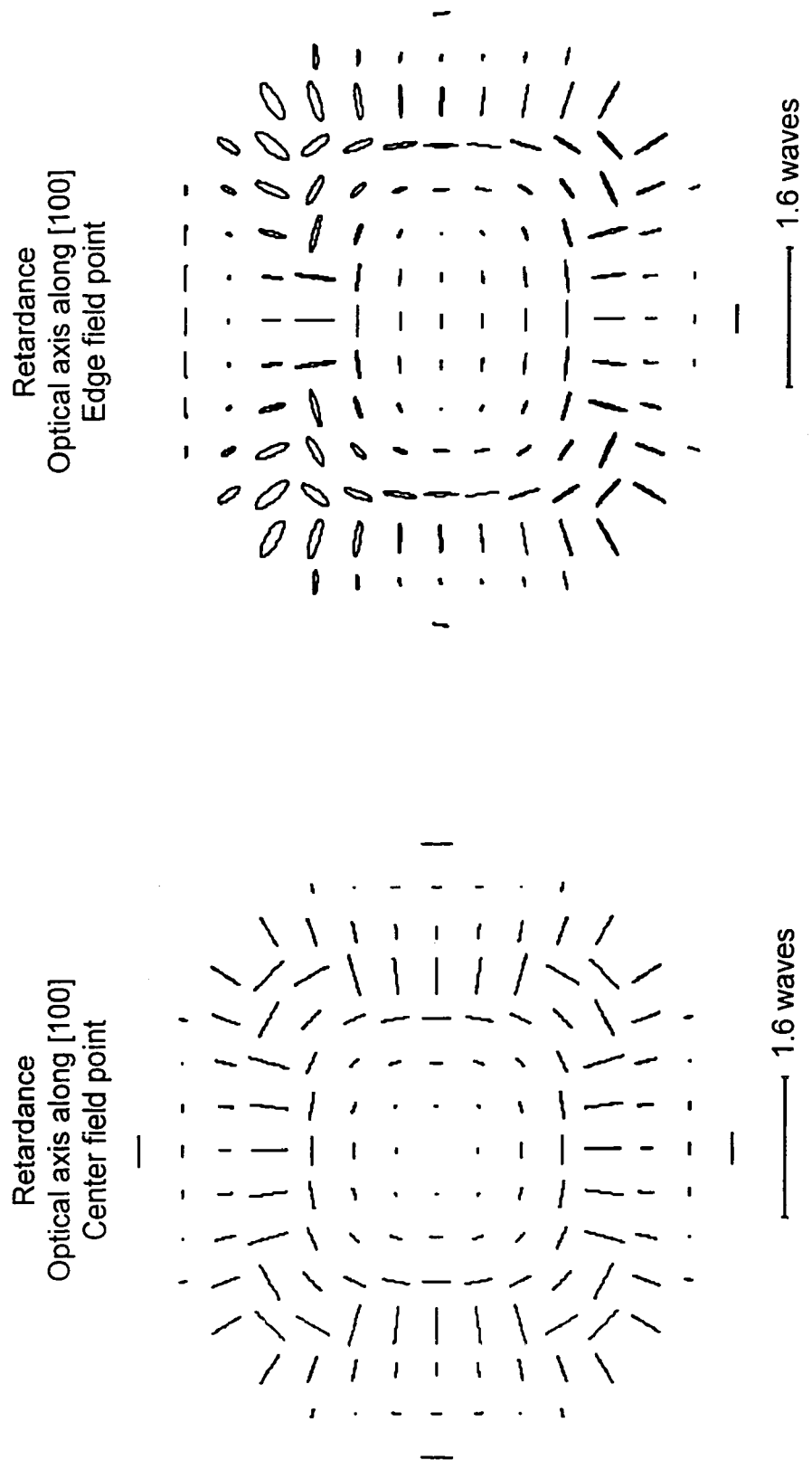

Retardance
Optical axis along [111]
Edge field point 1.6 waves

Retardance
Optical axis along [111]
Center field point 1.6 waves

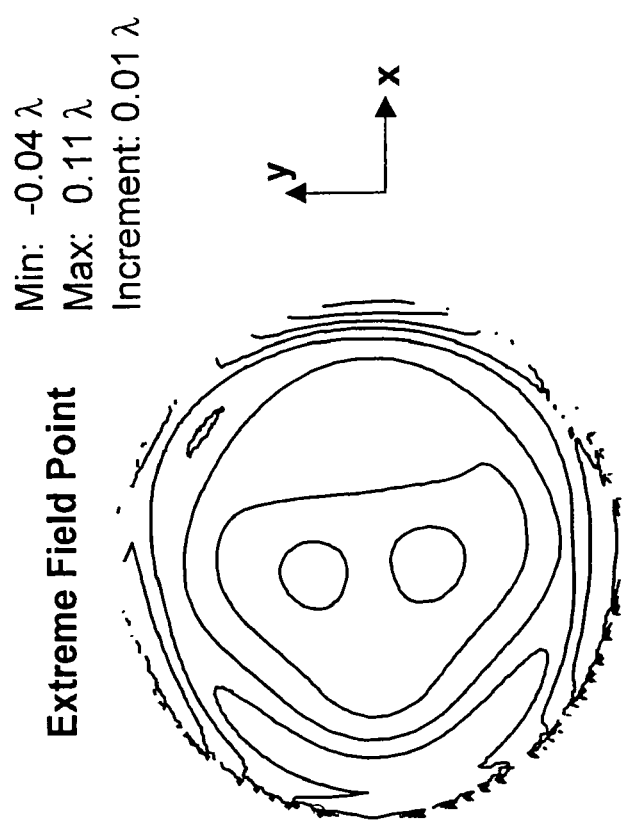
Figure 36D — Extreme Field Point
Min: −0.04 λ
Max: 0.11 λ
Increment: 0.01 λ
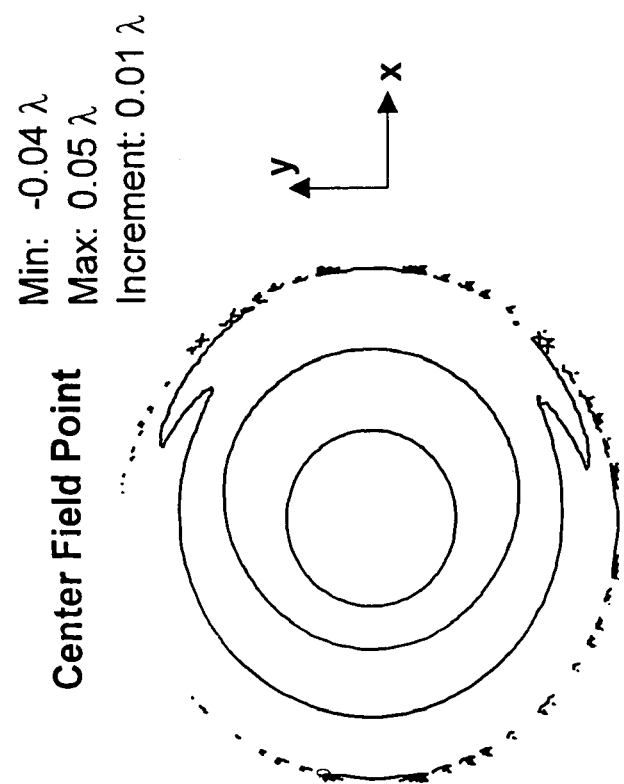
Figure 36C — Center Field Point
Min: −0.04 λ
Max: 0.05 λ
Increment: 0.01 λ

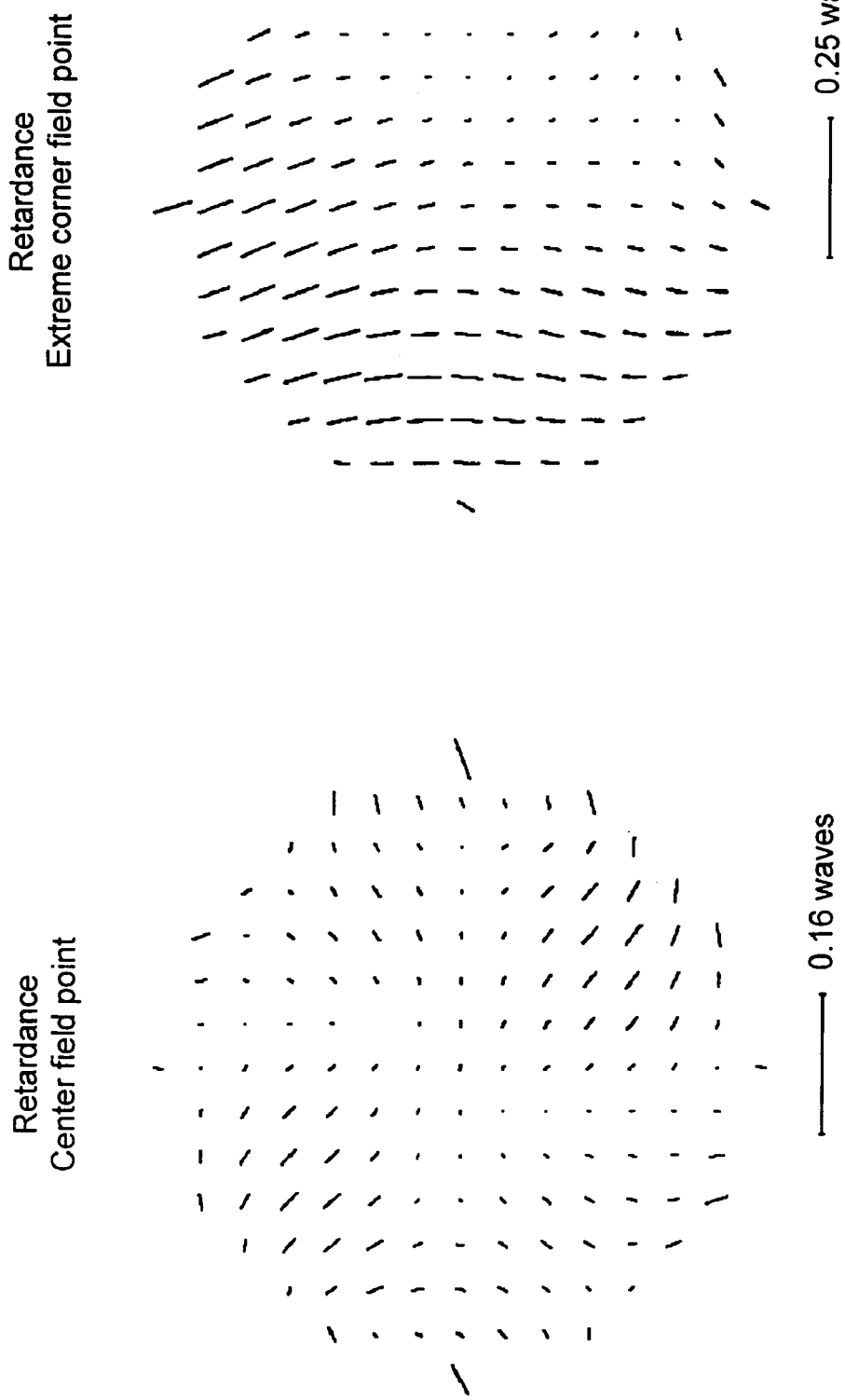
Figure 43B — Retardance Extreme corner field point — 0.25 waves
Figure 43A — Retardance Center field point — 0.16 waves

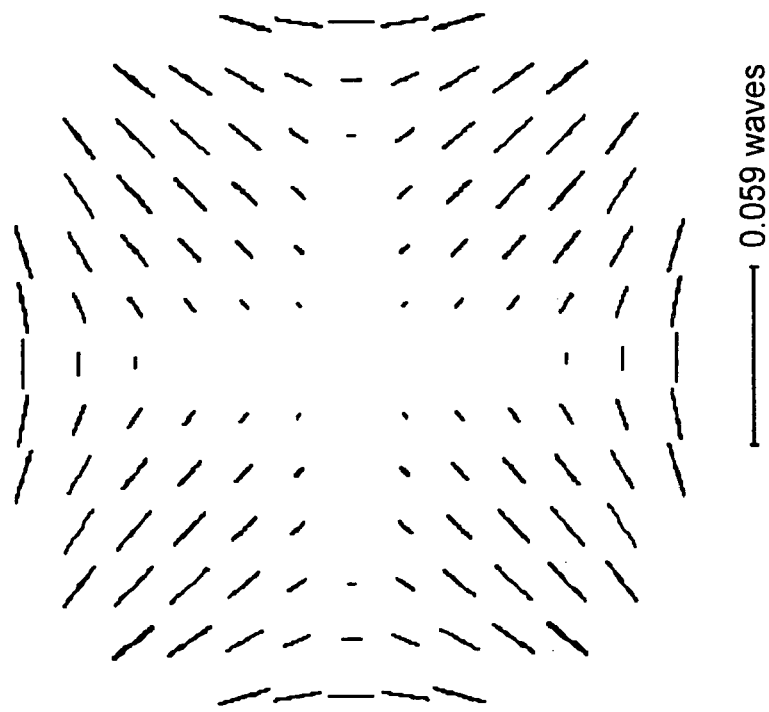
Figure 46A — Retardance Due To Stress-Induced Birefringence — 0.045 waves
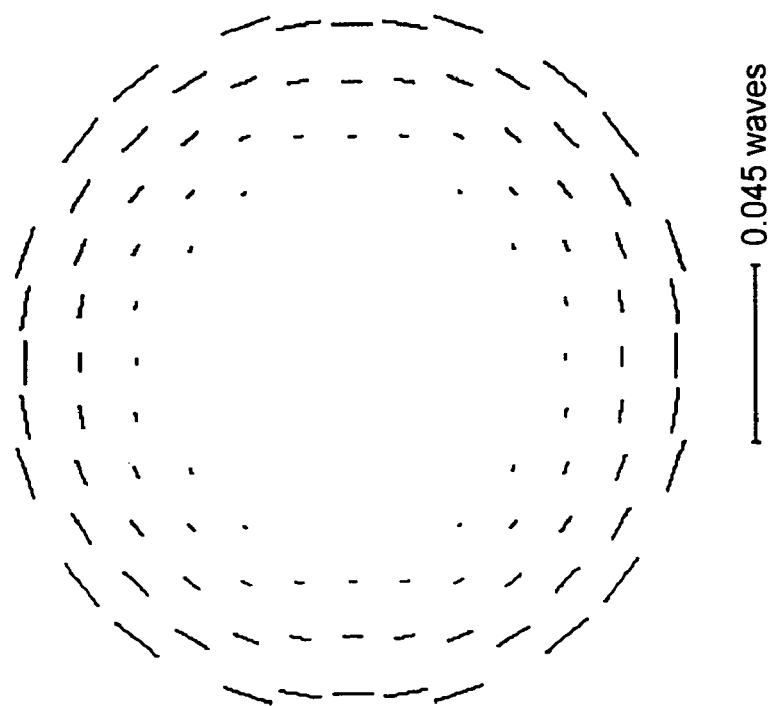
Figure 46B — Net Retardance — 0.059 waves

CORRECTION OF BIREFRINGENCE IN CUBIC CRYSTALLINE OPTICAL SYSTEMS

CROSS-REFERENCE TO RELATED APPLICATIONS

This is a continuation of U.S. application Ser. No. 10/921,345, filed Aug. 19, 2004, which is a continuation of U.S. application Ser. No. 10/371,266, filed Feb. 20, 2003 and issued as U.S. Pat. No. 6,917,458 on Jul. 12, 2005, which is a continuation of U.S. application Ser. No. 10/071,375, filed Feb. 7, 2002 and issued as U.S. Pat. No. 6,683,710 on Jan. 27, 2004, which claims priority to U.S. Provisional Application No. 60/295,212, filed Jun. 1, 2001 now abandoned: U.S. Provisional Application No. 60/296,694, filed Jun. 6, 2001 now abandoned; U.S. Provisional Application No. 60/299,497, filed Jun. 20, 2001 now abandoned; U.S. Provisional Application No. 60/299,603, filed Jun. 20, 2001 now abandoned: U.S. Provisional Application No. 60/335,093, filed Oct. 30, 2001 now abandoned: and U.S. Provisional Application No. 60/332,183, filed Nov. 21, 2001 now abandoned, all of which are hereby incorporated by reference herein in their entirety.

FIELD OF THE INVENTION

The present invention relates, most generally, to high performance optical systems and lithography methods. More particularly, the present invention relates to an apparatus and method for compensating for the effects of intrinsic birefringence in optical systems using cubic crystalline optical elements.

BACKGROUND OF THE INVENTION

In order to increase levels of device integration for integrated circuit and other semiconductor devices, there is a drive to produce device features having smaller and smaller dimensions. In today's rapidly advancing semiconductor manufacturing industry, there is a related drive to produce such device features in a reliable and repeatable manner.

Optical lithography systems are commonly used in the fabrication process to form images of device patterns upon semiconductor substrates. The resolving power of such systems is proportional to the exposure wavelength; therefore, it is advantageous to use exposure wavelengths that are as short as possible. For sub-micron lithography, deep ultraviolet light having a wavelength of 248 nanometers or shorter is commonly used. Wavelengths of interest include 193 and 157 nanometers.

At ultraviolet or deep ultraviolet wavelengths, the materials used to form the lenses, windows, and other optical elements of the lithography system, are of critical significance. Such optical elements must be compatible with the short wavelength light used in these lithography systems.

Calcium fluoride and other cubic crystalline materials such as barium fluoride, lithium fluoride, and strontium fluoride, represent some of the materials being developed for use as optical elements for 157 nanometer lithography, for example. These single crystal fluoride materials have a desirably high transmittance compared to ordinary optical glass and can be produced with good homogeneity.

Accordingly, such cubic crystalline materials are useful as optical elements in short wavelength optical systems such as wafer steppers and other projection printers used to produce small features on substrates such as semiconductor and other wafers used in the semiconductor manufacturing industry. In particular, calcium fluoride finds particular advantage in that it is an easily obtained cubic crystalline material and large high purity single crystals can be grown.

A primary concern for the use of cubic crystalline materials for optical elements in deep ultraviolet lithography systems is anisotropy of refractive index inherent in cubic crystalline materials; this is referred to as "intrinsic birefringence." It has been recently reported [J. Burnett, Z. H. Levine, and E. Shipley, "Intrinsic Birefringence in 157 nm materials," Proc. $2^{nd}$ Intl. Symp on 157 nm Lithography, Austin, Intl SEMATEC, ed. R. Harbison, 2001] that cubic crystalline materials such as calcium fluoride, exhibit intrinsic birefringence that scales as the inverse of the square of the wavelength of light used in the optical system. The magnitude of this birefringence becomes especially significant when the optical wavelength is decreased below 250 nanometers and particularly as it approaches 100 nanometers. Of particular interest is the effect of intrinsic birefringence at the wavelength of 157 nanometers (nm), the wavelength of light produced by an $F_2$ excimer laser favored in the semiconductor manufacturing industry.

Birefringence, or double-refraction, is a property of refractive materials in which the index of refraction is anisotropic. For light propagating through a birefringent material, the refractive index varies as a function of polarization and orientation of the material with respect to the propagation direction. Unpolarized light propagating through a birefringent material will generally separate into two beams with orthogonal polarization states.

When light passes through a unit length of a birefringent material, the difference in refractive index for the two ray paths will result in an optical path difference or retardance. Birefringence is a unitless quantity, although it is common practice in the lithography community to express it in units of nm/cm. Birefringence is a material property, while retardance is an optical delay between polarization states. The retardance for a given ray through an optical system may be expressed in nm, or it may be expressed in terms of number of waves of a particular wavelength.

In uniaxial crystals, such as magnesium fluoride or crystal quartz, the direction through the birefringent material in which the two refracted beams travel with the same velocity is referred to as the birefringence axis. The term optic axis is commonly used interchangeably with birefringence axis when dealing with single crystals. In systems of lens elements, the term optical axis usually refers to the symmetry axis of the lens system. To avoid confusion, the term optical axis will be used hereinafter only to refer to the symmetry axis in a lens system. For directions through the material other than the birefringence axis, the two refracted beams will travel with different velocities. For a given incident ray upon a birefringent medium, the two refracted rays are commonly described as the ordinary and extraordinary rays. The ordinary ray is polarized perpendicular to the birefringence axis and refracts according to Snell's Law, and the extraordinary ray is polarized perpendicular to the ordinary ray and refracts at an angle that depends on the direction of the birefringence axis relative to the incident ray and the amount of birefringence. In uniaxial crystals, the birefringence axis is oriented along a single direction, and the magnitude of the birefringence is constant throughout the material. Uniaxial crystals are commonly used for optical components such as retardation plates and polarizers.

In contrast, however, cubic crystals have been shown to have both a birefringence axis orientation and magnitude that vary depending on the propagation direction of the light with respect to the orientation of the crystal lattice. In addition to birefringence, which is the difference in the index of refraction seen by the two eigenpolarizations, the average index of refraction also varies as a function of angle of incidence, which produces polarization independent phase errors.

Crystal axis directions and planes are described herein using Miller indices, which are integers with no common factors and that are inversely proportional to the intercepts of the crystal planes along the crystal axes. Lattice planes are given by the Miller indices in parentheses, e.g. (100), and axis directions in the direct lattice are given in square brackets, e.g. [111]. The crystal lattice direction, e.g. [111], may also be referred to as the [111] crystal axis of the material or optical element. The (100), (010), and (001) planes are equivalent in a cubic crystal and are collectively referred to as the {100} planes. For example, light propagating through an exemplary cubic crystalline optical element along the [110] crystal axis experiences the maximum birefringence, while light propagating along the [100] crystal axis experiences no birefringence.

Thus, as a wavefront propagates through an optical element constructed from a cubic crystalline material, the wavefront may be retarded because of the intrinsic birefringence of the optical element. The retardance magnitude and orientation may each vary, because the local propagation angle through the material varies across the wavefront. Such variations may be referred to as "retardance aberrations." Retardance aberrations split a uniformly polarized wavefront into two wavefronts with orthogonal polarizations. Each of the orthogonal wavefronts will experience a different refractive index, resulting in different wavefront aberrations. These aberrations are capable of significantly degrading image resolution and introducing distortion of the image field at the wavelengths of interest, such as 157 nm, particularly for sub-micron projection lithography in semiconductor manufacturing. It can be therefore seen that there is a need in the art to compensate for wavefront aberrations caused by intrinsic birefringence of cubic crystalline optical elements, which can cause degradation of image resolution and image field distortion, particularly in projection lithography systems using light having wavelengths in the deep ultraviolet range.

SUMMARY OF THE INVENTION

To address these and other needs, and in view of its purposes, the present invention provides a method and apparatus for preventing intrinsic birefringence in cubic crystalline optical systems from causing wavefront aberrations. The crystal axes of the cubic crystalline lens elements are oriented to minimize net retardance by balancing the retardance contributions from the individual lens elements.

In one exemplary embodiment, the present invention provides an optical system which includes a projection lens formed of a plurality of optical elements, two or more of which are constructed from cubic crystalline material and oriented with their [110] cubic crystalline lattice direction along the system optical axis and with relative rotations about the optical axis to give reduced retardance for light propagating at small angles relative to the system optical axis, and one or more elements oriented with the optical axis substantially along the [100] cubic crystalline lattice direction to give reduced retardance for off-axis light propagating at larger angles with respect to the system optical axis.

In another exemplary embodiment, the present invention provides an optical system which includes four optical elements which are constructed from cubic crystalline material and oriented with the optical axis substantially along their [110] cubic crystalline lattice directions. The optical elements are oriented about the optical axis to give reduced retardance for light propagating at small angles relative to the system optical axis. The system further includes an optical element oriented with its [100] crystal lattice direction substantially along the optical axis to give reduced retardance for light propagating at larger angles with respect to the system optical axis.

In another exemplary embodiment, the present invention provides an optical system that includes a plurality of optical elements, two or more of which are constructed from cubic crystalline material and oriented with their [110] cubic crystalline lattice direction along the optical axis of the system, and with relative rotations about the optical axis to give reduced retardance for light propagating at small angles relative to the [110] lattice direction. A stress-induced birefringence is applied to either a [110] cubic crystal optical element or a further optical element such as a non-cubic crystalline element or a [100] optical element, to reduce residual retardance of the optical system.

In another exemplary embodiment, the present invention provides a method and apparatus for reducing retardance aberrations caused by intrinsic birefringence by providing a lens system, orienting two or more elements with the optical axis substantially along the [110] cubic crystalline lattice directions of the elements and one or more elements with the optical axis substantially along the [100] cubic crystalline lattice directions of the elements, and providing optimized relative rotations of the elements about the optical axis.

In another exemplary embodiment, the present invention provides a method and apparatus for reducing retardance aberrations caused by intrinsic birefringence by providing a lens system defined by a lens prescription, then splitting at least one of the elements of the lens system into multiple cubic crystalline components, oriented to reduce retardance aberrations while maintaining the overall element dimensions defined by the lens prescription.

In yet another exemplary embodiment, the present invention provides a method and apparatus for reducing retardance caused by intrinsic birefringence by providing a lens system with at least two cubic crystalline optical elements and providing a stress-induced birefringence to at least one of the optical elements to reduce residual retardance variations.

Another aspect of the present invention is an apparatus and method for compensating for residual astigmatism due to variations in the average index of refraction in the cubic crystalline optical elements, through the use of at least one optical element whose base radius of curvature differs in orthogonal directions.

In another exemplary embodiment, the present invention provides a photolithography tool including one of the above-described optical systems.

In another exemplary embodiment, the present invention provides a method and apparatus for using the selectively oriented crystalline lens elements to form semiconductor devices on semiconductor substrates used in the semiconductor manufacturing industry.

In another exemplary embodiment, the present invention provides a semiconductor device formed using a lithography tool including the selectively oriented cubic crystalline lens elements.

BRIEF DESCRIPTION OF THE DRAWING

The present invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 7A is a graphical illustration of net retardance magnitude and orientation across the pupil for an exemplary embodiment of the optical system depicted in FIG. 6 in which the optical axis extends along the [110] lattice direction for each element and the crystal axes for all elements are oriented identically;

FIG. 7B is a graphical illustration of net retardance magnitude and orientation across the pupil for an exemplary embodiment of the optical system depicted in FIG. 6 in which the optical axis extends along the [100] lattice direction for each element and the crystal axes for all elements are oriented identically;

FIG. 7C is a graphical illustration of net retardance magnitude and orientation across the pupil for an exemplary embodiment of the optical system depicted in FIG. 6 in which the optical axis extends along the [111] lattice direction for each element and the crystal axes for all elements are oriented identically;

FIG. 8A is a graphical illustration showing the individual contribution to the retardance across the pupil for the first element of the optical system depicted in FIG. 6, in which the first element is a [110] optical element and is rotated about the optical axis such that horizontally oriented retardance is produced along the optical axis;

FIG. 8B is a graphical illustration showing the individual contribution to the retardance across the pupil for the second element of the optical system depicted in FIG. 6, in which the second element is a [110] optical element and is rotated about the optical axis such that vertically oriented retardance is produced along the optical axis;

FIG. 8C is a graphical illustration showing the individual contribution to the retardance across the pupil for the third element of the optical system depicted in FIG. 6, in which the third element is a [100] optical element and is rotated about the optical axis such that the peak retardance is oriented along the pupil diagonals;

FIG. 9A is a graphical illustration showing the combined retardance across the pupil for the first and second elements of the optical system depicted in FIG. 6 according to the exemplary embodiment in which the first two elements are [110] cubic crystalline optical elements and the third element is a [100] cubic crystalline optical element;

FIG. 9B is a graphical illustration showing the net retardance across the pupil for the optical system depicted in FIG. 6 according to the exemplary embodiment in which the first two elements are [110] cubic crystalline optical elements and the third element is a [100] cubic crystalline optical element;

FIG. 9C is a graphical illustration showing the net retardance across the pupil for an optical system depicted in FIG. 6 according to another exemplary embodiment in which the first two elements are [110] cubic crystalline optical elements and the third element is a [100] cubic crystalline optical element and in which the third element includes a thickness selected to minimize the net RMS retardance;

FIGS. 12A–14C are each graphical illustrations showing retardance magnitude and orientation for the optical system shown in FIG. 10, in which the first four elements are [110]

cubic crystalline optical elements and the fifth element is a [100] cubic crystalline optical element: FIG. 12A shows the individual contribution to the retardance across the pupil for the first element, in which the retardance along the optical axis is rotated by 17.632° with respect to horizontal;

FIG. 13A shows the retardance across the pupil for the first and third elements overlapping one another;

FIG. 13B shows the net retardance across the pupil for the first and third elements;

FIG. 13C shows the net retardance across the pupil for the second and fourth elements;

FIG. 14A shows the net retardance across the pupil for the first four elements;

FIG. 14B shows the individual contribution to the retardance across the pupil for the fifth element;

FIG. 14C shows the net retardance across the pupil;

FIG. 18A shows the wavefront error for an input polarization in the X direction used with an exit pupil analyzer in the X direction for the central field point. FIG. 18B shows the wavefront error for an input polarization in the X direction used with an exit pupil analyzer in the X direction for the extreme field point. FIG. 18C shows the wavefront error for an input polarization in the Y direction used with an exit pupil analyzer in the Y direction for the central field point. FIG. 18D shows the wavefront error for an input polarization in the Y direction used with an exit pupil analyzer in the Y direction for the extreme field point;

FIG. 24A shows the wavefront error for an input polarization in the X direction used with an exit pupil analyzer in the X direction for the central field point. FIG. 24B shows the wavefront error for an input polarization in the X direction used with an exit pupil analyzer in the X direction for the extreme field point. FIG. 24C shows the wavefront error for an input polarization in the Y direction used with an exit pupil analyzer in the Y direction for the central field point. FIG. 24D shows the wavefront error for an input polarization in the Y direction used with an exit pupil analyzer in the Y direction for the extreme field point;

FIGS. 26A and 26B are graphical illustrations showing diattenuation across the pupil for the exemplary lens depicted in FIG. 1 at central and extreme field points, respectively due to single-layer anti-reflection coatings;

FIG. 27A shows the wavefront error for an input polarization in the X direction used with an exit pupil analyzer in the X direction for the central field point. FIG. 27B shows the wavefront error for an input polarization in the X direction used with an exit pupil analyzer in the X direction for the extreme field point. FIG. 27C shows the wavefront error for an input polarization in the Y direction used with an exit pupil analyzer in the Y direction for the central field point. FIG. 27D shows the wavefront error for an input polarization in the Y direction used with an exit pupil analyzer in the Y direction for the extreme field point;

FIGS. 29A and 29B are graphical illustrations showing retardance across the pupil for the exemplary lens depicted in FIG. 1 at central and extreme field points, respectively, in which all elements are identically aligned in three dimensions, with their [100] crystal lattice direction along the optical axis and including a peak birefringence magnitude corresponding to that of calcium fluoride at a wavelength of 157 nm;

FIG. 33A shows the wavefront error for an input polarization in the X direction used with an exit pupil analyzer in the X direction for the central field point. FIG. 33B shows the wavefront error for an input polarization in the X direction used with an exit pupil analyzer in the X direction for the extreme field point. FIG. 33C shows the wavefront error for an input polarization in the Y direction used with an exit pupil analyzer in the Y direction for the central field point. FIG. 33D shows the wavefront error for an input polarization in the Y direction used with an exit pupil analyzer in the Y direction for the extreme field point;

FIGS. 36A, 36B, 36C, and 36D are contour plots showing the residual wavefront error for the lens depicted in FIG. 34. FIG. 36A shows the wavefront error for an input polarization in the X direction used with an exit pupil analyzer in the X direction for the central field point. FIG. 36B shows the wavefront error for an input polarization in the X direction used with an exit pupil analyzer in the X direction for the extreme field point. FIG. 36C shows the wavefront error for an input polarization in the Y direction used with an exit pupil analyzer in the Y direction for the central field point. FIG. 36D shows the wavefront error for an input polarization in the Y direction used with an exit pupil analyzer in the Y direction for the extreme field point;

FIGS. 43A and 43B are graphical illustrations showing retardance across the pupil for the lens depicted in FIG. 40 at central and extreme field points, respectively, due to anti-reflection coatings and intrinsic birefringence of all elements;

FIG. 44A shows the wavefront error for an input polarization in the X direction used with an exit pupil analyzer in the X direction for the central field point. FIG. 44B shows the wavefront error for an input polarization in the X direction used with an exit pupil analyzer in the X direction for the extreme field point. FIG. 44C shows the wavefront error for an input polarization in the Y direction used with an exit pupil analyzer in the Y direction for the central field point. FIG. 44D shows the wavefront error for an input polarization in the Y direction used with an exit pupil analyzer in the Y direction for the extreme field point;

FIG. 46A is a graphical illustration showing the individual contribution to the retardance across the pupil for the first element of the optical system depicted in FIG. 45, when an exemplary compressive hoop stress is applied around the perimeter of the element, without including the retardance caused by intrinsic birefringence; and FIG. 46B is a graphical illustration showing the net retardance across the pupil for the optical system depicted in FIG. 45, when an exemplary compressive hoop stress is applied around the perimeter of the element to minimize the net RMS retardance.

DETAILED DESCRIPTION OF THE INVENTION

It is known in the art that cubic crystalline materials favored in high performance lithography systems, such as the photolithographic tools used in the semiconductor manufacturing industry, exhibit intrinsic birefringence, i.e., an inherent anisotropy in refractive index. When used for construction of elements of an optical system, the birefringent properties of these cubic crystalline materials may produce wavefront aberrations that significantly degrade image resolution and introduce field distortion. This is especially true for the demanding resolution and overlay requirements in today's semiconductor manufacturing industry, which emphasizes increased levels of integration and reduced feature sizes.

The present invention utilizes the concept that both the birefringence direction and magnitude can be determined for a cubic crystalline material and that optical elements may be formed and aligned to balance, or compensate for, the retardance aberrations caused by the intrinsic birefringence contributions of the individual elements. For example, the intrinsic birefringence variation within the three-dimensional lattice orientation can be determined for these materials. Furthermore, when a plurality of cubic crystalline optical elements is aligned such that each of the optical elements has a specified three-dimensional lattice orientation with respect to a common optical axis, the plurality of aligned optical elements will have a net retardance that varies in a known manner.

This invention relates to a technique to compensate for the effects of intrinsic birefringence in optical systems employing cubic crystalline optical elements. The compensation is achieved through proper selection of the crystal axis directions of the individual optical elements and is applicable to optical systems using polarized or unpolarized radiation. In one exemplary embodiment, the compensation may be achieved by utilizing a sufficient number of cubic crystalline optical elements with the optical axis along their [110] crystal lattice direction. The invention also provides for compensating for residual astigmatism due to variations in the average index of refraction in various exemplary cubic crystalline optical systems. In one exemplary embodiment, this compensation may be achieved by varying the base radius of curvature of at least one optical element, in orthogonal directions.

The various exemplary cubic crystalline optical systems and methods for forming aberration-free patterns on semiconductor substrates are particularly advantageous as feature sizes become increasingly smaller and approach the half wavelength of the light used to produce the patterns. Such techniques find particular advantage in high numerical aperture (NA) lens systems but the various aspects of the present invention find application in optical systems having both relatively high and relatively low numerical apertures.

Figure 1:
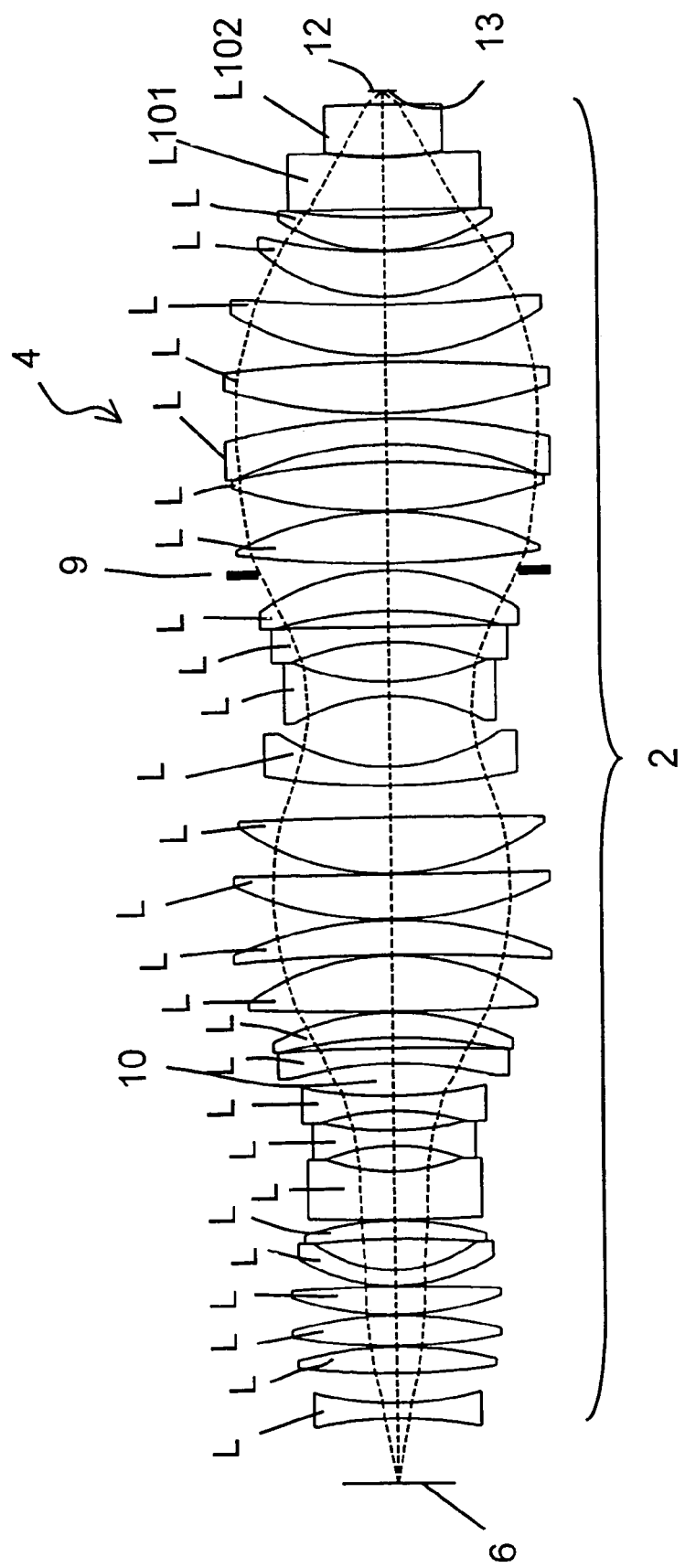
FIG. 1 is a schematic illustration of the projection optics of an exemplary lithography system.

FIG. 1 is a schematic illustration showing an exemplary projection optics section of an exemplary lithography system. The optical system shown in FIG. 1 is substantially similar to the optical system shown and described in the seventh embodiment of European Patent EP 1 139 138 A1, issued to K. Omura on Apr. 10, 2001, the contents of which are herein incorporated by reference. The exemplary optical system may be a large format refractive projection lens operating at an NA of 0.75, a peak wavelength of 193.3 nm and 4× reduction. Such an optical system is intended to be exemplary only and other optical systems may be used in other exemplary embodiments. Exemplary optical system 2 may be the projection optics section of a lithography tool 4 in an exemplary embodiment. In the exemplary embodiment, optical system 2 is a projection lens disposed between exemplary reticle 6 and substrate 12. Reticle 6 may be considered to include the object field with the image field formed on substrate 12.

Optical system 2 is a lens system, commonly referred to collectively as a "lens," composed of a plurality of individual lens elements L, optical axis 10, and aperture stop (AS) 9. Reticle 6 includes a mask pattern which is to be projected onto surface 13 of substrate 12. According to an exemplary embodiment, substrate 12 may be a semiconductor wafer used in the semiconductor manufacturing industry, and surface 13 may be coated with a photosensitive material, such as a photoresist commonly used in the semiconductor manufacturing industry. Other substrates may be used according to other exemplary embodiments. According to other exemplary embodiments within various microlithography tools, reticle 6 may be a photomask. Generally speaking, the reticle or photomask, hereinafter referred to collectively as reticle 6, is a medium which includes a pattern of clear and opaque sections that form the object field. Light is projected through the pattern and the pattern is projected through the lens system and onto surface 13 of substrate 12. The pattern projected from the reticle 6 onto substrate surface 13 may be uniformly reduced in size to various degrees such as 10:1, 5:1, 4:1 or others, according to the various exemplary embodiments. The exemplary system may include a numerical aperture, NA, of 0.75, but systems having other numerical apertures, such as within the range of 0.60 to 0.90, may be used alternatively.

The arrangement of the plurality of lens elements L, is intended to be exemplary only and various other arrangements of individual lens elements having various shapes may be used according to other exemplary embodiments. The element thicknesses, spacings, radii of curvature, aspheric coefficients, and the like, are considered to be the lens prescription. The lens system or "lens" of the present invention is preferably formed of a plurality of individual lens elements L, one or more of which may be constructed with cubic crystalline material. Cubic crystalline materials such as strontium fluoride, barium fluoride, lithium fluoride, and calcium fluoride may be used. Calcium fluoride is the preferred material. In an exemplary embodiment, each of the cubic crystalline optical elements will be formed of the same cubic crystalline material. The lens may include lens elements L which are formed of non-cubic crystalline material such as low-OH fused silica, also known as dry fused silica. Each of the individual lens elements, L, is arranged along a common optical axis 10. In the exemplary embodiment, optical axis 10 is linear.

Figure 2:
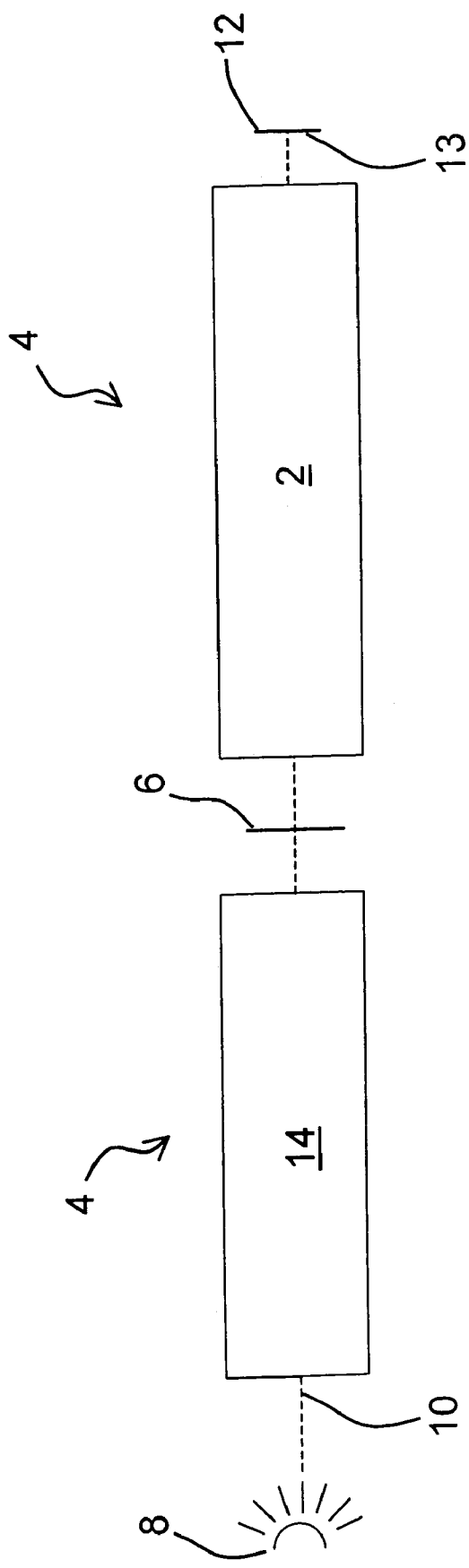
FIG. 2 is a schematic illustration of an exemplary lithography system.

FIG. 2 is a schematic illustration showing optical system 2 functioning as the projection optics section within lithography tool 4. FIG. 2 shows optical source 8 and substrate 12. Reticle 6 is disposed between condenser optics 14 and projection optics 2 and includes the pattern to be projected onto substrate 12. The optical field of reticle 6 may be of various dimensions. Each of projection optics 2 and condenser optics 14 may include an aperture stop and a plurality of lens elements, windows, and other refractive and reflective members. The optical system shown in FIG. 2 includes linear optical axis 10 and lithography tool 4 may be a wafer stepper, projection printer, or other photolithography or microlithography tool used in the semiconductor industry. Lithography tool 4 may likewise be a scanning optical system, a step-and-repeat optical system or other microlithography or projection optics system. In a scanning-type optical system, a pattern on reticle 6 is projected and scanned onto corresponding sections of surface 13 of substrate 12. In a step-and-repeat optical system, such as a conventional wafer stepper, the pattern on reticle 6, is projected onto multiple different portions of surface 13 in a plurality of discrete operations. Reticle 6 is considered to be at the object field of lithography tool 4, while substrate 12 is considered to be at the image field of lithography tool 4. The reticle pattern includes various field points which are projected onto surface 13 simultaneously.

In an exemplary embodiment, the pattern printed on reticle 6 will be used to create a circuit pattern on surface 13 for an integrated circuit device being formed on substrate 12. According to an exemplary embodiment, the pattern may be projected onto a photosensitive material formed on surface 13 to form an exposure pattern. The exposure pattern may be developed using conventional means, to produce a photo pattern in the photosensitive material. The photo pattern may be translated into the substrate by etching or other means. According to other exemplary embodiments, substrate 12 may include a series of layers of materials formed thereon. In this embodiment, surface 13 may be one of the layers and the photo pattern formed on the layer. Etching or other means may be used to translate the photo pattern into the layer. Similarly-formed photo patterns may be used to enable spatially selective doping using known methods such as ion implantation. In this manner, multiple photolithographic operations using the techniques of the present invention, may be used to form various circuit patterns in various layers to create a completed semiconductor device such as an integrated circuit. An advantage of the present invention is that images formed on the substrate have sufficiently low aberration to enable precisely dimensioned and aligned device features to be formed having reduced sizes.

In an exemplary scanning optical system, the optical field of reticle 6 which is projected and scanned onto the substrate surface may have a height of 26 millimeters and a width of a few millimeters. Other field dimensions may be used according to other exemplary embodiments and depending on the type of lithography tool in which the projection optics are included.

Optical source 8 produces a light that is subsequently shaped and conditioned by condenser lens 14. The optical wavelength of source 8 may vary, and may be no greater than 248 nanometers in an exemplary embodiment. In one exemplary embodiment, light having a wavelength of about 157 nanometers may be used. In an exemplary embodiment, optical source 8 may produce linearly polarized light. One optical source which produces linearly polarized light is an excimer laser. According to other exemplary embodiments, optical source 8 may produce light which is non-polarized. According to various exemplary embodiments, a KrF excimer laser operating at about 248 nm, an ArF excimer laser operating at about 193 nm, or an $F_2$ excimer laser operating at about 157 nm, may be used as optical source 8.

The light produced by the optical source, shaped and conditioned by the condenser lens and used to project an image from the reticle or photomask onto the substrate, may be described as a light beam comprised of a plurality of rays. Light rays emanating from an individual object field point on the reticle or photomask form a wavefront that is projected by the projection lens to a corresponding image field point at the substrate. The chief ray is the ray from a given field point that passes through the center of the aperture stop and system pupils. For an object field point located where the optical axis intersects the reticle, the chief ray travels along the optical axis. The full image field is therefore generated by a plurality of wavefronts.

Although described in conjunction with a lithography tool used to pattern substrates in the semiconductor industry, the various exemplary optical systems of the present invention are useful in any application in which a pattern is projected through an optical system, onto a substrate.

Figure 3B:
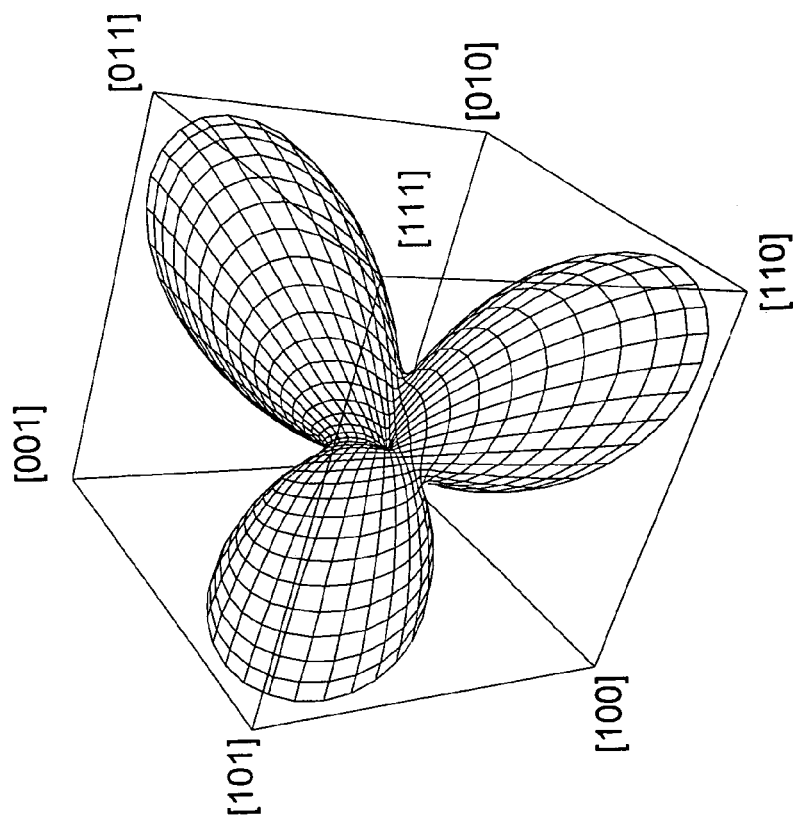
FIG. 3B is a graphical representation of variation of birefringence magnitude with respect to a cubic crystal lattice.
Figure 3A:
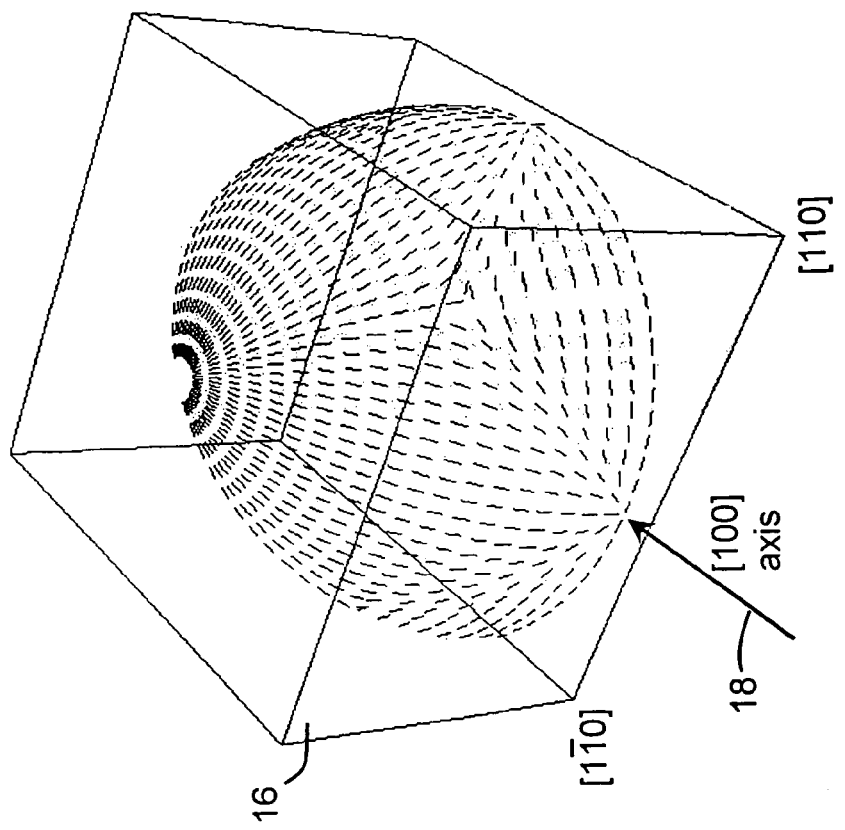
FIG. 3A is a graphical representation of variation of birefringence axis orientation with respect to a cubic crystal lattice.

FIG. 3A is a three dimensional vector plot showing the spatial variation in birefringence axis orientation within a material having a cubic crystalline lattice. The cubic crystalline lattice may be that of calcium fluoride, in one embodiment. FIG. 3B is a 3-D plot corresponding to a quadrant of the vector plot shown in FIG. 3A, and showing the corresponding magnitude of the intrinsic birefringence. It can be seen that the localized magnitude and axis of the birefringence vary spatially throughout the crystal in a known fashion. It can also be seen that, depending on the direction along which light travels through such a cubic crystalline material, the birefringence magnitude and the orientation of the birefringence axis relative to the direction of propagation will vary. FIG. 3B represents an octant of the crystal lattice: the extension of this diagram to all possible directions through the crystal gives twelve directions for maximum birefringence, or birefringence lobes.

The crystal axis directions shown in FIGS. 3A and 3B are described using Miller indices, which are integers with no common factors that are inversely proportional to the intercepts of the crystal planes along the crystal axes. Lattice planes are given by the Miller indices in parentheses, e.g. (101), and axis directions in the crystal lattice are given in square brackets, e.g. [111]. The crystal lattice direction, e.g. [110], may also be referred to as the [110] crystal axis of the element or material, and a cubic crystalline optical element arranged with its [110] crystal axis along the system optical axis, may be referred to as a [110] optical element. The (100), (010), and (001) planes are equivalent in a cubic crystal and are collectively referred to as the {100} planes.

The crystalline material can therefore be advantageously cut along a given plane and arranged such that light normal to that plane travels along a chosen axis direction. For example, light traveling along the [100] crystal axis 18 (i.e. along the [100] crystal lattice direction), which is oriented normal to the (100) crystal lattice plane 16, sees a fixed and deterministic localized intrinsic birefringence. The birefringence magnitude and birefringence axis direction encountered by a given ray therefore varies as a function of the direction along which the light ray travels through the crystal.

Figure 4:
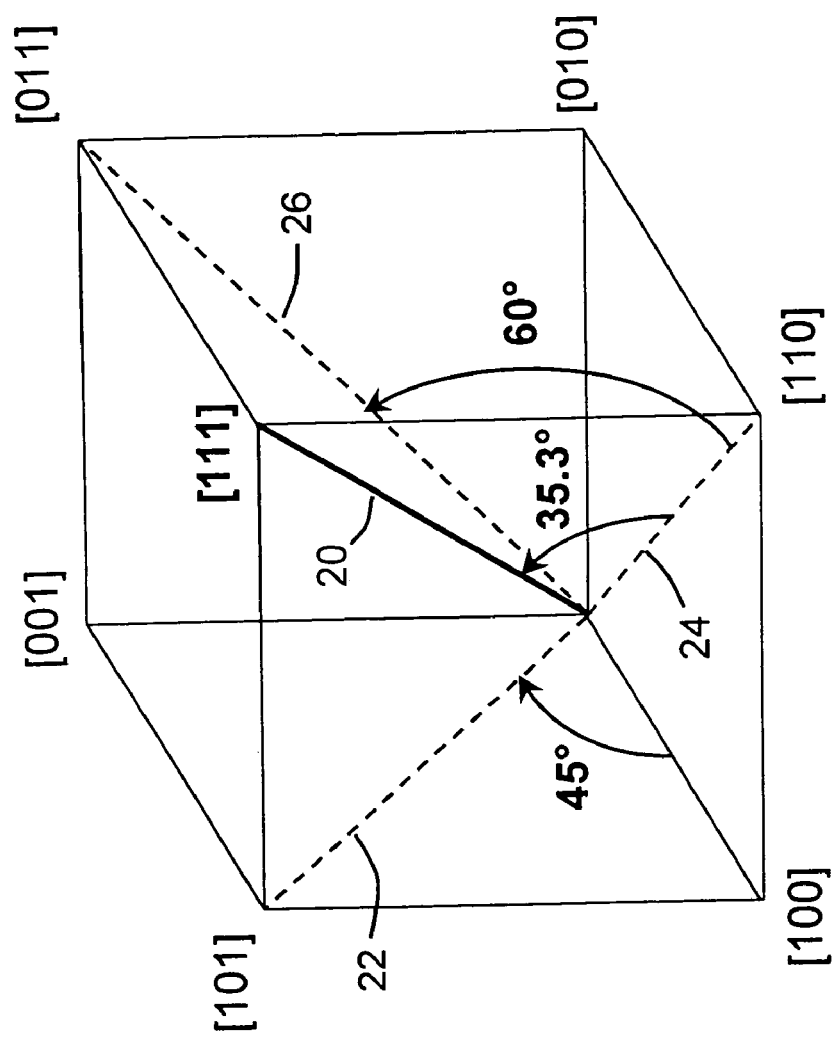
FIG. 4 is a perspective view showing angular relationships between various directions through an exemplary cubic crystalline lattice.

FIG. 4 is a perspective view showing angular relationships between various directions through an exemplary cubic crystalline lattice. The cubic crystalline lattice may be that of calcium fluoride, for example. FIG. 4 includes peak intrinsic birefringence directions along the [101], [110], and [011] lattice directions, indicated by lines 22, 24, and 26, respectively. Line 20 represents the [111] crystal axis direction, which corresponds to a direction through the crystal without intrinsic birefringence.

Figure 5:
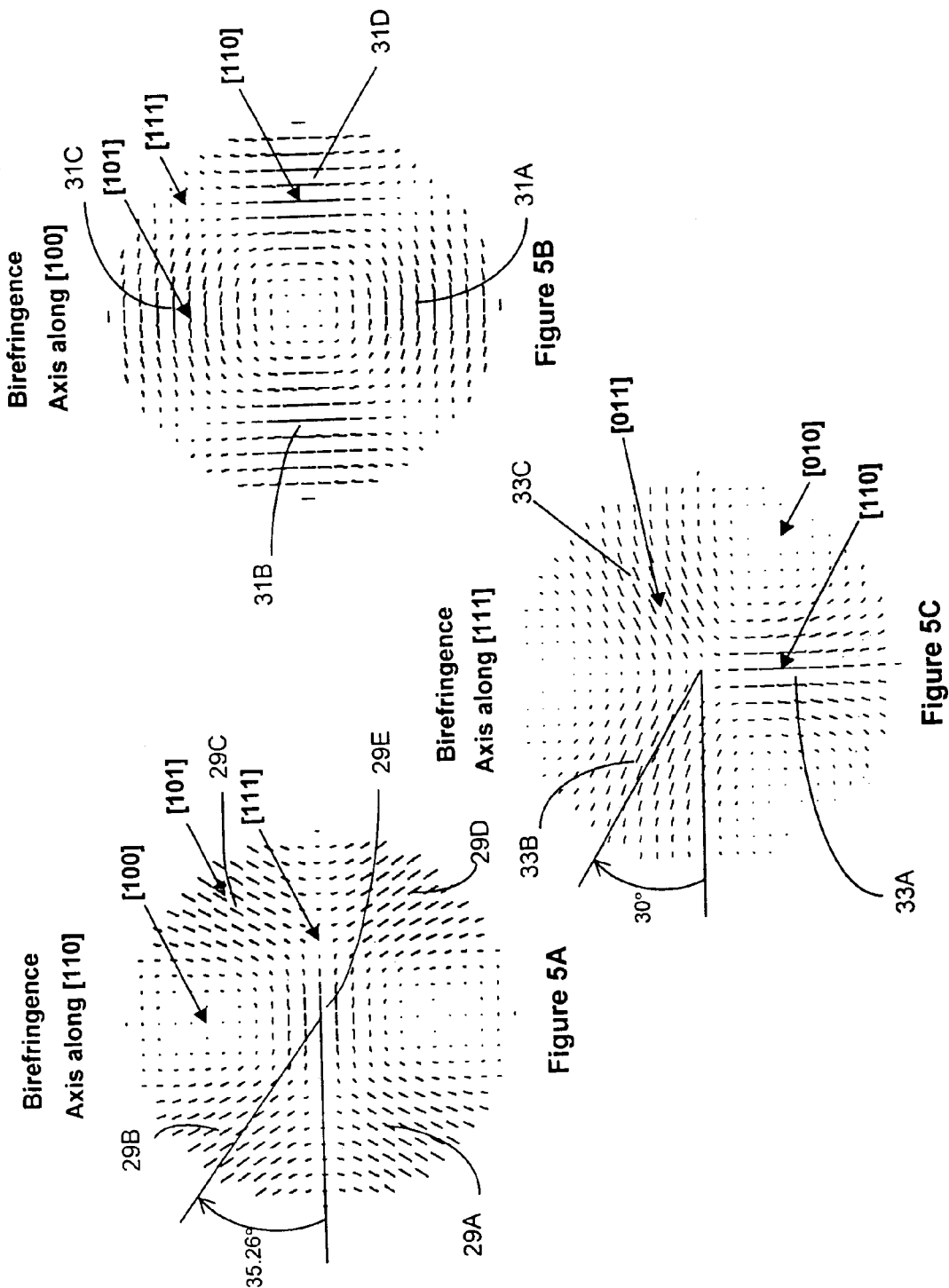
FIG. 5A is a graphical illustration of birefringence magnitude and birefringence axis orientation in angular space for a cubic crystalline material with respect to the [110] lattice direction and indicates the azimuthal orientations of the off-axis peak birefringence lobes.
FIG. 5B is a graphical illustration of birefringence magnitude and birefringence axis orientation in angular space for a cubic crystalline material with respect to the [100] lattice direction and indicates the azimuthal orientations of the off-axis peak birefringence lobes.
FIG. 5C is a graphical illustration of birefringence magnitude and birefringence axis orientation in angular space for a cubic crystalline material with respect to the [111] lattice direction and indicates the azimuthal orientations of the off-axis peak birefringence lobes.

FIGS. 5A, 5B, and 5C are schematic representations of the variations in birefringence magnitude and birefringence axis orientation in angular space for optical axis orientations along the [110], [100], and [111] lattice directions, respectively, for the cubic crystalline lattice structure shown in FIG. 4. The center of the plot represents the birefringence encountered by a ray traveling along the indicated crystal axis and normal to the plane of the illustration. Birefringence depicted at increased radial distance from the center represents the birefringence for rays at increased angles of propagation with respect to the optical axis. In each of FIGS. 5A–5C, the localized birefringence axis is indicated by the direction of lines plotted on a square grid, and the magnitude is indicated by the relative length of the lines.

The variation of birefringence magnitude in FIGS. 5A–5C is characterized by several lobes, also referred to as nodes, distributed azimuthally in which the birefringence is maximized. Each of FIGS. 5A–5C shows peak intrinsic birefringence lobes with respect to the various crystal axis directions and the cubic crystalline lattice shown in FIG. 4. The spatial orientation of the cubic crystalline lattice is indicated by the other related crystalline lattice directions indicated by the arrows. For example, in FIG. 5A in which the center represents birefringence encountered by a ray traveling along the [110] crystal axis, a ray traveling along the [101] lattice direction is at a greater angle with respect to the [110] crystal axis than a ray traveling along the [111] lattice direction; these ray angles are at 60° and 35.3°, respectively. This is indicated by the [101] arrowhead positioned at a greater radial distance from center than the [111] arrowhead. The relative azimuthal directions of the indicated [100], [101], and [111] lattice directions are as shown in FIG. 4. This description applies to FIGS. 5B and 5C as well.

Referring to FIGS. 5A–5C, in each case, the indicated crystal axis is the direction normal to the plane of the figure and at the center of each of the respective figures. FIG. 5A shows intrinsic birefringence with respect to the [110] lattice direction, including peak intrinsic birefringence lobes 29A, 29B, 29C and 29D which each forms an angle of 60° with respect to the [110] crystal axis direction. Intrinsic [110] birefringence also includes central birefringence node 29E. FIG. 5B shows intrinsic birefringence with respect to the [100] lattice direction, including peak birefringence lobes 31A, 31B, 31C and 31D each of which forms a 45° angle with respect to the [100] crystal axis direction. There are also peaks along the diagonals at 90° not depicted. FIG. 5C shows intrinsic birefringence along the [111] lattice direction and which includes peak birefringence lobes 33A, 33B, and 33C, each of which forms an angle of 35.3° with respect to the [111] crystal lattice direction.

The crystal lattice and resulting intrinsic birefringence lobes with respect to the crystal axes such as shown in FIGS. 5A–5C, are for the exemplary embodiment in which the cubic crystals are negative cubic crystals; that is the ordinary refractive index is greater than the extraordinary index, so the birefringence, $n_e-n_o$, is negative. Calcium fluoride is an exemplary negative cubic crystal. For positive cubic crystals, the patterns would be substantially similar except the lines would be each rotated by 90 degrees about their midpoints. It should be understood that other cubic crystalline optical elements such as barium fluoride, lithium fluoride, and strontium fluoride might be used as optical elements in other exemplary embodiments of the present invention. With respect to any cubic crystalline material used, the variations in the intrinsic birefringence direction and magnitude can be measured, or calculated using computer modeling. Furthermore, the variations in intrinsic birefringence direction and magnitude of an optical material may also be measured. Graphical representations of the variations in birefringence magnitude and axis orientations similar to those shown in FIGS. 5A–5C, can be similarly generated for each of the aforementioned cubic crystalline materials.

Referring again to FIG. 1, it can be understood that if each of individual lens elements L is formed of the same cubic crystalline optical material such as calcium fluoride and the individual lens elements L, or optical elements, are arranged along a common optical axis and aligned such that each of individual lens elements L that is constructed from a cubic crystalline material, includes substantially the same three dimensional lattice orientation with respect to the optical axis 10, then the net retardance of the lens system (i.e., optical system 2) will have a retardance that varies across the system exit pupil in a similar manner to the angular intrinsic birefringence variation shown schematically in FIGS. 5A–5C.

EMBODIMENT 1

Figure 6:
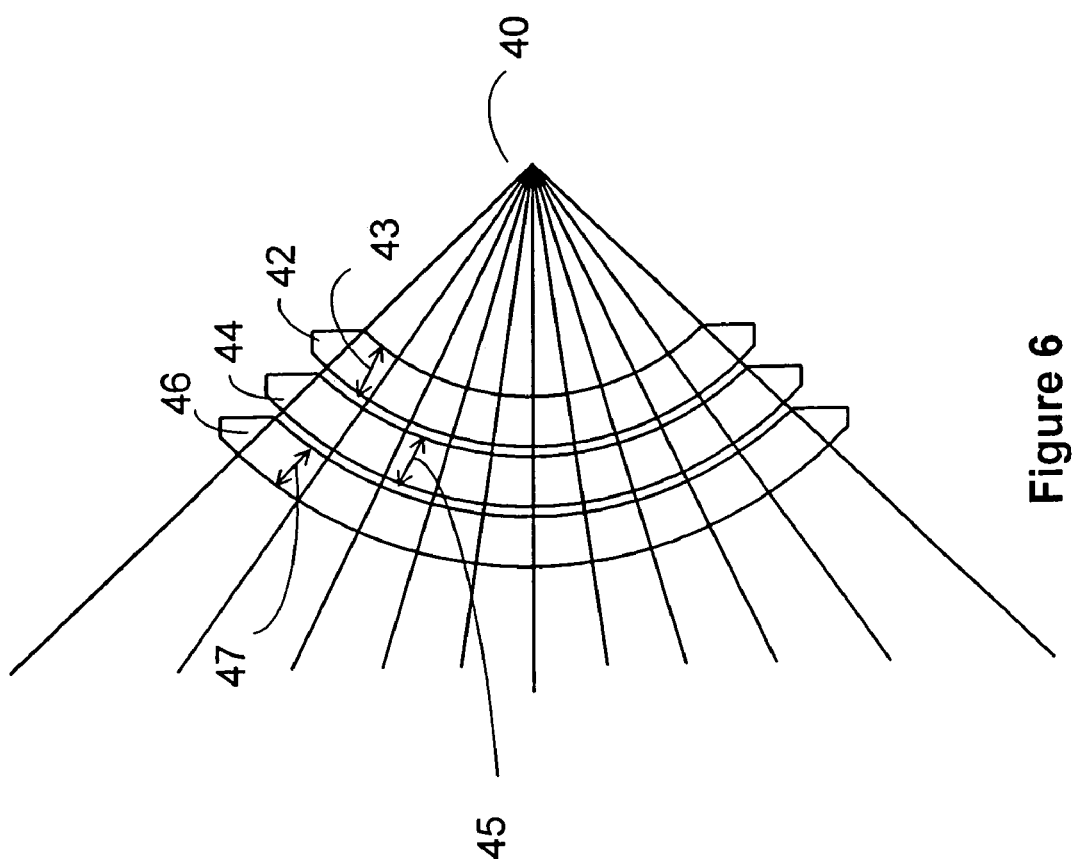
FIG. 6 is a schematic illustration of an exemplary optical system with three cubic crystalline elements concentric about the focal point of a converging beam.

FIG. 6 shows an exemplary arrangement of an optical system used to demonstrate the basic technique for mitigating the effects of intrinsic birefringence. This exemplary optical system consists of an aberration free light beam converging toward a focus at a numerical aperture of 0.707, giving maximum ray angles of 45° through each element. The beam passes through three cubic crystalline elements 42, 44 and 46 whose radii of curvature are specified to be concentric with focal point 40 of the beam. Cubic crystalline elements 42, 44 and 46 have thicknesses 43, 45 and 47, respectively. In an exemplary embodiment, each of thicknesses 43, 45 and 47 may be 5 mm and cubic crystalline elements 42, 44 and 46 may be assumed to have a birefringence magnitude, $n_e-n_o$, of $-12\times10^{-7}$, corresponding to the intrinsic birefringence of calcium fluoride measured at a wavelength of 157 nm as suggested in D. Krahmer, "Intrinsic Birefringence in $CaF_2$," at Calcium Fluoride Birefringence Workshop, Intl SEMATECH, Jul. 18, 2001, the contents of which are hereby incorporated by reference. In this exemplary configuration, the elements do not contribute wavefront aberration to the converging beam other than retardance aberrations produced by intrinsic birefringence. For this example, the wavelength is 157.63 nm, and the ordinary index of refraction is assumed to be 1.5587.

In one exemplary embodiment, the optical system shown in FIG. 6 may be arranged such that each of elements 42, 44 and 46 are arranged along a common optical axis and such that the three-dimensional crystal lattice for each element is aligned identically. FIGS. 7A, 7B, and 7C show how the retardance varies over the exit pupil for cases in which the optical axis is along the [110], [100], and [111] lattice directions, respectively, and the three-dimensional crystal lattice for each element is aligned identically.

FIGS. 7A, 7B and 7C are each graphical illustrations of net retardance magnitude and orientation across the pupil for the exemplary optical system shown in FIG. 6. In these plots, and the retardance pupil maps to follow, the retardance is shown on a square grid across the system exit pupil for the optical system of interest, and is described in general by ellipses which sometimes degenerate into lines that show the eigenpolarization states (i.e., the polarization state that remains unchanged for a ray propagating through the optical system at given pupil coordinates). The size of the ellipse or length of the line at a given pupil coordinate is proportional to the relative strength of the retardance and the angle is related to the angle of the retardance axis.

Also, for each of the lens and corresponding retardance map embodiments described herein, the coordinates are defined using a right-handed coordinate system such that the system optical axis is in the +Z direction from the object towards the image plane, the +Y axis is in the vertical direction, and the +X direction is orthogonal to the Y and Z axes. For all exit pupil retardance and wavefront maps provided herein, the plots describe variations over an exit pupil reference sphere for a given field point using a Cartesian coordinate system, where the X and Y coordinates are coordinates on the reference sphere projected onto a plane perpendicular to the chief ray.

Returning now to FIGS. 7A, 7B, and 7C, it can be seen that, in each case, the peak retardance is approximately 0.11 waves, and the RMS retardance is about 0.029 waves at a 157 nm wavelength. Thus, a significant amount of retardance is produced for each of the optical axis directions through the crystal lattice in the exemplary commonly aligned systems.

In the present invention, the crystal axes and relative rotations of the individual elements with respect to the system optical axis are selected such that the retardance produced by the intrinsic birefringence of the individual elements combines to minimize the net retardance experienced by light traveling through the system. The cubic crystalline optical elements are oriented and clocked to produce a net retardance that is less than the sum of retardance produced by the intrinsic birefringence of the respective individual cubic crystalline optical elements.

In one embodiment, the present invention provides at least three optical elements, in which at least two of the elements are oriented with the optical axis along their [110] crystal axes and at least one of the elements is oriented with its [100] crystal axis along the system optical axis.

This embodiment may be applied to the exemplary optical system shown in FIG. 6. In embodiment 1 of the present invention, the first two elements 46 and 44 are oriented along the [110] cubic crystalline lattice direction and the third element 42 is oriented along the [100] lattice direction, although the specific order of the elements may be varied in other exemplary embodiments. Furthermore, the crystal lattices of the [110] first 46 and second 44 elements are rotated by 90 degrees with respect to one another in a plane perpendicular to the optical axis. This rotation about the optical axis is known as "clocking".

FIGS. 8A, 8B, and 8C are graphical illustrations showing the retardance magnitude and orientation over the pupil for the individual elements in the arrangement of the first exemplary embodiment of the optical system shown in FIG. 6, as described above. FIGS. 8A, 8B and 8C represent the individual retardance contributions for the first 46, second 44, and third 42 cubic crystalline optical elements, respectively. First element 46 is referred to as a [110] optical element and is oriented with its [110] crystal axis along the system optical axis, such that the retardance along the optical axis is oriented horizontally, as depicted in FIG. 8A. Second element 44 is referred to as a [110] optical element and is oriented with its [110] crystal axis along the system optical axis, such that the retardance along the optical axis is oriented vertically, as depicted in FIG. 8B. Third element 42 is referred to as a [100] optical element and is oriented with its [100] crystal axis along the optical axis, such that the peak birefringence occurs along the pupil diagonals at azimuthal angles of ±45 degrees, as depicted in FIG. 8C. Hereinafter, an optical element referred to as an [XYZ] optical element, is understood to be an optical element oriented with its [XYZ] lattice direction or its [XYZ] crystal axis, along the system optical axis.

By orienting the first two optical elements with their [110] crystal axes along the optical axis, but rotated 90 degrees about the common system optical axis with respect to one another, the horizontally oriented retardance produced by first element 46 for light propagating near the optical axis may be balanced by the vertically-oriented retardance produced by second element 44. Because the retardance orientation of the second element is orthogonal to that of the first element and equal in magnitude, the effect is to correct the retardance aberration near the center of the pupil, and produce a net retardance of essentially zero. Stated alternatively, the two individual retardances produced by first element 46 and second element 44, cancel each other to produce a net retardance of essentially zero. The first two optical elements therefore have their three-dimensional crystal lattices at a fixed rotation angle about the optical axis with respect to each other. The elements are optimally clocked such that respective birefringence lobes are aligned at different three dimensional positions. Stated alternatively, the peak birefringence lobes of the first two [110] optical elements 46 and 44 are rotated with respect to each other. According to other exemplary embodiments, the [110] optical elements may be rotated by angles other than 90 degrees and in still other exemplary embodiments, other cubic crystalline optical elements may be used and rotated or clocked about the optical axis and with respect to each other, such that their respective three dimensional lattice directions are not identically aligned and so as to produce a net retardance that is reduced relative to the arrangement in which the elements have their three-dimensional crystal lattices aligned substantially identically.

FIG. 9A shows the net retardance of the first and second elements of the first exemplary embodiment of the optical system depicted in FIG. 6 and as described above. As shown, the retardance is corrected to essentially zero near the center of the pupil, as well as along horizontal and vertical sections bisecting the pupil. Residual retardance is noted, however, along the pupil diagonals, and is oriented at roughly ±45 degrees, directed towards the center of the pupil.

Returning to FIG. 8C, the retardance produced by third element 42 of the first exemplary embodiment of the optical system depicted in FIG. 6 oriented with its [100] crystal axis along the optical axis, has peak retardance along the diagonals of the pupil, but the magnitude of the retardance is opposite in sign to the net retardance produced by the first and second elements 46 and 44, as shown graphically in FIG. 9A. In the exemplary embodiment, the [100] optical element is rotated about the common optical axis such that the peak birefringence lobes are rotated substantially by 45° with respect to the directions of the local birefringence axes along the [110] crystal axes of the two, 90° clocked [110] optical elements. It can therefore be seen that the retardance orientation for the contribution of the third element (FIG. 8C) is approximately orthogonal to the net contribution from the first and second elements (FIG. 9A).

FIG. 9A shows that two [110] optical elements at 90 degree relative rotations about the optical axis, produce a residual retardance error along the diagonals, but provide for corrected retardance along horizontal and vertical slices through the center of the pupil. Using the same principles, a [100] optical element may be used to further reduce the overall retardance.

FIG. 9B shows net retardance due to the contributions from all three elements of the first exemplary embodiment of the optical system depicted in FIG. 6. It should be understood that the [100] optical element may be either first element 46, second element 44 or third element 42, with essentially the same result. The residual net retardance is oriented roughly azimuthally and increases from zero at the center of the pupil to a peak at the edge of the pupil. The peak retardance is approximately 0.019 waves, and the RMS retardance over the pupil is approximately 0.005 waves. In comparison to the uncorrected birefringence shown in FIGS. 7A, 7B and 7C, each having a peak retardance of approximately 0.11 waves and a RMS retardance of approximately 0.029 waves, it can be understood that the peak retardance has been reduced by a factor of roughly six.

According to another exemplary embodiment in which thickness 43 of third element 42 is about 2.3 mm, the peak retardance may be reduced to 0.0139 waves, with an RMS retardance of 0.0041 waves. This retardance is shown in FIG. 9C. According to this exemplary embodiment, the peak retardance was reduced by a factor of approximately eight. According to other exemplary embodiments, other thicknesses may be used for elements 42, 44 and 46 to yield different retardance values.

According to another exemplary embodiment, the residual error in FIG. 9B may be further reduced by a birefringent element that produces radially-oriented retardance that increases in magnitude from the center to the edge of the component. Such an element may be produced by applying a hoop stress to the edge of a meniscus optical component and added to the exemplary optical system of the first embodiment and as shown in FIG. 6. The applied stress creates a spatially varying birefringence to compensate for the computed or measured birefringence variation within the optical system as shown in FIG. 9B. Various stresses may be applied to various optical elements to achieve the spatially varying birefringence. The stressed optical element may be a lens element or a window and aligned along the optical axis. Various techniques may be used to apply the stress.

Figure 9D:
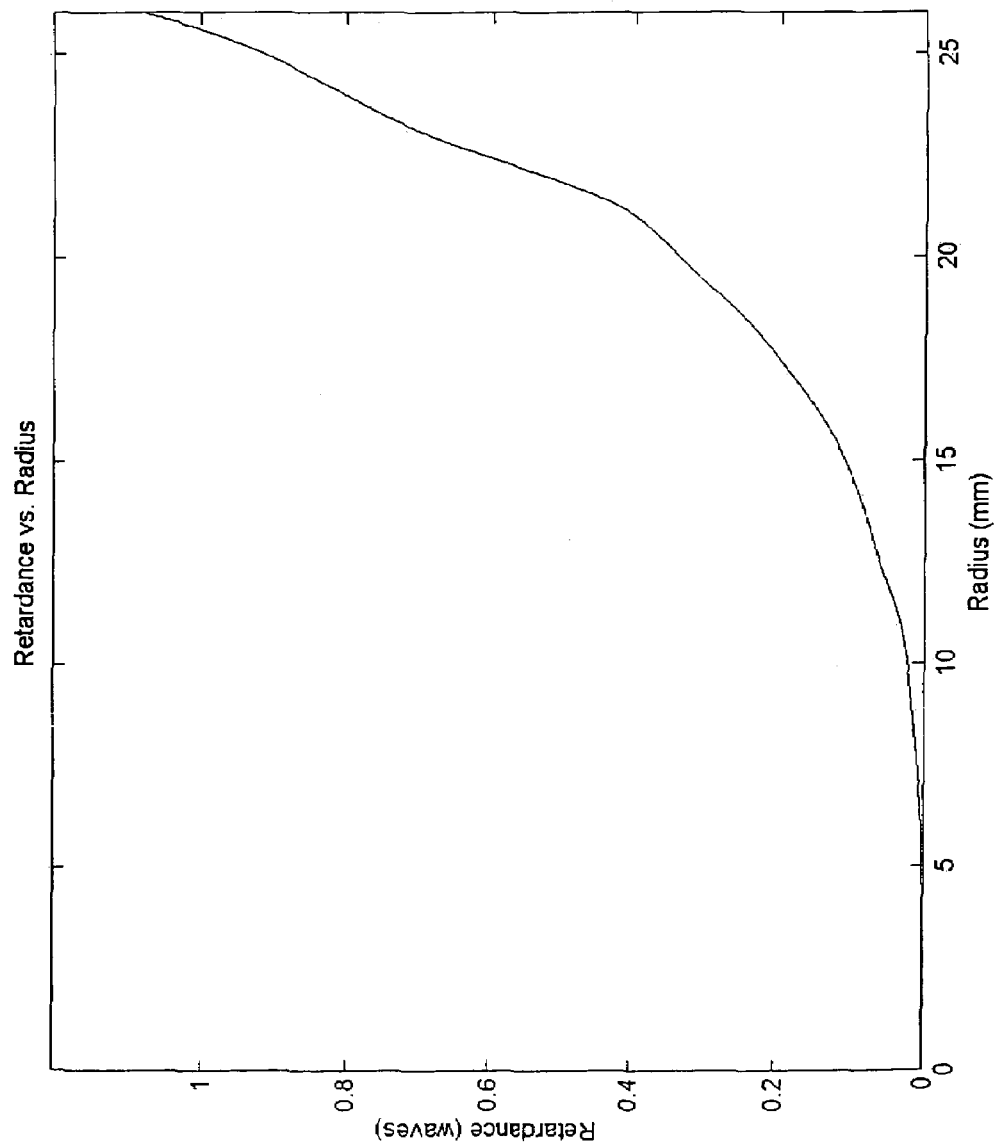
FIG. 9D is a graphical illustration plotting the radial retardance variation across the first element in the optical system depicted in FIG. 6, when a compressive hoop stress is applied around the perimeter of the first element.

FIG. 9D shows the spatial radial retardance variation induced by applying an exemplary compressive hoop stress of 1000 pounds per square inch to first element 46 of FIG. 6. In this exemplary embodiment, element 46 has radii of curvature of 40 and 35 mm and a central thickness of 5 mm. Differently shaped elements will have different radial retardance variations, which can be used to substantially cancel the retardance contributions such as those shown in FIG. 9B. The stress induced birefringence varies spatially over the element, which is fundamentally different than retardance from intrinsic birefringence that varies as a function of the angle of a ray with respect to the crystal axis. This provides another important tool for reduction of system retardance.

According to the exemplary embodiment illustrated in FIG. 6, in which the first two elements 46 and 44 are [110] cubic crystalline optical elements, third element 42 is a [100] cubic crystalline optical element, and all elements are 5 mm thick, first element 46 may include a tensile hoop stress of approximately 24 lbs./in$^2$ applied around the perimeter to minimize the net RMS retardance. The relative crystal lattice orientations for optical elements 42, 44 and 46 are as described above.

Figure 9E:
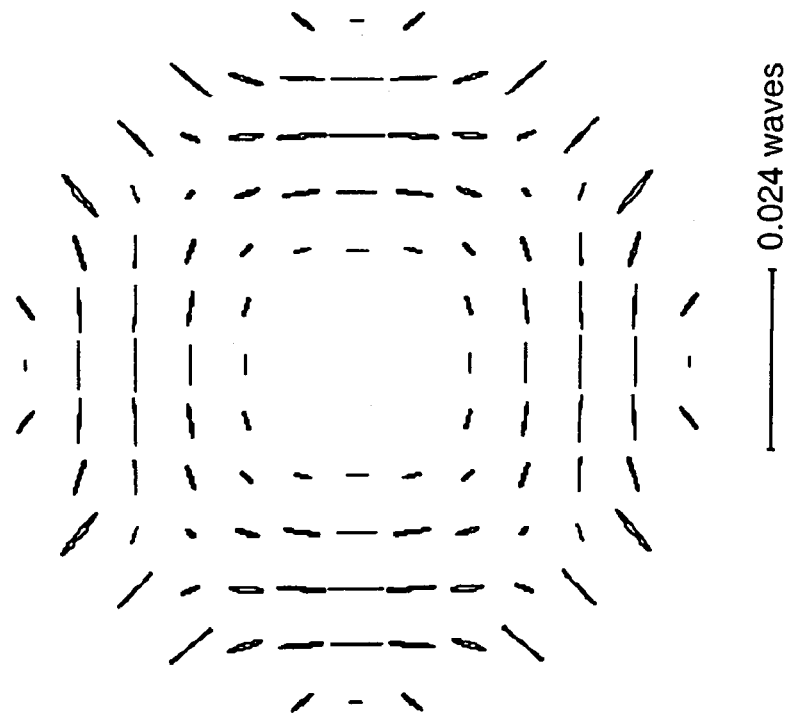
FIG. 9E is a graphical illustration showing the individual contribution to the retardance across the pupil for the first element of the optical system depicted in FIG. 6, when an exemplary tensile hoop stress is applied around the perimeter of the element, and without including the retardance caused by intrinsic birefringence.

FIG. 9E is a graphical representation depicting the individual retardance contribution due to the stress-induced birefringence of first element 46 shown in FIG. 6. FIG. 9E shows the individual contribution to the retardance across the pupil for first element 46, when a tensile hoop stress of approximately 24 lbs./in$^2$ is applied around the perimeter of the element, and does not include the retardance caused by intrinsic birefringence. FIG. 9E indicates a peak retardance of 0.0170 waves and RMS retardance of 0.0055 waves. In this exemplary embodiment, the radially oriented retardance produced by the stress element compensates for the residual retardance for the embodiment without stress-induced birefringence depicted in FIG. 9B.

Figure 9F:
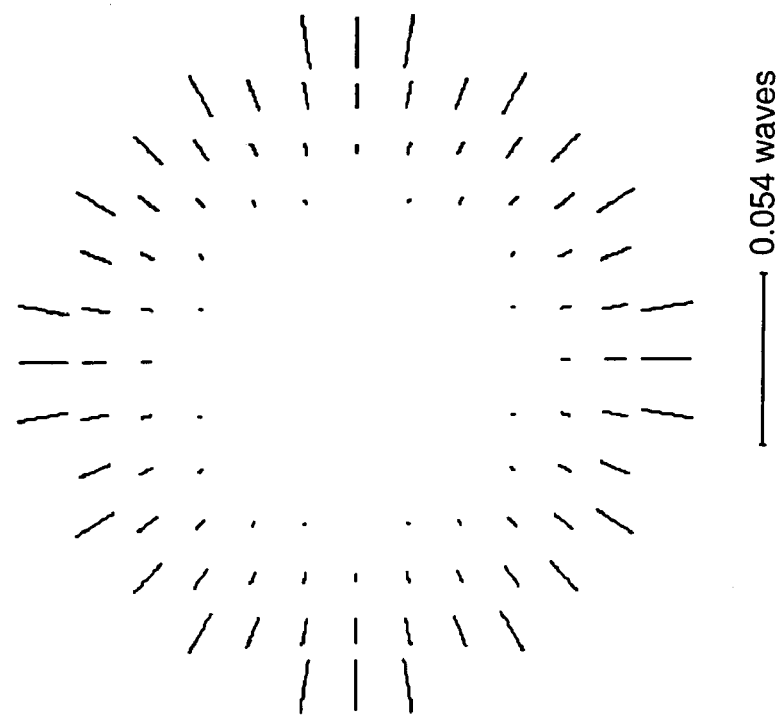
FIG. 9F is a graphical illustration showing the net retardance across the pupil for the optical system depicted in FIG. 6, when an exemplary tensile hoop stress is applied around the perimeter of the first element to minimize the net RMS retardance.

FIG. 9F is a graphical illustration showing the net retardance across the pupil for the exemplary embodiment including the stress-induced birefringence of first element 46. With a tensile stress of approximately 24 lbs./in$^2$ applied to first element 46, the maximum residual retardance is 0.0073 waves, and the RMS retardance is 0.0024 waves for the optical system. This represents a significant improvement over the respective peak and RMS retardance values of 0.019 and 0.005 waves, respectively, that result without applying stress-induced birefringence to first element 46, as shown in FIG. 9B. The applied stress is intended to be exemplary only and various other applied stresses of different magnitudes, may be used depending on the residual retardance of the system which, in turn, depends on the number and types of cubic crystalline optical elements, the orientation and thickness of the optical elements, and the like.

According to yet another exemplary embodiment in which the first two elements 46 and 44 are [110] cubic crystalline optical elements and third element 42 is a non-cubic crystalline, non-birefringent element, a tensile hoop stress may be applied around the perimeter of third element 42 to minimize the net RMS retardance using the principles as above. Various stress values may be applied.

Another aspect of the present invention is the method for measuring or using computer modeling to determine the retardance of an optical system, identifying an optical element or elements to have stress-induced birefringence applied thereto, then applying the compressive or tensile stress as a hoop or other stress, to produce stress-induced birefringence as described above, to reduce residual retardance.

According to other exemplary embodiments having a residual retardance that is constant, or which varies after correction, various birefringent elements may be added to correct for the residual retardance. In an exemplary embodiment, a wave plate may be added to the system to correct for constant retardance; this wave plate may constructed from stressing a parallel plate. According to other exemplary embodiments, a powered birefringent element having constant birefringence magnitude may be used to compensate for residual variations in retardance. The powered element may be a uniaxial crystalline material or it may include a stress-induced birefringence, as above. Other optical elements with stress-induced birefringence may additionally or alternatively be used to correct for residual retardance variation. The various exemplary optical elements may include a stress that varies linearly across the element or quadratically in the radial direction, along an axis substantially orthogonal to the optical axis. The birefringent element or elements will be chosen and positioned to correct for the constant or varying retardance residual in the system after correction as above.

EMBODIMENT 2

According exemplary embodiment 2, the present invention provides an apparatus that achieves reduced retardance through the use of at least four [110] optical elements and at least one [100] optical element. In the illustrated embodiment shown in FIG. 10, the present invention provides an apparatus having four elements with their [110] crystal axes along the system optical axis and one element with its [100] crystal axis along the system optical axis.

The relative orientations of the lattice directions in the plane perpendicular to the optical axis may be adjusted for the [110] optical elements. This technique is known as "clocking" or rotating the crystal lattice orientation of elements aligned along a common optical axis. The relative orientations may be selected in a particular manner that relates to the azimuthal orientations of the off-axis peak birefringence lobes.

Referring to FIG. 4, there are peak birefringence lobes at 60° with respect to the [110] crystal axis, corresponding to the [011] and [101] directions (as well as two additional lobes not shown in FIG. 4).

FIG. 5A shows a retardance pupil map for a [110] optical element. As shown, the four outer birefringence lobes are not distributed by equal azimuthal angles. If the crystal lattice is defined to give horizontally oriented retardance along the optical axis for a negative birefringence magnitude, $n_e-n_o$, the peaks are at azimuthal angles of ±35.26° and ±144.74°.

Figure 10:
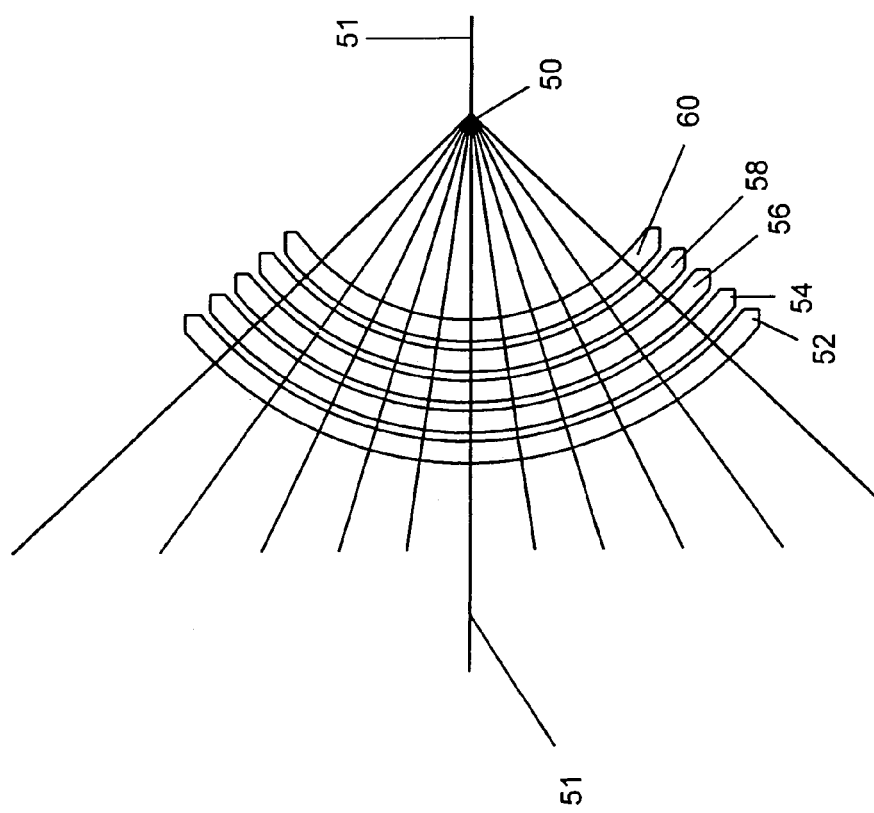
FIG. 10 is a schematic illustration showing an exemplary optical system with five cubic crystalline elements concentric about the focal point of a converging beam.

FIG. 10 shows an optical system according to the second exemplary embodiment. This exemplary five-element optical system consists of an aberration-free light beam converging toward a focus 50 at a numerical aperture of 0.707, giving maximum ray angles of 45° through each element. Cubic crystalline optical elements 52, 54, 56, 58 and 60 are aligned along optical axis 51. A light beam passes through five cubic crystalline elements 52, 54, 56, 58 and 60 whose radii of curvature are each concentric with the focal point 50 of the beam. In an exemplary embodiment, the elements each have thicknesses of about 2.5 mm, and are assumed to have a birefringence magnitude each, $n_e-n_o$, of $-12 \times 10^{-7}$, corresponding to the intrinsic birefringence of calcium fluoride measured at a wavelength of 157 nm. According to other exemplary embodiments, other thicknesses may be used. In this configuration, the elements do not contribute wavefront aberration to the converging beam, other than retardance aberrations produced by intrinsic birefringence. According to an exemplary embodiment, the wavelength of light may be 157.63 nm, and the ordinary index of refraction may be 1.5587. Other wavelengths and indices of refraction may be used in other exemplary embodiments.

Figures 11A, 11B, 11C:
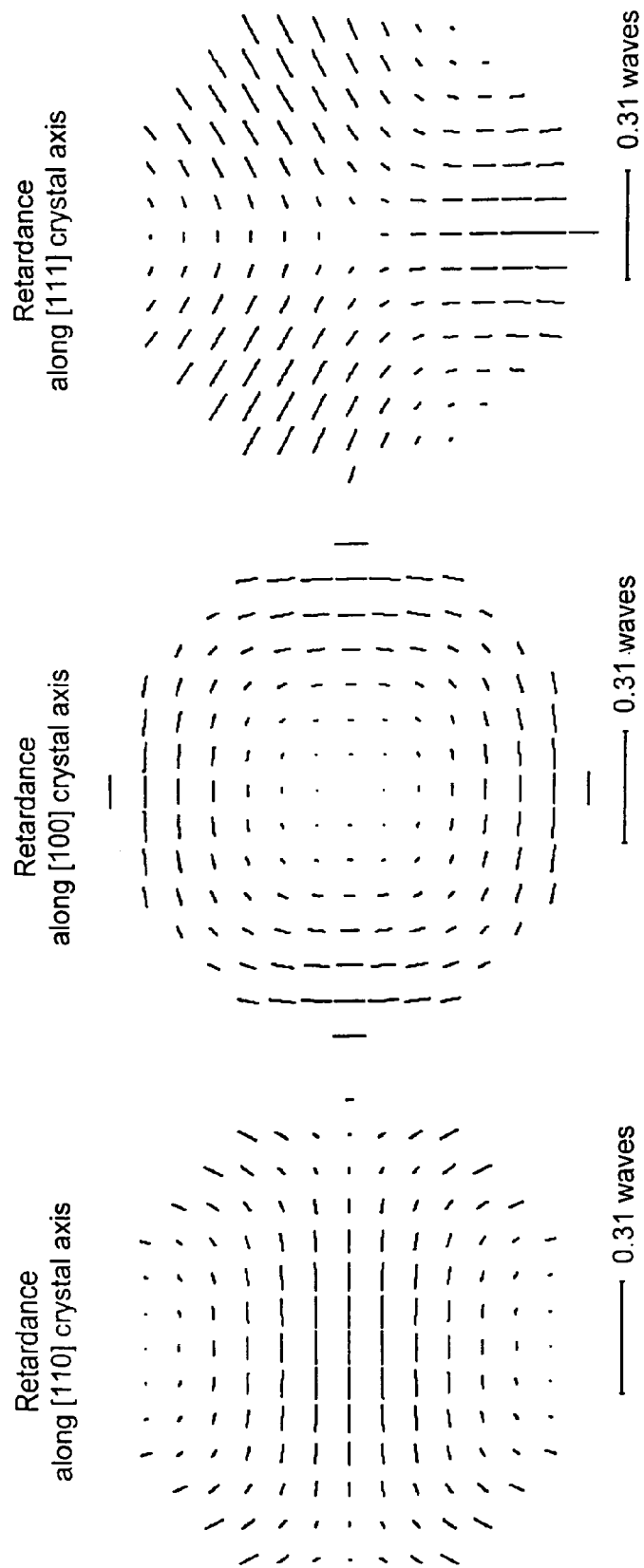
FIG. 11A is a graphical illustration showing net retardance magnitude and orientation across the pupil for an exemplary embodiment of the optical system depicted in FIG. 10 in which the optical axis is along the [110] lattice direction for each element and the crystal axes for all elements are oriented identically.
FIG. 11B is a graphical illustration showing net retardance magnitude and orientation across the pupil for an exemplary embodiment of the optical system depicted in FIG. 10 in which the optical axis is along the [100] lattice direction for each element and the crystal axes for all elements are oriented identically.
FIG. 11C is a graphical illustration showing net retardance magnitude and orientation across the pupil for an exemplary embodiment of the optical system depicted in FIG. 10 in which the optical axis is along the [111] lattice direction for each element and the crystal axes for all elements are oriented identically.

FIGS. 11A, 11B, and 11C are graphical representations showing how the retardance varies over the exit pupil for cases in which each of elements 52, 54, 56, 58 and 60 of FIG. 10 are [110], [100], and [111] optical elements, respectively, and the three-dimensional lattice for each element is aligned identically. In each case, the peak retardance is approximately 0.095 waves, and the RMS retardance is about 0.024 waves at the indicated wavelength of 157 nm. Thus, a significant amount of retardance is produced for each of the optical axis directions through the crystal lattice.

According to the second exemplary embodiment, as applied to the exemplary optical system depicted in FIG. 10, the first four elements 52, 54, 56 and 58 are oriented with their [110] crystal axes along optical axis 51 and fifth element 60 is oriented with its [100] crystal axes along optical axis 51. According to other exemplary embodiments, the specific order of the components may be changed. According to this second exemplary embodiment, the relative clockings of the four elements 52, 54, 56 and 58 with optical axes along the [110] direction, may be, in order, 17.632°, −17.632°, 72.368°, and −72.368°. Fifth [100] element 60 is oriented such that the peak birefringence lobes are at azimuthal angles of ±45°.

FIGS. 12A to 12D show the retardance maps for the individual element contributions for the four [110] optical elements in which the four elements are clocked as described above.

Relative to an element clocking that provides horizontally oriented retardance along the optical axis, first element 52 is rotated by 17.632°, which locates the peak birefringence lobes at azimuthal angles of 52.897°, 162.368°, −17.632°, and −127.104°. The retardance map for the retardance contribution from first element 52 is shown in FIG. 12A.

Figure 12B:
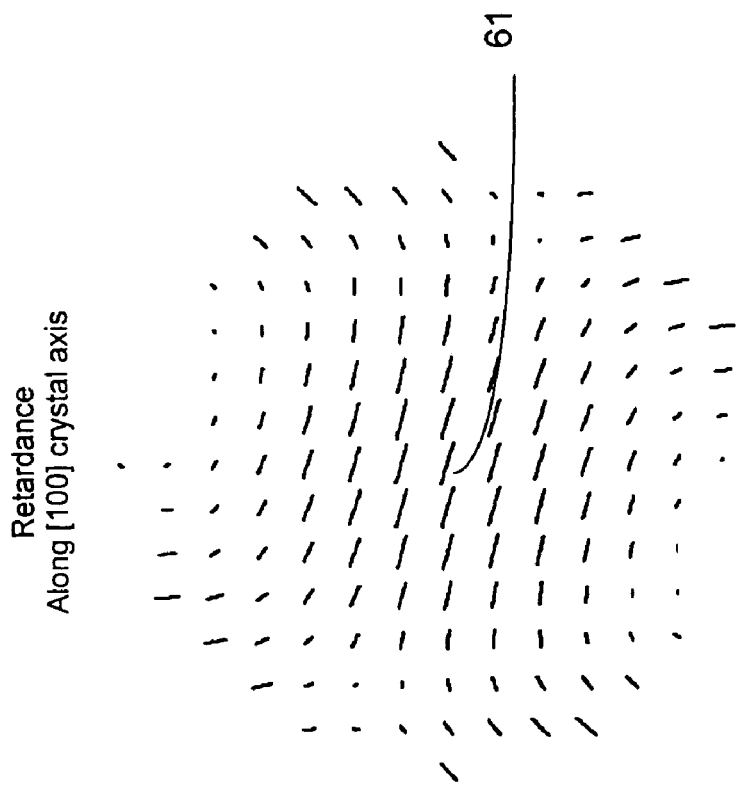
FIG. 12B shows the individual contribution to the retardance across the pupil for the second element, in which the retardance along the optical axis is rotated by −17.632° with respect to horizontal.
Figure 12A:
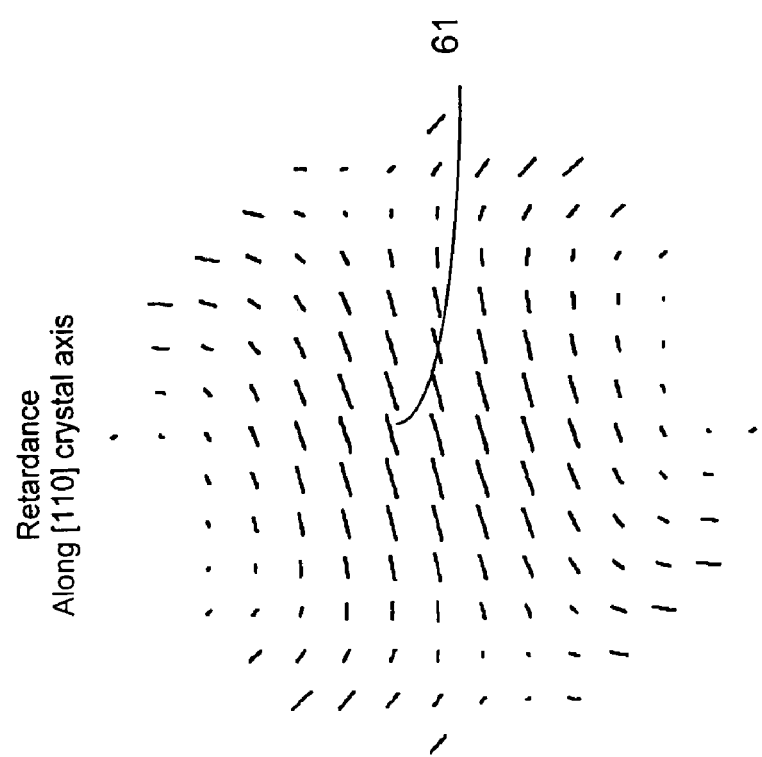

FIG. 12B shows the retardance contribution of second element 54, which is rotated by −17.632° to position the peak birefringence lobes at azimuthal angles of 17.632°, 127.104°, −52.897°, and −162.368°.

Figure 12D:
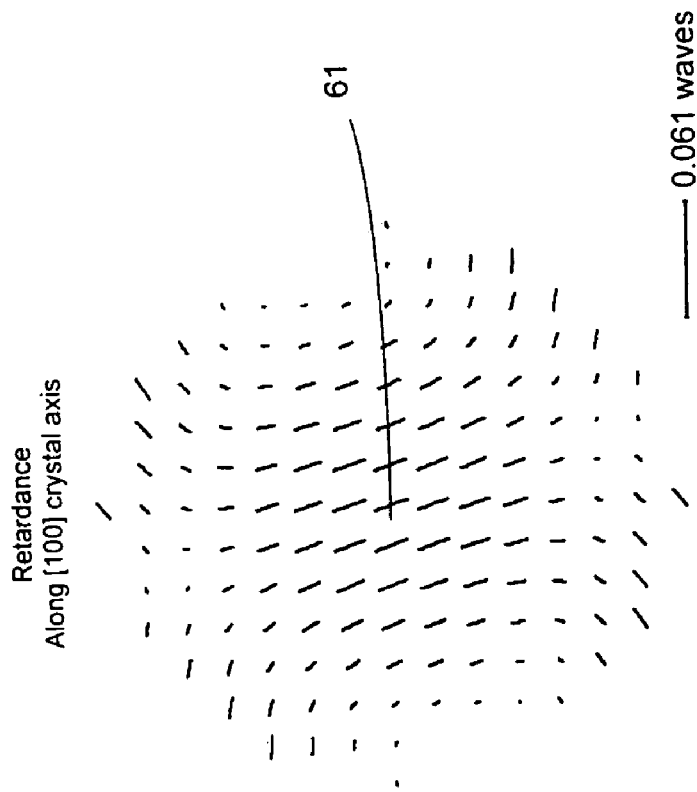
FIG. 12D shows the individual contribution to the retardance across the pupil for the fourth element, in which the retardance along the optical axis is rotated by −72.368° with respect to horizontal.
Figure 12C:
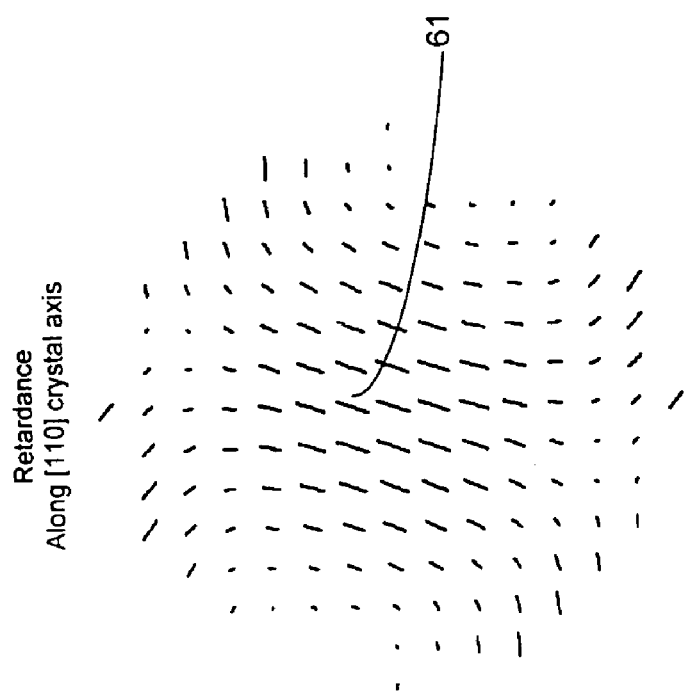
FIG. 12C shows the individual contribution to the retardance across the pupil for the third element, in which the retardance along the optical axis is rotated by 72.368° with respect to horizontal.

FIG. 12C shows the retardance contribution of third element 56, which is rotated by −72.368° to position the peak birefringence lobes at azimuthal angles of 107.632°, 37.104°, −72.368°, and −142.896°.

FIG. 12D shows the retardance contribution of fourth element 58, which is rotated by −72.368° to position the peak birefringence lobes at azimuthal angles of 72.368°, 142.896, −37.104°, and −107.632°. The relative clockings of the four elements with optical axes along the [110] lattice direction are related to half of the azimuthal angle shown in FIG. 5A, i.e. ±17.632° or ±90−17.632°)°.

As shown in FIGS. 12A and 12D, the retardance contribution of first element 52 is orthogonal to that of fourth element 58 near the center 61 of the pupil. Similarly, FIGS. 12B and 12C show that the retardance contribution of second element 54 is orthogonal to that of third element 56 near the center 61 of the pupil.

FIG. 13A shows the individual retardance contributions of the first and third elements 52 and 56 overlapping one another. Over central portion 62 of the pupil, the retardance orientations are crossed at an average angle of roughly 45°. At positions 64 along the outer edge of the pupil and along the −45° diagonal, the retardance orientations are the same.

FIG. 13B shows the net retardance for the combination of first element 52 and third element 56. Over a wide region of the pupil along the 45° diagonal, the retardance is oriented at a 45° angle. At the edge of the pupil along the −45° diagonal, the retardance is oriented at −45°. Similarly, FIG. 13C shows the net retardance of second element 54 and fourth element 58, which gives a retardance orientation over the pupil that is roughly orthogonal to the net retardance of the first and third elements as shown in FIG. 13B.

FIG. 14A shows the net retardance for the four elements 52, 54, 56 and 58 with their respective [110] crystal axes along optical axis 51, and oriented as described above. The maximum retardance is 0.0181 waves and the RMS retardance is 0.0049 waves, which is a reduction in retardance of roughly a factor of five compared with all of the element crystal lattices aligned identically in three dimensions as depicted in FIGS. 11A, 11B and 11C. The residual retardance orientation is radial with larger retardance magnitude along the ±45° diagonals.

The retardance contribution for fifth element 60, which is oriented to have its [100] lattice direction along the optical axis, is shown in FIG. 14B. As shown, the retardance is similar in magnitude to the residual net retardance of the first four elements 52, 54, 56 and 58 shown in FIG. 14A, and the orientation is generally perpendicular across the pupil. This allows for nearly perfect correction or canceling of the retardance. According to the second exemplary embodiment in which the first four [110] optical elements 52, 54, 56 and 58 are aligned along optical axis 51 and have a net retardance shown in FIG. 14A and in which the fifth optical element 60 is aligned to have its [100] crystal axis along optical axis 51, the net retardance for all five elements has a maximum of about 0.0007 waves and RMS retardance of 0.0002 waves as shown in FIG. 14C.

The second exemplary embodiment thus shows that four [110] optical elements and one [100] optical element with identical thicknesses and ray angles are aligned to reduce the peak retardance from 0.0952 waves when all elements are identically oriented [110] elements, to a peak of 0.0007 waves, and the RMS retardance is reduced from 0.0229 waves to 0.0002 waves, a reduction by a factor of more than 100 in both cases.

It should be understood that the first embodiment with two [110] optical elements and one [100] optical element, and the second embodiment with four [110] optical elements and one [100] optical element, are exemplary only and that various numbers of optical elements may be used and clocked, in accordance with the preceding principles to balance the individual intrinsic birefringence contributions of the elements and produce a reduced net birefringence and retardance. These principles may be applied to lens systems, including cubic crystalline lens elements exclusively or they may be applied to lens systems including cubic crystalline and other lens elements.

Also as described in conjunction with embodiment 1, one or more stress birefringent elements, wave plates, or combinations thereof may additionally be used to correct for residual birefringence variation and constant residual retardance which remains after the above-described system corrections have been made.

CONCEPTS OF THE INVENTION

The basic principles used to compensate the effects of intrinsic birefringence, as applied to the first and second exemplary embodiments corresponding to the exemplary lens arrangements shown in FIGS. 6 and 10, respectively, can be extended to compensate for the effects of intrinsic birefringence effects in various other high-performance, high numerical aperture optical systems, such as those used for photolithography in other exemplary embodiments. The principles apply both to refractive and catadioptric lens systems and may be used when designing new lens systems or to improve a known lens prescription.

According to other exemplary refractive and catadioptric lens systems, the individual lens element thicknesses, radii of curvature, aspheric coefficients, and ray angles may differ significantly from component to component. Additional non-cubic crystalline lens elements may optionally be included. Nonetheless, it will be shown in the embodiments to follow as in the previous embodiments, that the crystal orientation and relative clockings of the components may be chosen to reduce birefringence and therefore retardance. The illustrated embodiments show optical elements having their [110] crystal axes along the optical axis, used in conjunction with optical elements having their [100] crystal axes along the optical axis to balance, or cancel retardance aberrations produced by intrinsic birefringence. A general concept of the present invention is to provide an optical system which includes a projection lens formed of a plurality of optical elements, two or more of which are constructed from cubic crystalline material and oriented with their [110] cubic crystalline lattice direction along the system optical axis and with relative rotations about the optical axis to give reduced retardance for light propagating at small angles relative to the system optical axis, and one or more elements oriented with the optical axis substantially along the [100] cubic crystalline lattice direction to give reduced retardance for light propagating at larger angles with respect to the system optical axis, that is, locations off the optical axis.

In other embodiments, an element or elements having their [111] crystal axes aligned along the optical axis, as shown in FIG. 5C, may be used in conjunction with other element combinations to substantially cancel the retardance throughout the field using the same principles described for the [110] and [100] embodiments. In various exemplary embodiments, lens design software may be used to generate the lens prescription including positioning of the individual lens elements, as well as thicknesses, radii of curvature, aspheric coefficients and the like. In one embodiment, the RMS retardance may be computed over a pupil grid at each field point and used as the merit function for a damped least squares optimization using the commercially available lens software, CODE V, for example. A computer may be used to optimize the orientation and clocking of each of the elements in the system.

Phase aberrations, such as astigmatism, introduced by the average index variations in the cubic crystalline elements, may be compensated using one or more surfaces with different radii of curvature along orthogonal directions. The variation in average index of refraction produced by [100] optical elements is generally more easily compensated than the variation produced by [110] optical elements, due to a more gradual variation in average index of refraction as a function of propagation angle with respect to the optical axis. Therefore, a sufficiently high number of [100] optical lens elements may advantageously be used along the optical axis to minimize high-order variations in average index of refraction.

According to other exemplary embodiments, the thicknesses of the components, the spacings between the components, and the radii of curvature and aspheric coefficients of the lens elements, may similarly be optimized to balance aberrations and reduce retardance across the field. According to yet another exemplary embodiment, the cubic crystalline lens elements may be selected and positioned such that elements having a birefringence magnitude that is opposite in sign to another lens element or elements, may be used together to substantially cancel retardance produced by intrinsic birefringence and produce a net retardance of near zero throughout the field. For example, a calcium fluoride lens element (having a negative birefringence magnitude) may be used in conjunction with a barium fluoride lens element (having a positive birefringence magnitude) and aligned along the same crystal lattice direction, so that the retardance throughout the field is substantially cancelled.

The third, fourth and fifth embodiments are based on lens prescriptions published in the art. Such are intended to be exemplary only and the principles and concepts of the present invention may be applied to any of various other lens arrangements. Application of the present invention is of particular interest for high numerical aperture optical systems for photolithography at an exposure wavelength near 157 nm, such as that produced by an $F_2$ excimer laser. Because many of the available optical systems described in the art include lower numerical apertures and operate at longer wavelengths such as 193 nm, the techniques of the present invention are illustrated by application to exemplary known optical systems designed for an exposure wavelength near 193 nm, corresponding to the wavelength produced by an ArF excimer laser, commonly used in photolithography. It should be understood, however, that the principles and techniques of the present invention apply equally to high numerical aperture systems and systems operating at 157 nm.

To estimate the effects of intrinsic birefringence in high numerical aperture lenses designed for a central wavelength of 157 nm, in which the refractive elements are primarily constructed from calcium fluoride, each element in the following embodiments, which may be constructed from fused silica or calcium fluoride in the various embodiments, is assumed to have a peak intrinsic birefringence of $(n_e-n_o)=-12\times10^{-7}$, which is roughly equivalent to the measured peak intrinsic birefringence in calcium fluoride at a wavelength of 157 nm.

In this manner, the method for compensation of intrinsic birefringence in similar high numerical aperture lenses designed for 157 nm may be demonstrated using known exemplary lens descriptions designed for a central wavelength of 193 nm as starting points. The change in central wavelength may result in a change in refractive index of the refractive components and may warrant the use of fluoride materials such as calcium fluoride, but the types of elements used and distributions of ray angles for a given numerical aperture are similar enough to allow a lens designed for a central wavelength of 193 nm to be used to demonstrate the inventive techniques for mitigating the effects of intrinsic birefringence in high numerical aperture lenses, particularly at a central wavelength of 157 nm.

In the descriptions of embodiments 3, 4 and 5 that follow, each refractive surface is assumed to have a hypothetical, single layer anti-reflection coating with an index of refraction equal to the square root of the element index of refraction and with an optical thickness of a quarter wave at a wavelength of 193.3 nm. The indices of refraction for calcium fluoride and fused silica used in each of the embodiments are assumed to be 1.501455 and 1.560326, respectively, at a wavelength of 193.3 nm. Different coatings will introduce different retardance and phase aberrations and will require slightly different compensation. It should be understood, however, that the method demonstrated for the single hypothetical coating is applicable to systems with various other physical coatings.

In each of embodiments 3–5 that follow, the corrected optical system is based on a given lens prescription. The given lens prescription may be maintained and the effects of intrinsic birefringence compensated for, using the techniques described above, and additionally or alternatively by the splitting of one or more lens elements of the given prescription, into two or more sub-elements. The principles of the present invention may, however, be advantageously applied to various other new lens prescriptions being designed, with the advantages of the present invention incorporated into the lens design.

Furthermore, one or more birefringent elements, wave plates, or combinations thereof as described in conjunction with embodiments 1 and 2, may additionally be used to correct for residual birefringence variation and constant residual retardance after the described corrections have been made to the systems as described in embodiments 3, 4 and 5.

EMBODIMENT 3

The third exemplary embodiment for application of the compensation techniques for intrinsic birefringence may be described in conjunction with an exemplary all-refractive projection lens used for photolithography. Such an exemplary lens is provided in the fifth embodiment of European Patent No. 1 139 138 by Y. Omura, the contents of which are herein incorporated by reference. This exemplary lens is depicted in the schematic illustration of FIG. 15. This exemplary system is designed to operate at a central wavelength of 193.3 nanometers, provides 4× reduction at a numerical aperture of 0.75, and has an image field diameter of 27.5 mm. The exemplary design employs 20 elements E with six aspheric surfaces constructed from calcium fluoride and fused silica; however, each component is assumed to have an intrinsic birefringence of $-12\times10^{-7}$ in the following baseline computations. The exemplary system includes optical axis 65.

Figure 16B:
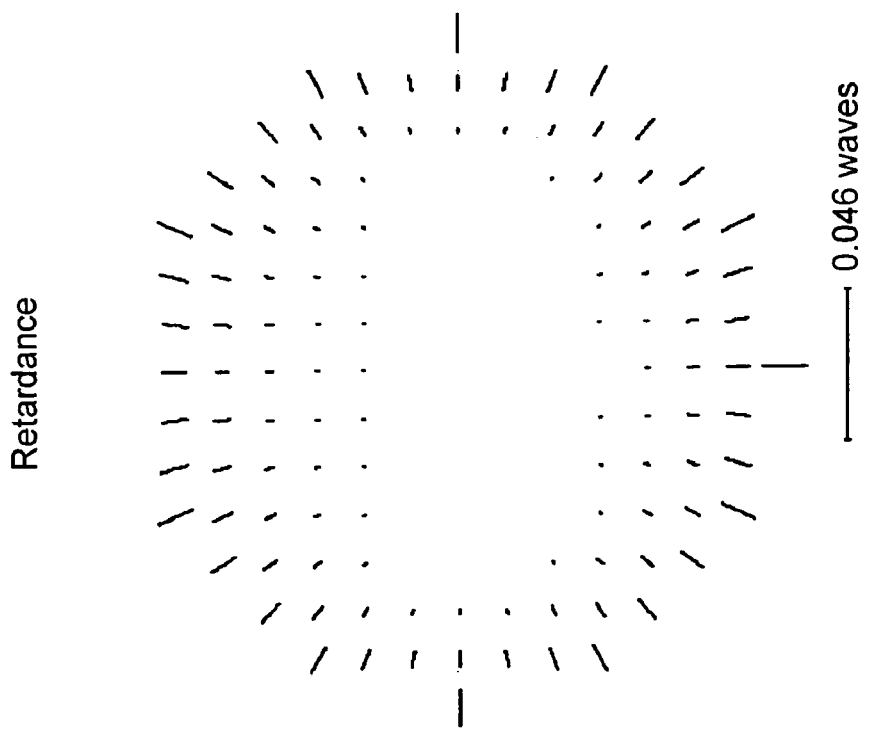
FIGS. 16A and 16B are graphical illustrations showing retardance across the pupil for the exemplary lens depicted in FIG. 15 at central and extreme field points, respectively, due to single-layer anti-reflection coatings.
Figure 16A:
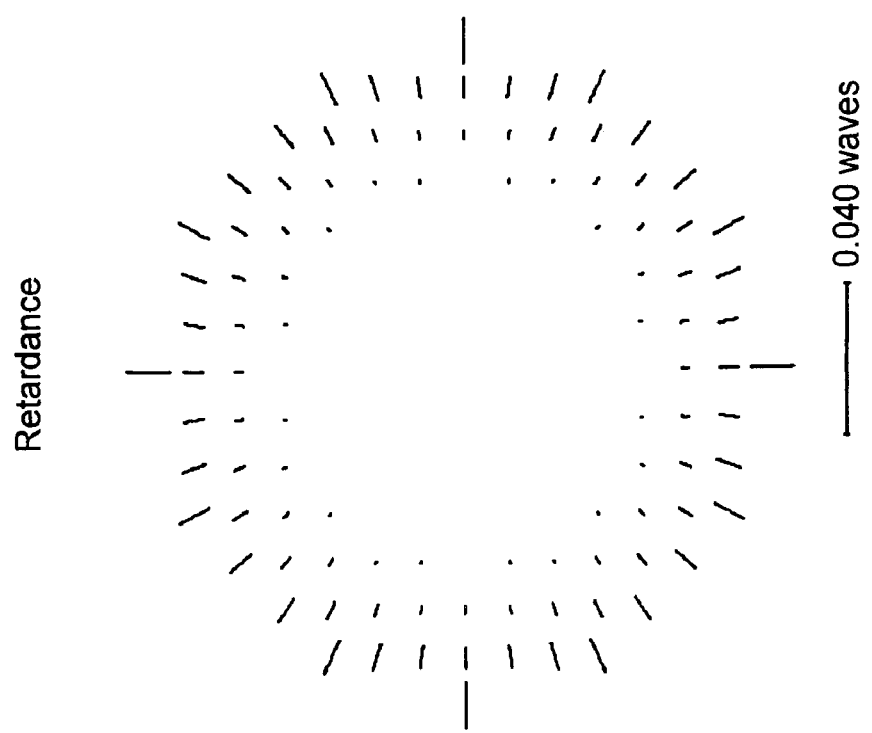

The RMS and maximum retardance and diattenuation over the exit pupil are listed in Table 1 below for the nominal design without intrinsic birefringence effects included for relative field heights of 0, 0.7, and 1.0. The relative field height is defined to be the actual field height normalized by the semi-field height. Thus, an image located on the optical axis has zero field height and an image located at 13.75 mm in this lens corresponds to unit relative field height. The retardance and diattenuation result from the single-layer anti-reflection coatings used in the model. FIGS. 16A and 16B depict the retardance across the system exit pupil due to the anti-reflection coatings for the field points at the center and edge of the field, respectively. The retardance is radially-oriented and is largest in magnitude at the edge of the pupil. The retardance due only to the anti-reflective coating is relatively small.

TABLE 1

| Relative Field Height | Retardance (waves at $\lambda_o$ = 193.3 nm) | | Diattenuation | |
|---|---|---|---|---|
| | RMS | Maximum | RMS | Maximum |
| 0.0 | 0.0033 | 0.0125 | 0.0053 | 0.0217 |
| 0.7 | 0.0034 | 0.0132 | 0.0053 | 0.0230 |
| 1.0 | 0.0035 | 0.0149 | 0.0057 | 0.0247 |

Figure 15:
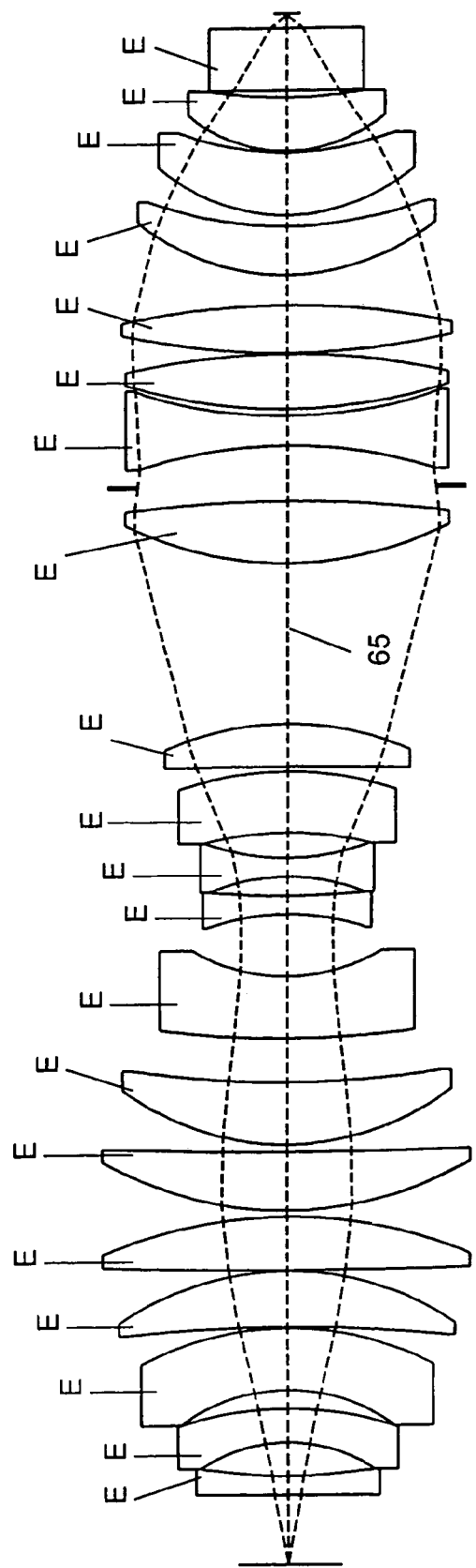
FIG. 15 is a schematic illustration of an exemplary large format, refractive projection lens.
Figures 17A, 17B:
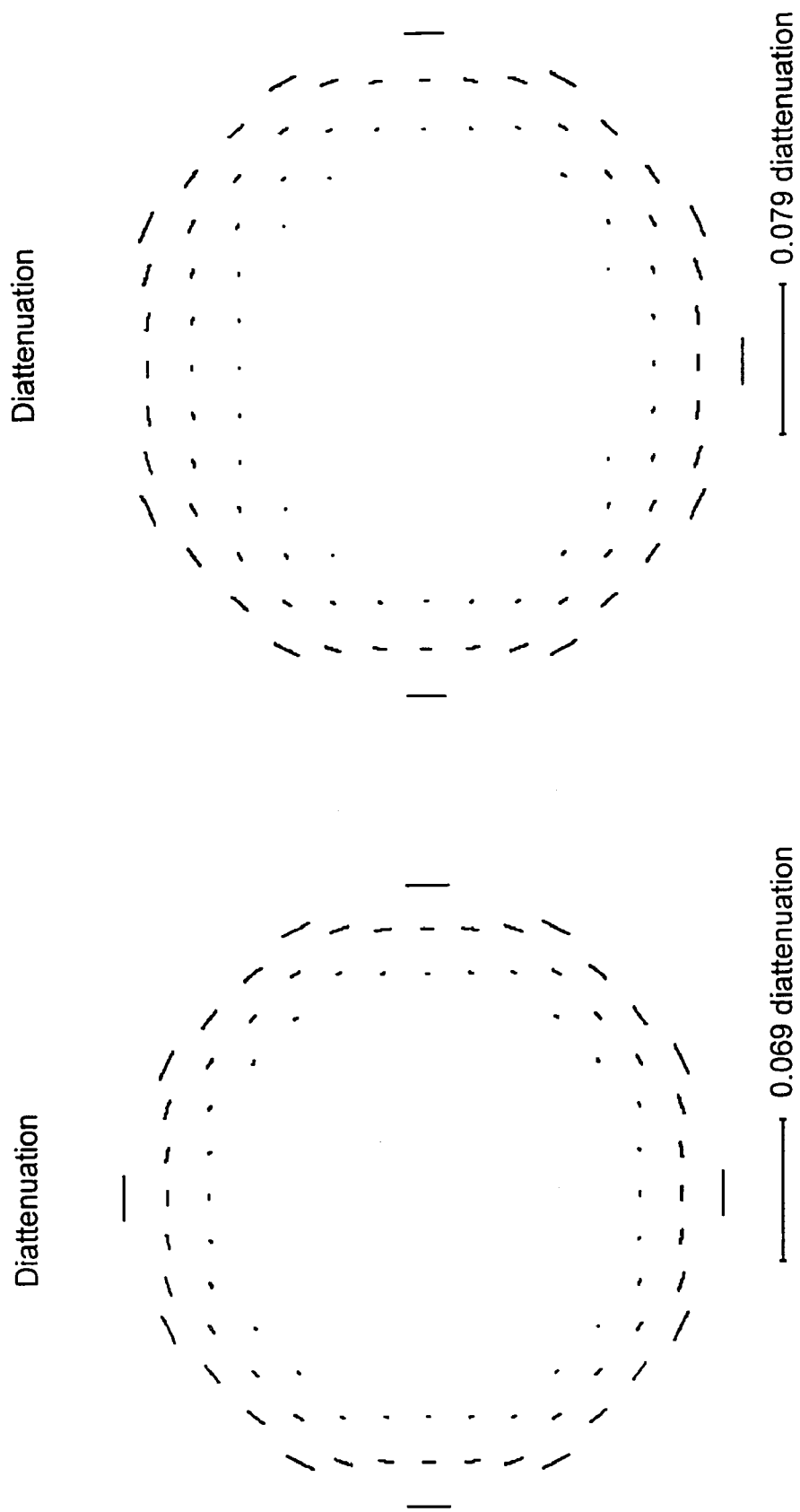
FIGS. 17A and 17B are graphical illustrations showing diattenuation across the pupil for the exemplary lens depicted in FIG. 15 at central and extreme field points, respectively, due to single-layer anti-reflection coatings.

FIGS. 17A and 17B show the diattenuation variation across the pupil for the center and edge of the field, respectively, for the optical system illustrated in FIG. 15. Diattenuation may be described as a measure of the maximum difference in transmission between orthogonal polarization states.

The RMS and peak-to-valley wavefront error are listed in Table 2 below for the nominal design, without the effects of intrinsic birefringence. The wavefront errors are given for relative field heights of 0, 0.7, and 1.0 in the Y direction, and are listed for two orthogonal polarization components. The X component represents the wavefront error for an input polarization in the X direction assuming a linear polarizer along the X direction at the system exit pupil. The Y component represents the wavefront error for an input polarization in the Y direction assuming a linear polarizer along the Y direction at the exit pupil. As shown, the nominal design includes a peak RMS wavefront error of about 0.003 waves.

TABLE 2

| Relative Field Height | RMS Wavefront Error (waves at $\lambda_o$ = 193.3 nm) | | Peak-to-Valley Wavefront Error (waves at $\lambda_o$ = 193.3 nm) | |
|---|---|---|---|---|
| | X Component | Y Component | X Component | Y Component |
| 0.0 | 0.002 | 0.002 | 0.012 | 0.012 |
| 0.7 | 0.003 | 0.002 | 0.020 | 0.020 |
| 1.0 | 0.003 | 0.002 | 0.018 | 0.012 |

Figure 18B:
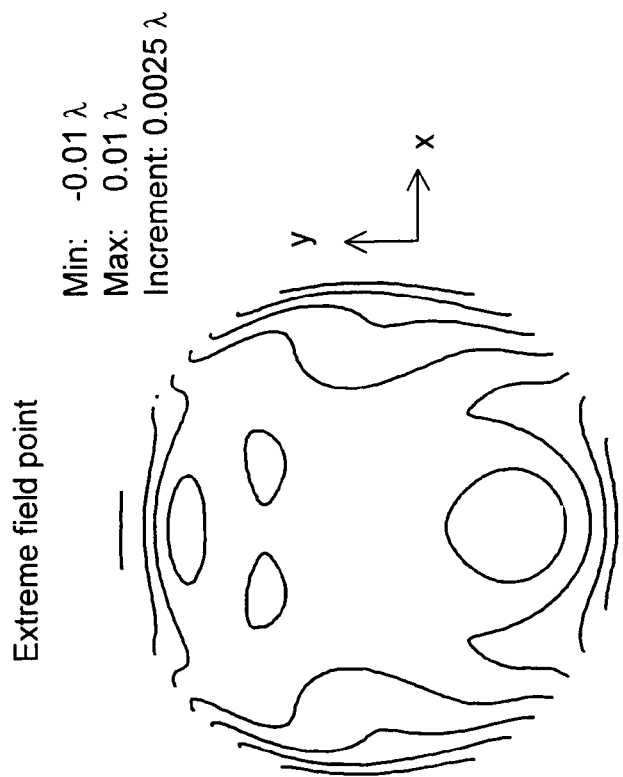
FIGS. 18A, 18B, 18C, and 18D are contour plots showing the residual wavefront error for the exemplary lens depicted in FIG. 15.
Figure 18A:
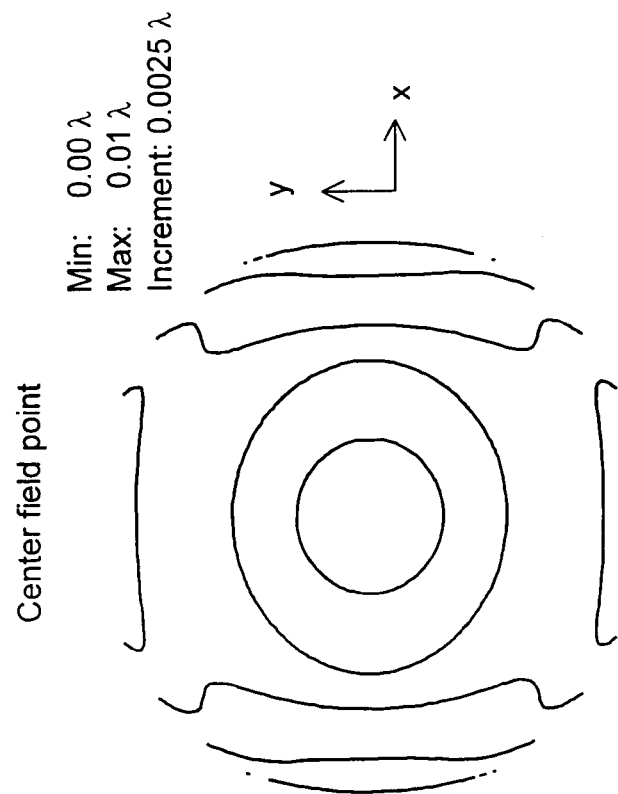
Figure 18D:
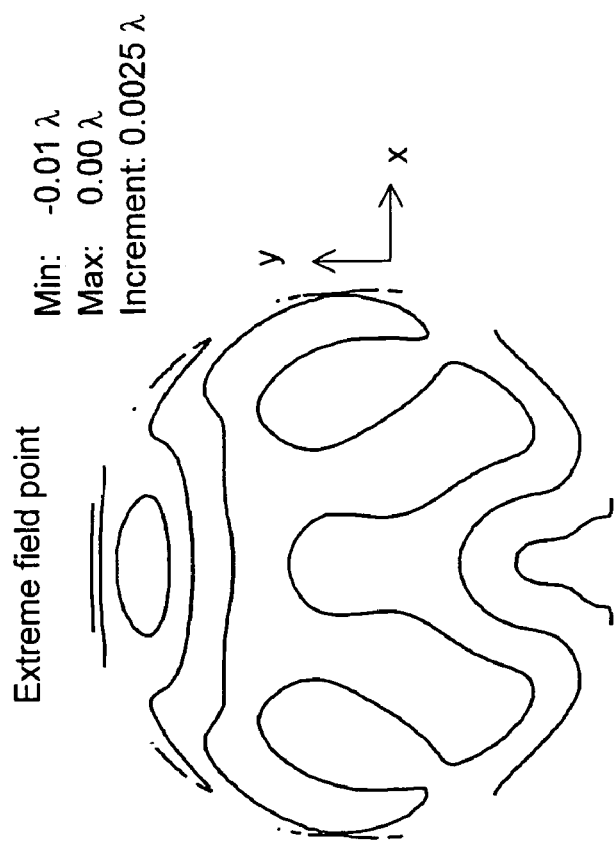
Figure 18C:
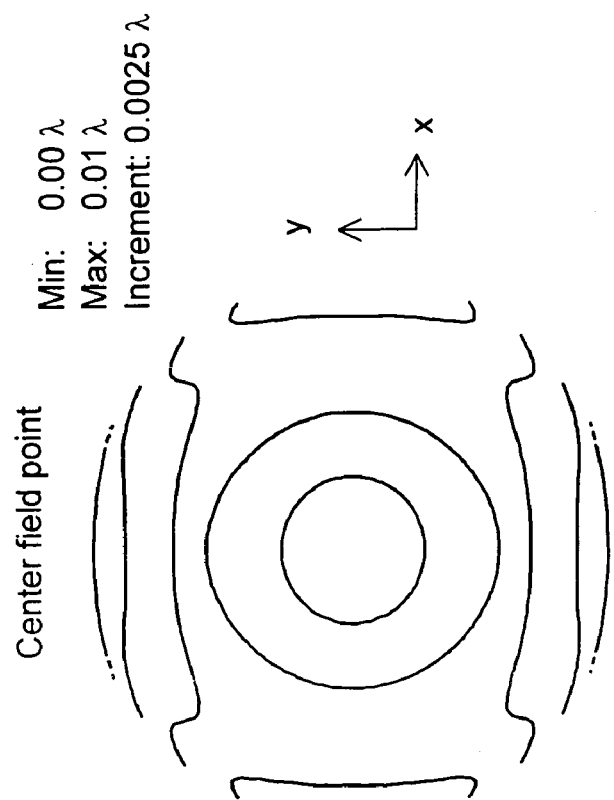

In FIGS. 18A, 18B, 18C, and 18D, wavefront errors at a wavelength of 193.3 nm are plotted at the system exit pupil as contour maps. FIGS. 18A and 18B show contour plots of the residual wavefront error for the lens depicted in FIG. 15 corresponding to an input polarization in the X direction (perpendicular to the field height) used with an exit pupil analyzer in the X direction for the central and extreme field points, respectively. For the wavefront error at the central field point shown in FIG. 18A, the maximum peak-to-valley optical path difference is 0.012 waves, and for the wavefront error at the extreme field shown in FIG. 18B, the maximum peak-to-valley optical path difference is approximately 0.018 waves. FIGS. 18C and 18D show contour plots of the residual wavefront error for the lens depicted in FIG. 15 corresponding to an input polarization in the Y direction (parallel to the field height) used with an exit pupil analyzer in the Y direction for the central and extreme field points, respectively. For the wavefront error at each of the central and extreme field points shown in FIGS. 18C and 18D, respectively, the maximum peak-to-valley optical path difference is approximately 0.012 waves.

The centroid distortion for the nominal design, calculated based on the point spread function, and the telecentricity error in the Y direction are listed in Table 3 below at relative field heights of 0, 0.7, and 1.0.

TABLE 3

| Relative Field Height | X PSF Centroid Distortion (nm) | Y PSF Centroid Distortion (nm) | Y Telecentricity Error (mrad) |
|---|---|---|---|
| 0.0 | 0.00 | 0.00 | 0.00 |
| 0.7 | 0.00 | 4.06 | 0.28 |
| 1.0 | 0.00 | 3.45 | 1.28 |

Figure 19B:
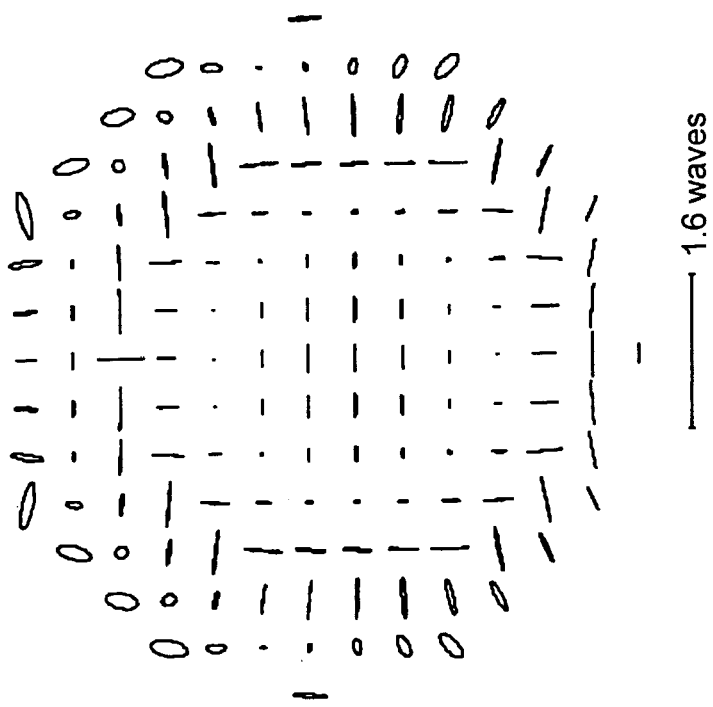
FIGS. 19A and 19B are graphical illustrations showing retardance across the pupil for the exemplary lens depicted in FIG. 15 at central and extreme field points, respectively, in which all elements are cubic crystals identically aligned in three dimensions, with the optical axis extending along the [110] crystal lattice direction and a peak birefringence magnitude corresponding to that of calcium fluoride at a wavelength of 157 nm.
Figure 19A:
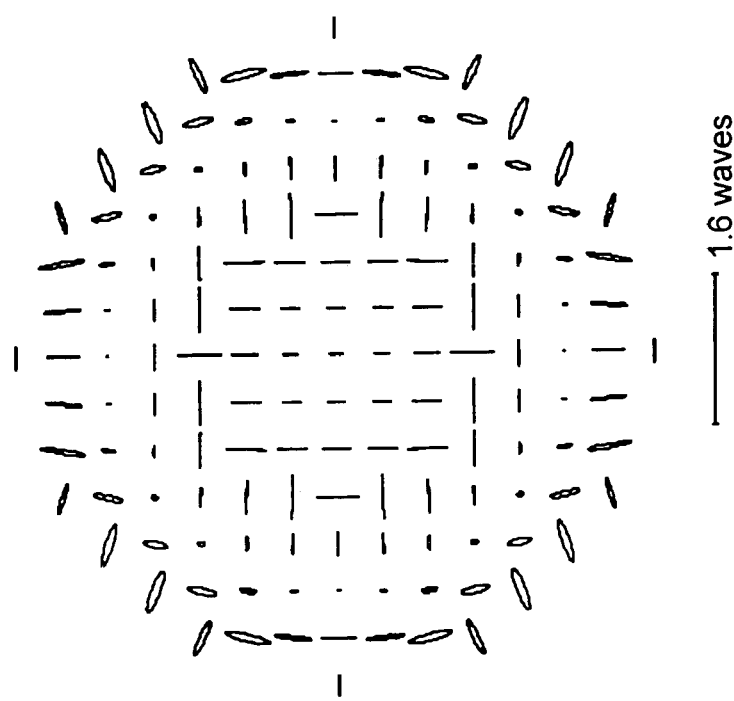

When the effects of intrinsic birefringence associated with the cubic crystalline lens material are taken into account, system performance degrades significantly. FIGS. 19A and 19B are graphical illustrations showing the net retardance across the system exit pupil for field points at the center and edge of the field, respectively, according to the arbitrarily designated exemplary embodiment in which all lens elements E, shown in FIG. 15, are identically aligned in three dimensions, with the elements having their [110] crystal axis along optical axis 65. FIGS. 19A and 19B include the effects of intrinsic birefringence. The object field height in FIG. 19A is 0 mm and the object field height in FIG. 19B is 55 mm, corresponding to the center and edge field points, respectively. In the retardance pupil maps given in FIGS. 19A and 19B, and in others to follow in which the net retardance exceeds a magnitude of 0.5 waves, the retardance is plotted "modulo 0.5 waves." It can therefore be seen that the retardance orientation rotates by 90 degrees at one-half-wave intervals, i.e., the effect of a 0.75 wave retarder at 0 degrees is the same as a 0.25 wave retarder at 90 degrees. Thus, the peak retardance due to intrinsic birefringence in this exemplary arrangement is approximately 1.5 waves at a wavelength of 193.3 nanometers, with small variation with object field height.

Figure 20B:
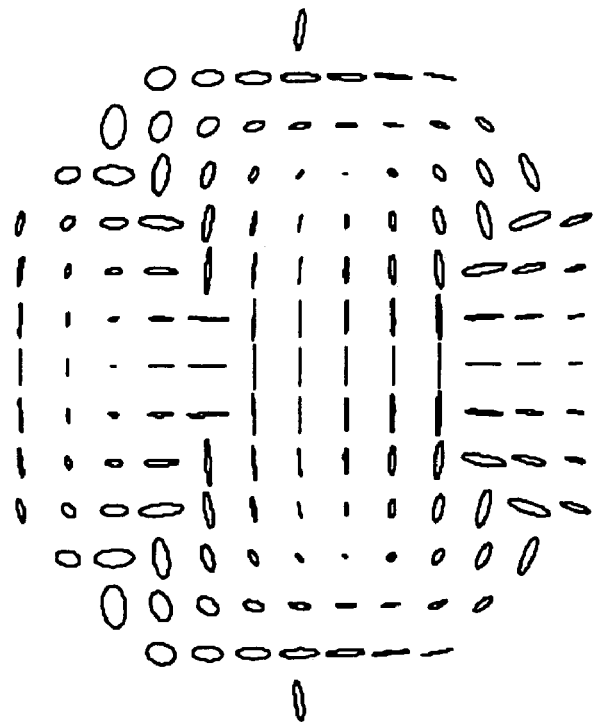
FIGS. 20A and 20B are graphical illustrations showing retardance across the pupil for the exemplary lens depicted in FIG. 15 at central and extreme field points, respectively, in which all elements are cubic crystals identically aligned in three dimensions, with the optical axis extending along the [100] crystal lattice direction and a peak birefringence magnitude corresponding to that of calcium fluoride at a wavelength of 157 nm.
Figure 20A:
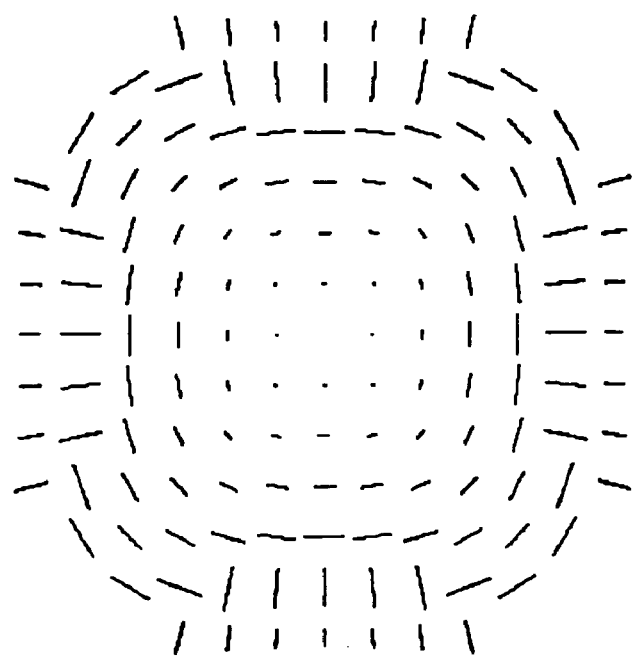

FIGS. 20A and 20B are graphical illustrations of the retardance of another exemplary embodiment of crystal lattice orientation of the lens system shown in FIG. 15. In FIGS. 20A and 20B, the net retardance across the system exit pupil, including the effects of intrinsic birefringence, is depicted for field points at the center and edge of the field with all elements arbitrarily aligned identically in three dimensions, with their [100] crystal axes along the optical axis. Again, the retardance orientation rotates by 90 degrees at one-half-wave intervals; thus, the peak retardance due to intrinsic birefringence in this example is approximately 0.9 waves at a wavelength of 193.3 nanometers.

Figure 21B:
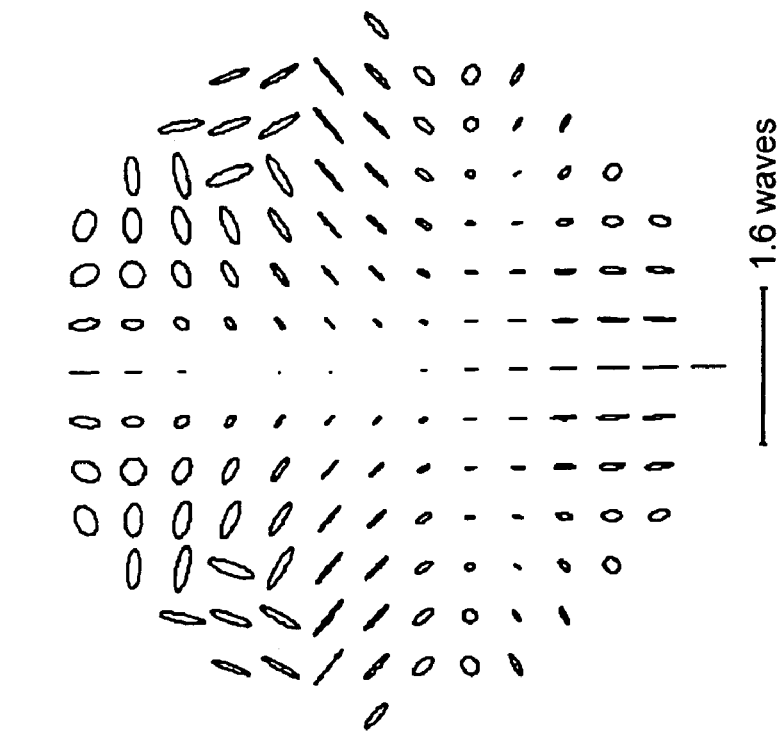
FIGS. 21A and 21B are graphical illustrations showing retardance across the pupil for the exemplary lens depicted in FIG. 15 at central and extreme field points, respectively, in which all elements are cubic crystals identically aligned in three dimensions, with the optical axis extending along the [111] crystal lattice direction and a peak birefringence magnitude corresponding to that of calcium fluoride at a wavelength of 157 nm.
Figure 21A:
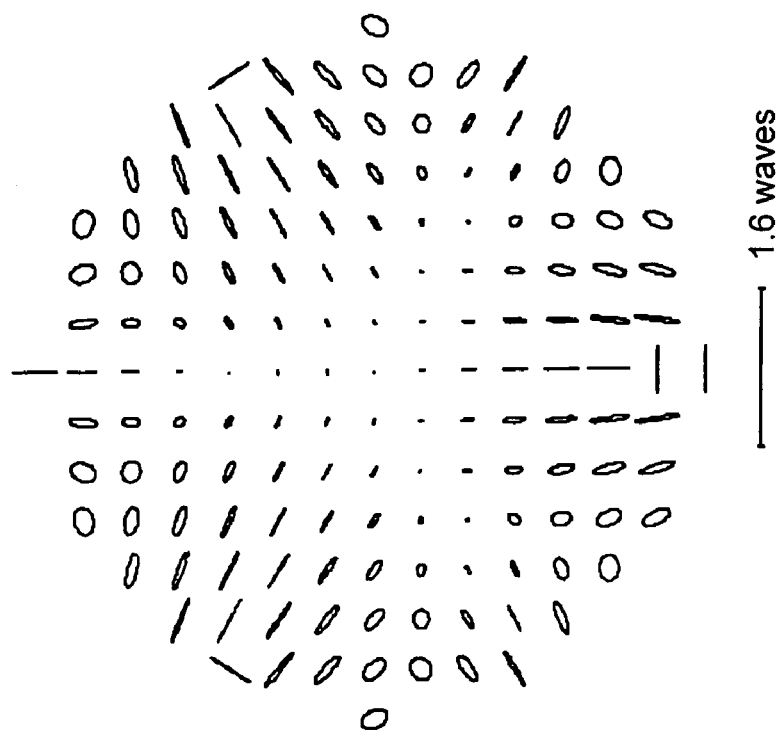

FIGS. 21A and 21B are graphical illustrations of the retardance of another exemplary embodiment of crystal lattice orientation of the lens system shown in FIG. 15. In FIGS. 21A and 21B, the net retardance across the system exit pupil is depicted for field points at the center and edge of the field with all elements arbitrarily aligned identically in three dimensions, for [111] optical elements. In this exemplary arrangement, the peak retardance due to intrinsic birefringence is approximately 0.5 waves at a wavelength of 193.3 nanometers, and the variation with field height is small.

Each of three preceding examples, as illustrated in FIGS. 19A–21C, shows that the intrinsic birefringence produces very large retardance aberrations and consequently large wavefront aberrations, when each of the elements are oriented identically with respect to the optical axis. Without compensation, this aberration strongly exceeds the allowable wavefront error for photolithography.

In the present embodiment of the present invention, the variables used for compensation of the retardance produced by the intrinsic birefringence described above are the orientations of the crystal axis for each element with respect to the optical axis and the relative rotations of those elements about the optical axis. The rotation of a lens element with rotationally symmetric surfaces about its optical axis is sometimes referred to as element 'clocking.'

One aspect of the present invention is the use of at least two [110] optical elements and at least one [100] optical element aligned along an optical axis. This allows the retardance contributions of the individual elements to be balanced to provide wavefront correction and reduce the net retardance produced by the intrinsic birefringence to a level that is acceptable for high numerical aperture lithography systems. This was described in the first embodiment and is also applicable to embodiment 3, as will be shown.

Figure 22:
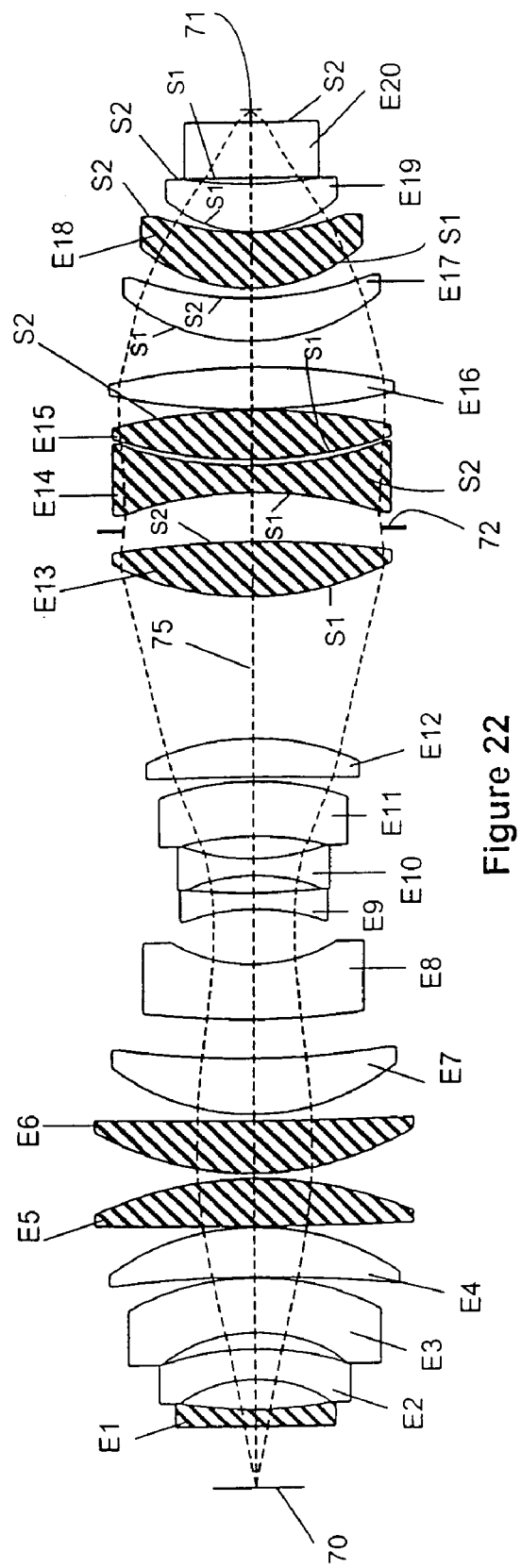
FIG. 22 is a schematic illustration showing the exemplary lens depicted in FIG. 15, with the crystal axes of the elements selected and oriented to compensate for intrinsic birefringence, in which the hatched elements are [100] cubic crystalline optical elements and all others are [110] cubic crystal optical elements.

FIG. 22 shows the third embodiment of the present invention as applied to the optical system previously shown in FIG. 15. FIG. 22 is a schematic, side view of the lens. In this embodiment, elements E1, E5, E6, E13, E14, E15, and E18, numbered with respect to the object plane 70, are aligned with their [100] crystal axes along optical axis 75, and all other elements E are aligned with their [110] crystal axes along optical axis 75. In FIG. 22, each of the [100] optical elements (E1, E5, E6, E13, E14, E15 and E18) is hatched.

The directions of the crystal lattices and clockings of each of the components are given in Table 4 below for the third exemplary embodiment. For [110] optical elements oriented with their [110] optical axis along optical axis 75, the clocking of each element is given relative to an orientation that produces peak birefringence along the optical axis that is oriented with the retardance axis substantially parallel to the X axis (horizontal, in the direction perpendicular to the specified field of view). For [100] optical elements oriented with their [100] crystal axis along optical axis 75, the clocking of each element is given relative to an orientation that produces peak birefringence lobes in the X-Z and Y-Z planes (at radial angles of 0, 90, 180, and 270 degrees). It should be understood that such is exemplary only and the relative clocking of the elements may be described with respect to any of various arbitrary reference locations.

TABLE 4

| Element | Crystal Axis along Optical Axis | Element Clocking (degrees) |
|---|---|---|
| E1 | [100] | 14.20 |
| E2 | [110] | −45.84 |

TABLE 4-continued

| Element | Crystal Axis along Optical Axis | Element Clocking (degrees) |
|---|---|---|
| E3 | [110] | 35.47 |
| E4 | [110] | −52.88 |
| E5 | [100] | 28.30 |
| E6 | [100] | 28.69 |
| E7 | [110] | 72.03 |
| E8 | [110] | −28.62 |
| E9 | [110] | 63.44 |
| E10 | [110] | 5.06 |
| E11 | [110] | 79.87 |
| E12 | [110] | 5.73 |
| E13 | [100] | 30.26 |
| E13, Surface S2 | — | −52.00 |
| E14 | [100] | 10.01 |
| E15 | [100] | 15.09 |
| E16 | [110] | −26.15 |
| E17 | [110] | −105.71 |
| E18 | [100] | 1.69 |
| E19 | [110] | 145.51 |
| E20 | [110] | 35.55 |
| Image | — | 0.0000133 |

The net intrinsic birefringence of the system is significantly reduced as a result of the element orientation as shown in Table 4.

Another effect produced by intrinsic birefringence in the cubic crystal lattice is variation of the average index of refraction as a function of ray angle through the cubic crystalline material. After compensation of the retardance errors resulting from intrinsic birefringence as above, the residual wavefront aberrations and distortion resulting from the variations in average index of refraction may desirably also be compensated. This variation in average index of refraction typically produces astigmatism in the wavefront and may result in distortion of the image that may be balanced in the optical design.

This distortion may include image shift, image rotation, magnification error, or higher order distortion. In this third exemplary embodiment, further modifications made to the optical design compensate for the effects of variations in average index of refraction. Surface S2 of element E13, the surface immediately preceding aperture stop 72, is non-rotationally symmetric or includes an asymmetric variation in curvature. In the exemplary embodiment, surface S2 of element E13 is a toroidal surface in which the radius of curvature in orthogonal directions varies along with the clocking of the surface. Table 5 shows that the radius of curvature for S2 in the local X direction differs from that in the local Y direction. The radii of curvature of the last seven surfaces are adjusted to balance residual distortion, and the image plane rotated to remove residual image rotation. The revised radii of curvature are listed in Table 5 below, and the image plane rotation is given in Table 4 above. Although the non-rotationally symmetric element is a [100] optical element in the exemplary embodiment, the toroidal or other non-rotationally symmetric surface may be used on other cubic crystalline or non-cubic crystalline optical elements in other exemplary embodiments. In various exemplary embodiments, an optical element may include a pair of surfaces that each have an asymmetric variation in curvature.

TABLE 5

| Surface | Radius of Curvature (mm) |
|---|---|
| E13, Surface S2, local X direction | −913.123746 |
| E13, Surface S2, local Y direction | −913.128860 |
| E17, Surface S1 | 179.985780 |
| E17, Surface S2 | 309.315227 |
| E18, Surface S1 | 150.015302 |
| E18, Surface S2 | 225.037081 |
| E19, Surface S1 | 114.371026 |
| E19, Surface S2 | 390.970966 |
| E20, Surface S1 | −7083.652132 |
| E20, Surface S2 | Infinite |

An aspect of the present invention is that the retardance compensation that may be achieved in a high-performance optical system is relatively insensitive to changes in ray angles through the components within the field of view. Referring to FIG. 4, the outer peak birefringence lobes are each at a 60° angle with respect to the [110] crystal axis. This angle is particularly large compared with the corresponding angles of 45° and 35.26° for the [100] and [111] crystal axes, respectively, also shown in FIG. 4. Thus, selecting the [110] crystal axis for a substantial number of components allows retardance correction over a large field of view.

Figure 23B:
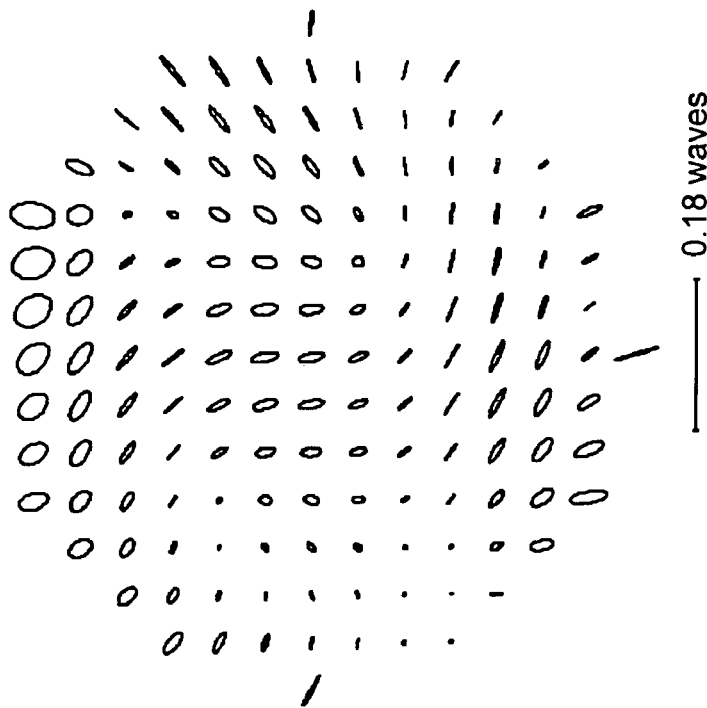
FIGS. 23A and 23B are graphical illustrations showing retardance across the pupil for the exemplary lens depicted in FIG. 22 at central and extreme field points, respectively, due to anti-reflection coatings and intrinsic birefringence of all elements.
Figure 23A:
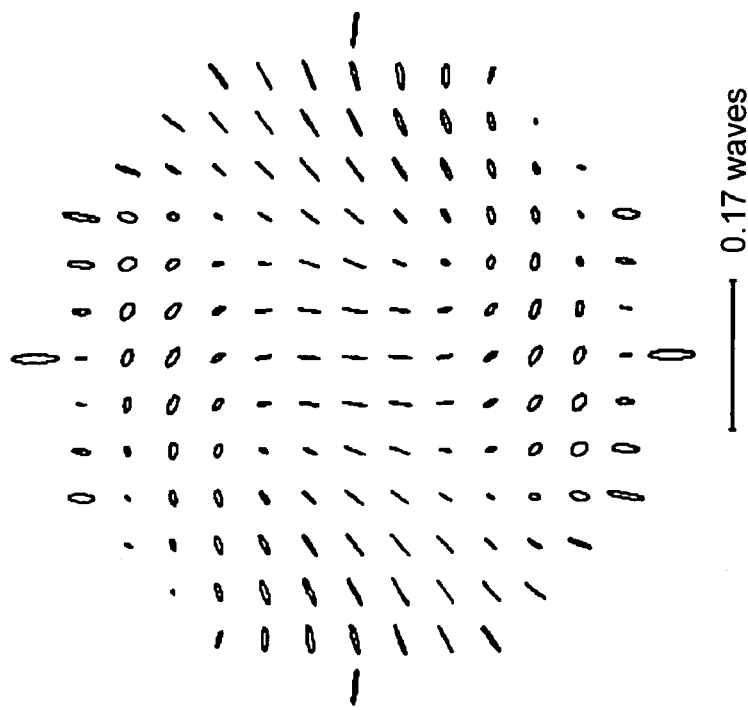

FIGS. 23A and 23B are graphical representations that depict the retardance across the system exit pupil for the compensated system detailed above and described in Tables 4 and 5. The retardance is caused by the intrinsic birefringence and anti-reflection coatings. As previously shown in FIGS. 16A and 16B, the contribution due the coatings is relatively small; thus, the bulk of the retardance aberration is due to the intrinsic birefringence. FIG. 23A shows retardance at the center field point and FIG. 23B shows retardance at the edge field point.

The RMS and maximum retardance over the exit pupil are listed in Table 6 below for relative field heights of 0, 0.7, and 1.0. These include the effects of intrinsic birefringence and the single layer anti-reflection coatings used in the model. A relative field height of 0.0 corresponds to the center field point shown graphically in FIG. 23A, and a relative field height of 1.0 corresponds to the edge field point shown graphically in FIG. 23B. The RMS retardance ranges from 0.0086 to 0.0105 waves at $\lambda_o$=193.3 nm.

TABLE 6

| | Retardance (waves at $\lambda_o$ = 193.3 nm) | |
|---|---|---|
| Relative Field Height | RMS | Maximum |
| 0.0 | 0.0086 | 0.0524 |
| 0.7 | 0.0093 | 0.0529 |
| 1.0 | 0.0105 | 0.0597 |

The RMS and peak-to-valley wavefront error for the exemplary corrected system of the third embodiment are listed in Table 7 below for the compensated design that includes the effects of intrinsic birefringence. These data are shown graphically for relative field heights of 0.0 and 1.0 in FIGS. 23A and 23B, respectively. The wavefront errors are given for relative field heights of 0, 0.7, and 1.0 in the Y direction, and are listed for two orthogonal polarization components. The X component represents the wavefront error for an input polarization in the X direction assuming a linear polarizer along the X direction at the system exit pupil. The Y component represents the wavefront error for an input polarization in the Y direction assuming a linear polarizer along the Y direction at the exit pupil. With the effects of intrinsic birefringence included, an RMS wavefront error that varies from 0.008 to 0.010 waves across the field has been achieved due to the correction technique. The peak-to-valley wavefront error has been reduced by a factor of about 27, compared with alignment of all elements along the [110] lattice direction. Thus, this embodiment demonstrates that intrinsic birefringence effects can be reduced to a level acceptable for high numerical aperture lithography.

TABLE 7

| Relative Field Height | RMS Wavefront Error (waves at $\lambda_o$ = 193.3 nm) | | Peak-to-Valley Wavefront Error (waves at $\lambda_o$ = 193.3 nm) | |
| --- | --- | --- | --- | --- |
| | X Component | Y Component | X Component | Y Component |
| 0.0 | 0.009 | 0.010 | 0.057 | 0.041 |
| 0.7 | 0.008 | 0.009 | 0.056 | 0.046 |
| 1.0 | 0.008 | 0.010 | 0.051 | 0.055 |

Figure 24B:
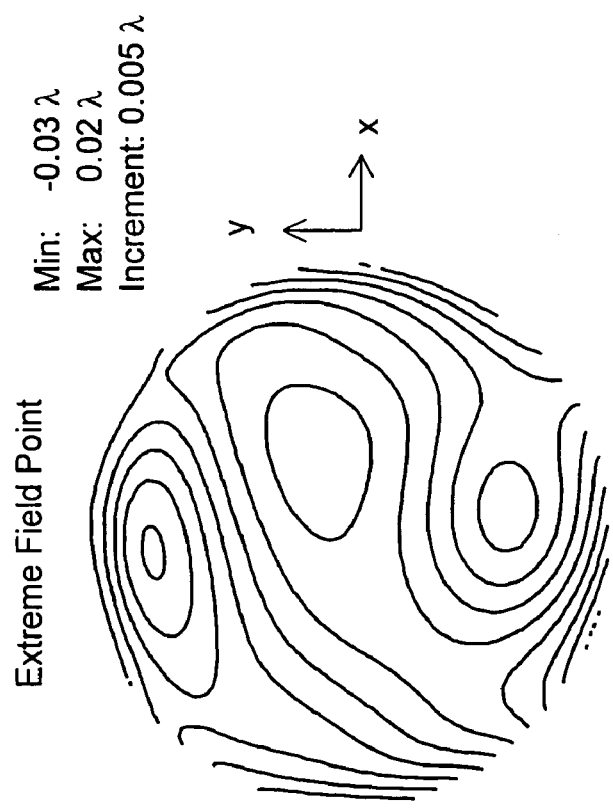
FIGS. 24A, 24B, 24C, and 24D are contour plots showing the residual wavefront error for the exemplary lens depicted in FIG. 22.
Figure 24A:
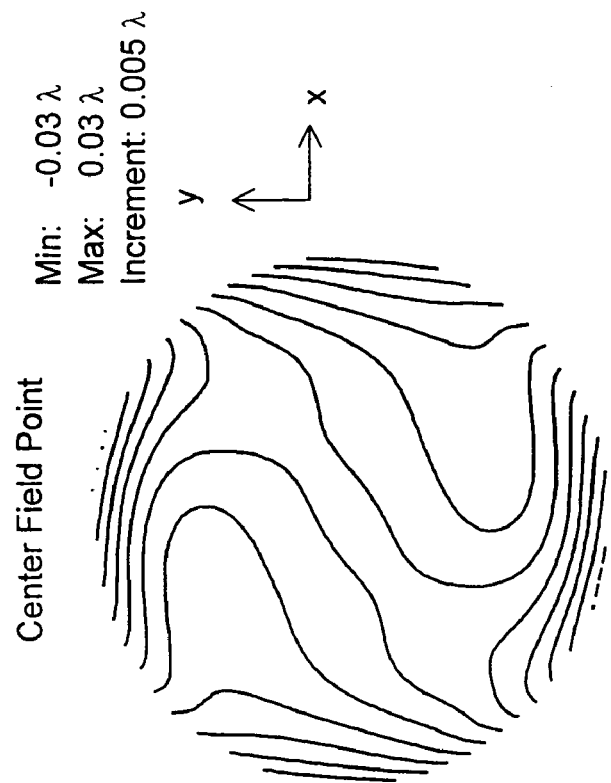
Figure 24D:
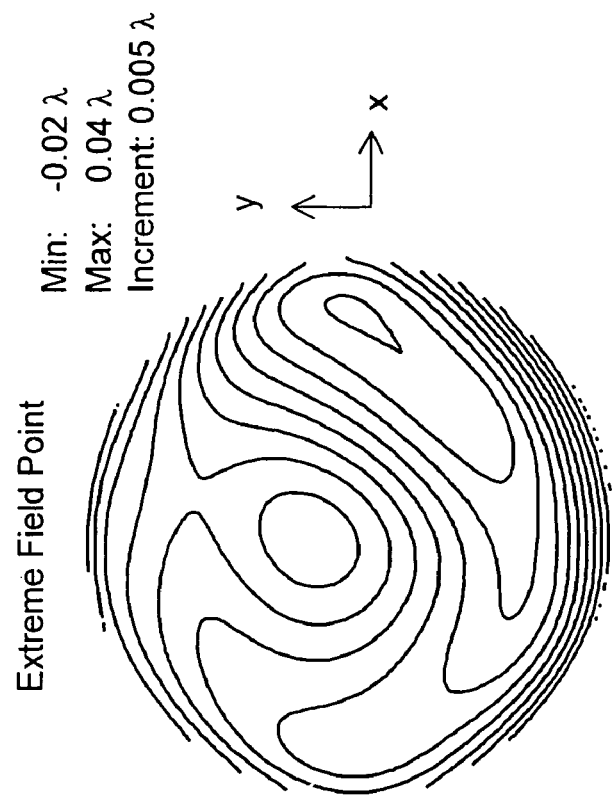
Figure 24C:
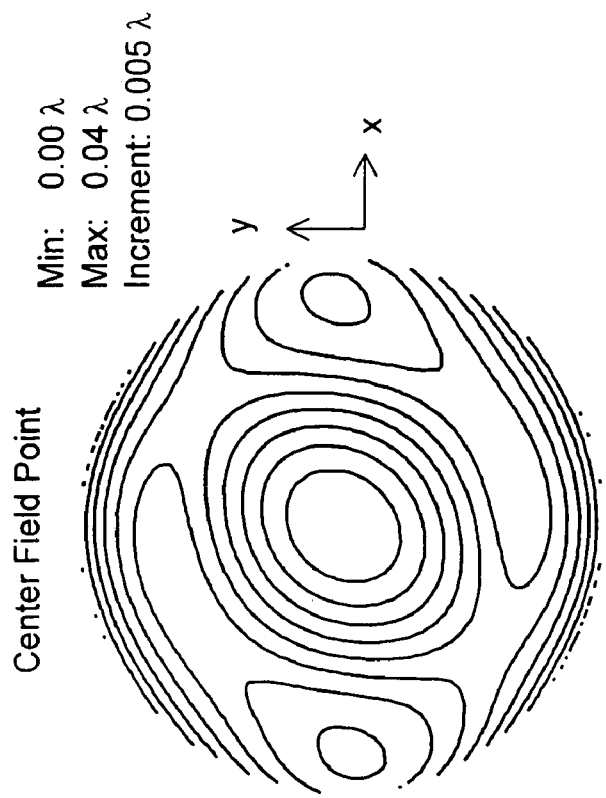

FIGS. 24A, 24B, 24C, and 24D show wavefront errors plotted at the system exit pupil as contour maps. FIGS. 24A and 24B show contour plots of the residual wavefront error for the exemplary lens depicted in FIG. 22 corresponding to an input polarization in the X direction (perpendicular to the field height) used with an exit pupil analyzer in the X direction for the central and extreme field points, respectively. For the wavefront error at the central field point shown in FIG. 24A, the maximum peak-to-valley optical path difference is approximately 0.057 waves at a wavelength of 193.3 nanometers, and for wavefront error at the at the extreme field shown in FIG. 24B, the maximum peak-to-valley optical path difference is approximately 0.051 waves. FIGS. 24C and 24D show contour plots of the residual wavefront error for the lens depicted in FIG. 22 corresponding to an input polarization in the Y direction (parallel to the field height) used with an exit pupil analyzer in the Y direction for the central and extreme field points, respectively. For the wavefront error at the central field point shown in FIG. 24C, the maximum peak-to-valley optical path difference is approximately 0.041 waves at a wavelength of 193.3 nanometers, and for the wavefront error at the extreme field shown in FIG. 24D, the maximum peak-to-valley optical path difference is approximately 0.055 waves.

The centroid distortion for the compensated design with intrinsic birefringence, calculated based on the point spread function, and the telecentricity error in the Y direction are listed at relative field heights of 0, 0.7, and 1.0 in Table 8 below. Telecentricity errors are deviations from normal incidence of the cone of rays at the image plane. As shown, the residual distortion in the X and Y directions is well within 0.1 nm, which is suitable for 157 nm lithography. The distortion has also been significantly reduced relative to distortion for the nominal design described in Table 3. Changes in telecentricity error from the nominal design are negligible.

TABLE 8

| Relative Field Height | X PSF Centroid Distortion (nm) | Y PSF Centroid Distortion (nm) | Y Telecentricity Error (mrad) |
| --- | --- | --- | --- |
| 0.0 | 0.00 | 0.00 | 0.00 |
| 0.7 | −0.06 | −0.05 | 0.28 |
| 1.0 | 0.08 | −0.05 | 1.28 |

Table 9 provides a summary of the performance of the design in terms of the Strehl ratio. The Strehl ratio describes the peak intensity of the point spread function relative to that of an aberration-free system. The effects of polarization and apodization are included in this calculation, as well as wavefront aberrations. At high numerical aperture, an aberration free optical system does not have a perfect Strehl ratio, a value of unity, due to variations in polarization resulting from interference of rays at large angles with respect to one another. In the present example, the Strehl ratio values are calculated at field points centered on the point-spread function, i.e., distortion effects were not considered.

Table 9 shows an aberration free system at 0.75 NA having a Strehl ratio of 0.8434. The performance of the nominal design without intrinsic birefringence effects is very similar to that of an ideal aberration free lens; the Strehl ratio differs over a range of −0.0004 to +0.0005 It is understood that the Strehl ratio may exceed that of a perfect is lens due to differences between physical and ideal lens models.

For the compensated system with intrinsic birefringence, the Strehl ratio is similar to that of the nominal design without considering the effects of intrinsic birefringence, and also similar to the ideal 0.75 NA aberration free system.

TABLE 9

| | Strehl Ratio | | |
| --- | --- | --- | --- |
| Design Layout | On-Axis Field | 70% Field | Extreme Field |
| Aberration-free lens (0.75 NA) | 0.8434 | 0.8434 | 0.8434 |
| Nominal, no birefringence considered | 0.8436 | 0.8439 | 0.8430 |
| Elements aligned to compensate | 0.8389 | 0.8377 | 0.8361 |

In summary, this third exemplary embodiment describes a lens with seven [100] optical elements and thirteen [110] optical elements. The relative clockings of the elements are given in Table 4. When used in a space in which the ray angles through the crystal are small with respect the optical axis, the retardance introduced by the component is small when the optical axis is along the [100] crystal axis of the material. Thus, such elements are generally insensitive to clocking, and it is possible to use the clocking of these components to compensate for manufacturing errors during fabrication, such as non-rotationally symmetrical defects. For example, the first six [100] optical elements may be varied in clocking without significant loss of performance, according to other exemplary embodiments. In another exemplary embodiment, the plurality of [100] optical elements may therefore be used to compensate for residual aberrations due to non-rotationally symmetric figure errors on the lens elements more easily than in a lens with more [110] and fewer [100] cubic crystalline elements.

EMBODIMENT 4

The fourth exemplary embodiment for application of the compensation techniques for intrinsic birefringence may be described in conjunction with another exemplary all-refractive projection lens. Such an exemplary lens may be used for photolithography and, in particular, may be used in the semiconductor manufacturing industry. Such an exemplary lens is provided in the seventh embodiment disclosed in European Patent No. 1 139 138 A1 to Y. Omura. This exemplary lens is depicted in FIG. 1. It is designed to operate at a central wavelength of 193.3 nanometers, provides 4× reduction at a numerical aperture of 0.75, and has an image field diameter of 27.5 mm. The design employs twenty-eight optical elements with three aspheric surfaces constructed from calcium fluoride and fused silica; however, each component is assumed to have an intrinsic birefringence of $-12 \times 10^{-7}$ in the following calculations used to illustrate the principles of the present invention. According to other exemplary embodiments, some of the lens elements may be formed of non-cubic crystalline material or additional lens elements formed of non-cubic crystalline material may be used. Various suitable non-cubic crystalline materials such as dry fused silica may be used.

RMS and maximum retardance and diattenuation over the exit pupil are listed in Table 10 for the nominal design without intrinsic birefringence effects included for relative field heights of 0, 0.7, and 1.0. The retardance and diattenuation result from the single-layer anti-reflection coatings used in the model.

TABLE 10

| Relative Field Height | Retardance (waves at $\lambda_o$ = 193.3 nm) | | Diattenuation | |
|---|---|---|---|---|
| | RMS | Maximum | RMS | Maximum |
| 0.0 | 0.0048 | 0.0177 | 0.0068 | 0.0273 |
| 0.7 | 0.0052 | 0.0202 | 0.0074 | 0.0296 |
| 1.0 | 0.0055 | 0.0239 | 0.0080 | 0.0358 |

Figure 25B:
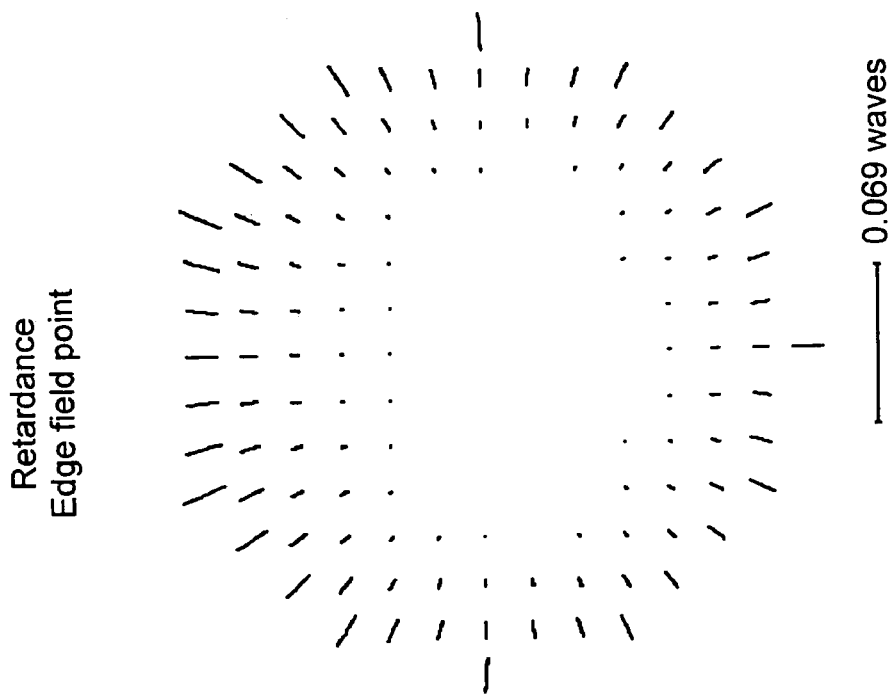
FIGS. 25A and 25B are graphical illustrations showing retardance across the pupil for the exemplary lens shown in FIG. 1 at central and extreme field points, respectively due to single-layer anti-reflection coatings.
Figure 25A:
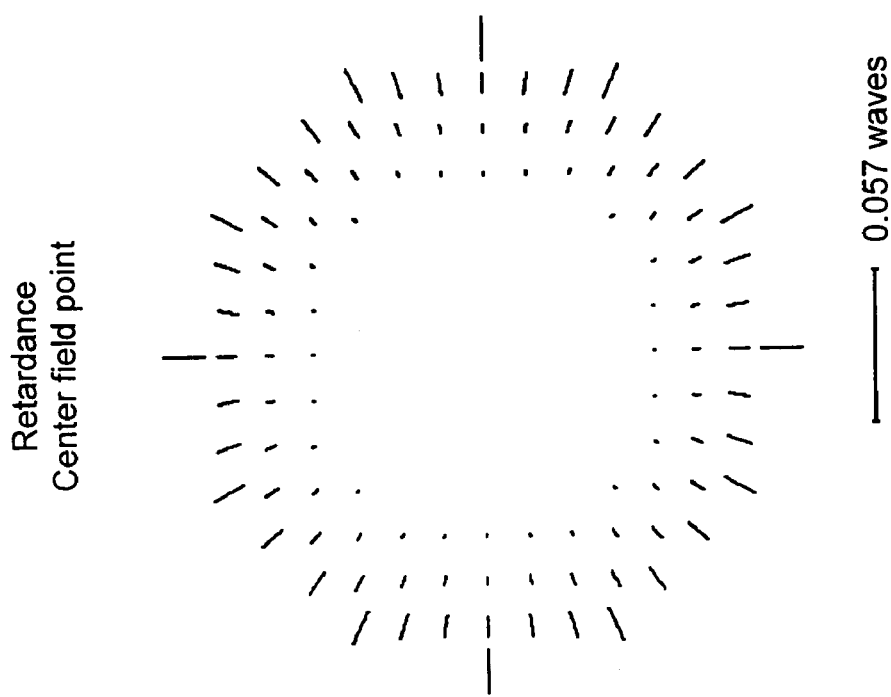

FIGS. 25A and 25B are graphical representations showing the retardance across the system exit pupil due to the anti-reflection coatings for the field points at the center and edge of the field, respectively. The retardance is radially-oriented and is largest in magnitude at the edge of the pupil. FIGS. 26A and 26B are graphical representations showing diattenuation variation across the pupil for the center and edge of the field, respectively.

Table 11 shows RMS and peak-to-valley wavefront error for the nominal design, without the effects of intrinsic birefringence. Wavefront errors are given for relative field heights of 0, 0.7, and 1.0 in the Y direction, and are listed for two orthogonal polarization components. The X component represents the wavefront error for an input polarization in the X direction assuming a linear polarizer along the X direction at the system exit pupil. The Y component represents the wavefront error for an input polarization in the Y direction assuming a linear polarizer along the Y direction at the exit pupil. Without cubic crystalline optical elements, or the effect of intrinsic birefringence considered, the nominal design includes a peak RMS wavefront error of 0.004 waves.

TABLE 11

| Relative Field Height | RMS Wavefront Error (waves at $\lambda_o$ = 193.3 nm) | | Peak-to-Valley Wavefront Error (waves at $\lambda_o$ = 193.3 nm) | |
|---|---|---|---|---|
| | X Component | Y Component | X Component | Y Component |
| 0.0 | 0.003 | 0.003 | 0.017 | 0.017 |
| 0.7 | 0.003 | 0.004 | 0.022 | 0.033 |
| 1.0 | 0.003 | 0.004 | 0.022 | 0.029 |

Figure 27B:
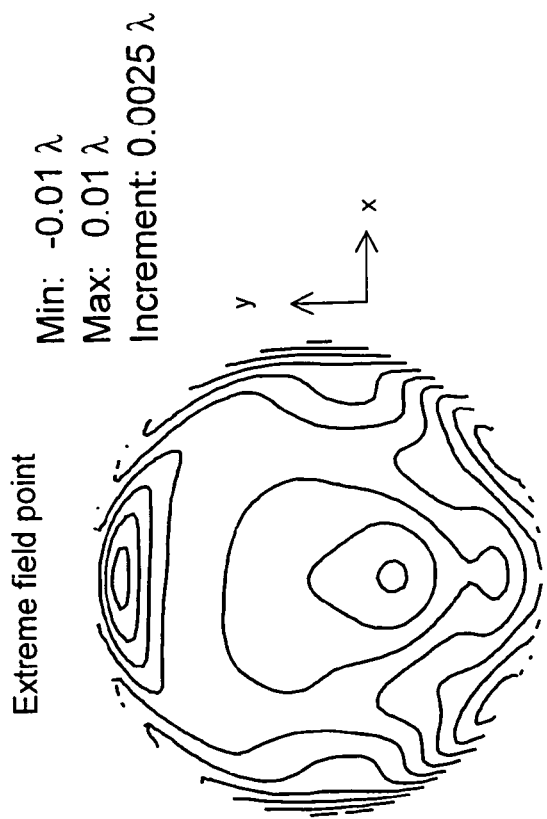
FIGS. 27A, 27B, 27C, and 27D are contour plots showing the residual wavefront error for the exemplary lens depicted in FIG. 1.
Figure 27A:
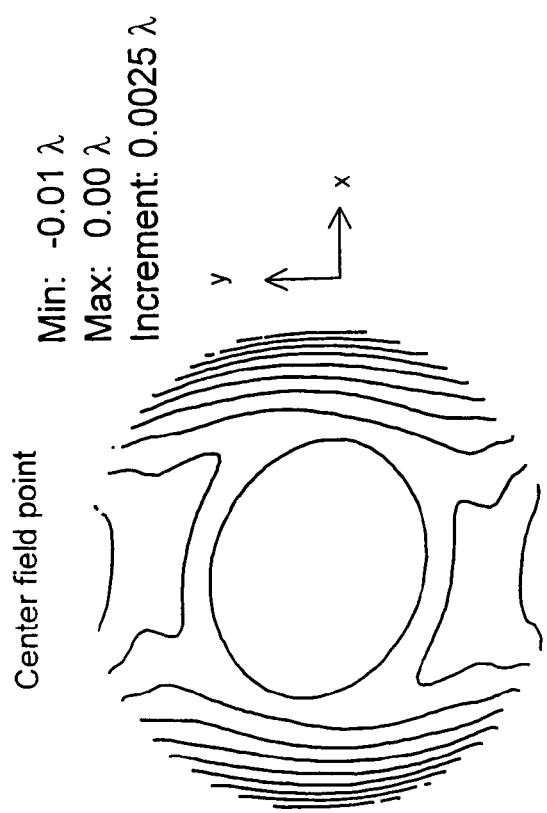
Figure 27D:
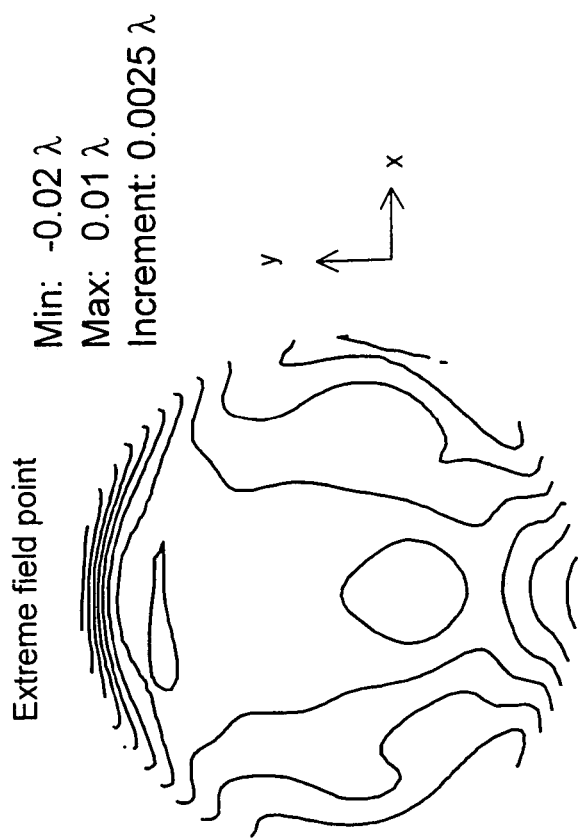
Figure 27C:
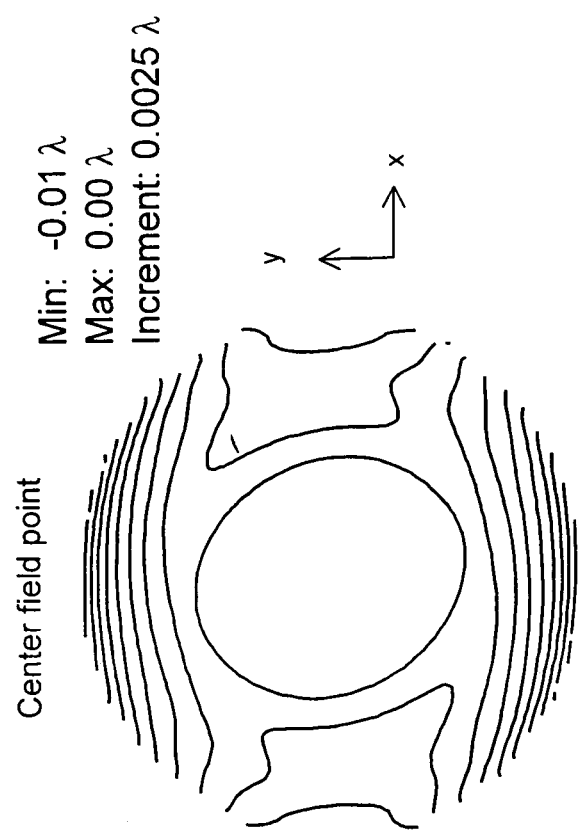

FIGS. 27A, 27B, 27C, and 27D show wavefront errors plotted at the system exit pupil as contour maps for the nominal design without intrinsic birefringence effects included. FIGS. 27A and 27B show contour plots of the residual wavefront error for the exemplary lens depicted in FIG. 1 corresponding to an input polarization in the X direction, perpendicular to the field height, used with an exit pupil analyzer in the X direction for the center and extreme field points, respectively. For the wavefront error at the central field point, the maximum peak-to-valley optical path difference is 0.017 waves at a wavelength of 193.3 nanometers, and for the wavefront error at the extreme field, the maximum peak-to-valley optical path difference is 0.022 waves. FIGS. 27C and 27D show contour plots of the residual wavefront error for the lens depicted in FIG. 1 corresponding to an input polarization in the Y direction, parallel to the field height, used with an exit pupil analyzer in the Y direction for the central and extreme field points, respectively. For the wavefront error at the central field point, the maximum peak-to-valley optical path difference is 0.017 waves at a wavelength of 193.3 nanometers, and for the wavefront error at the extreme field, the maximum peak-to-valley optical path difference is 0.029 waves.

Table 12 shows the centroid distortion for the nominal design, calculated based on the point spread function, and the telecentricity error in the Y direction at relative field heights of 0, 0.7, and 1.0.

TABLE 12

| Relative Field Height | X PSF Centroid Distortion (nm) | Y PSF Centroid Distortion (nm) | Y Telecentricity Error (mrad) |
|---|---|---|---|
| 0.0 | 0.00 | 0.00 | 0.00 |
| 0.7 | 0.00 | 7.70 | 0.11 |
| 1.0 | 0.00 | 10.70 | 0.51 |

Figure 28B:
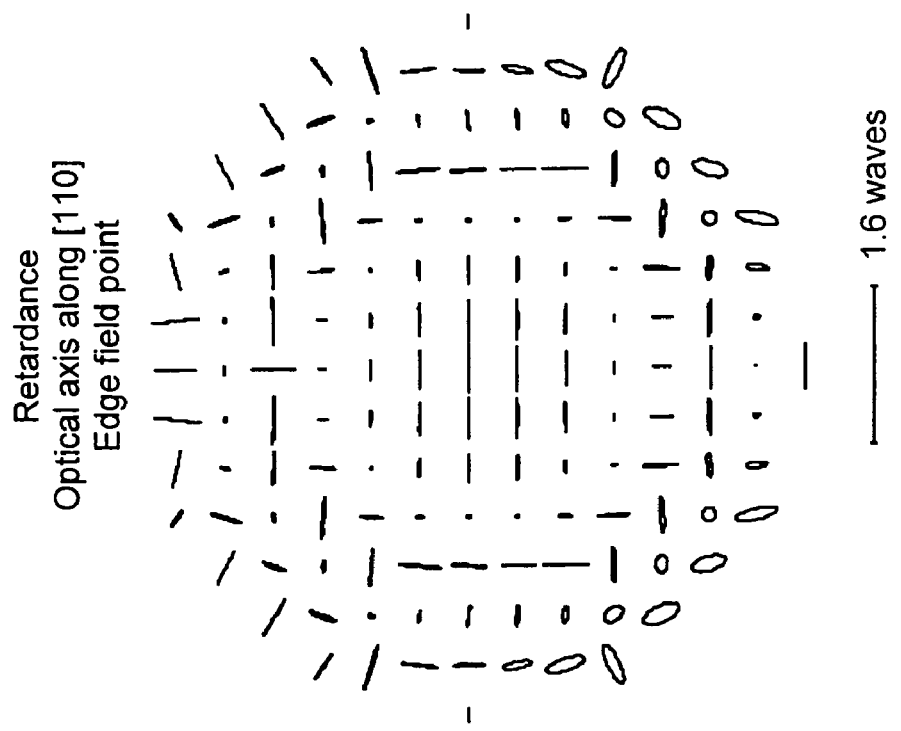
FIGS. 28A and 28B are graphical illustrations showing retardance across the pupil for the exemplary lens depicted in FIG. 1 at central and extreme field points, respectively, in which all elements are identically aligned in three dimensions, with their [110] crystal lattice direction along the optical axis and including a peak birefringence magnitude corresponding to that of calcium fluoride at a wavelength of 157 nm.
Figure 28A:
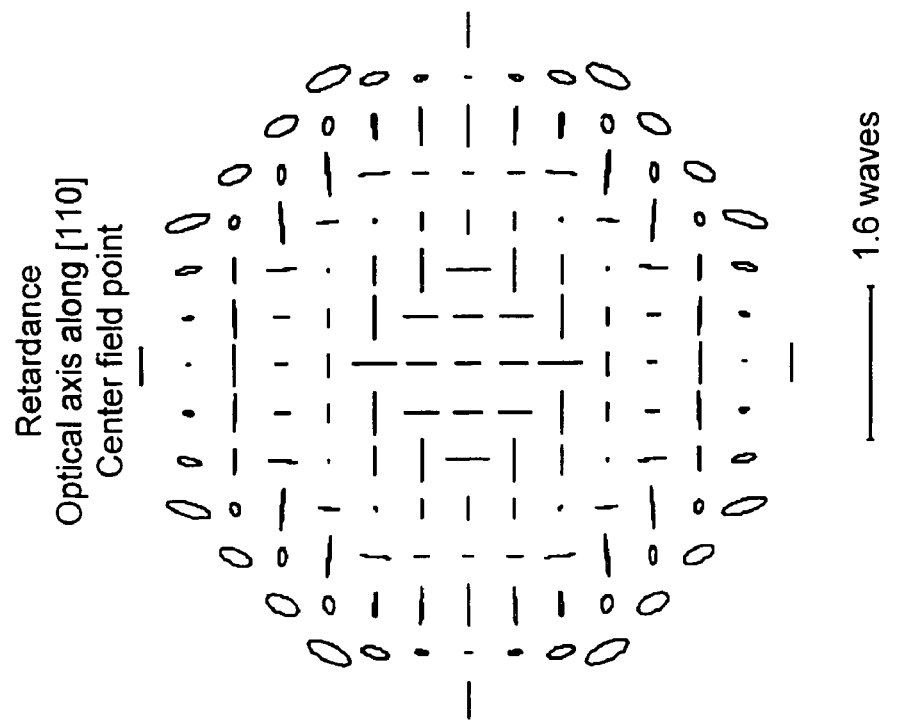

In an actual lens design using the lens prescription shown schematically in FIG. 1 and including cubic crystalline optical elements, intrinsic birefringence is included. With the effects of intrinsic birefringence included, performance degrades significantly. FIGS. 28A and 28B show the net retardance across the system exit pupil for field points at the center and edge of the field (at object field heights of 0 and 55 mm) according to an exemplary embodiment in which all elements are identically aligned in three dimensions, with element [110] crystal axes along optical axis 10. In these plots, the retardance orientation rotates by 90 degrees at one-half-wave intervals, i.e., the effect of a 0.75 wave retarder at 0 degrees is the same as a 0.25 wave retarder at 90 degrees. Thus, the peak retardance due to intrinsic birefringence in this example is approximately 2.1 waves at a wavelength of 193.3 nanometers.

FIGS. 29A and 29B show the net retardance across the system exit pupil for field points at the center and edge of the field, respectively, according to another exemplary arrangement in which all elements are identically aligned in three dimensions, with element [100] crystal axes along optical axis 10. Again, the retardance orientation rotates by 90 degrees at one-half-wave intervals; thus, the peak retardance due to intrinsic birefringence in this example is approximately 1.5 waves at a wavelength of 193.3 nanometers.

Figure 30B:
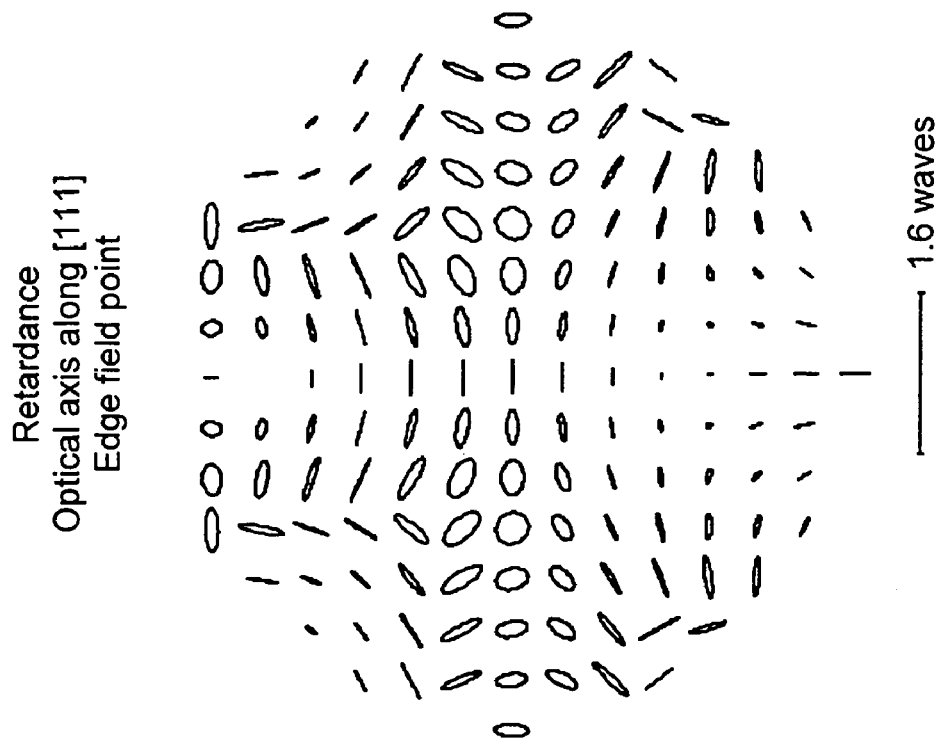
FIGS. 30A and 30B are graphical illustrations showing retardance across the pupil for the lens depicted in FIG. 1 at central and extreme field points, respectively, in which all elements are identically aligned in three dimensions, with their [111] crystal lattice direction along the optical axis and including a peak birefringence magnitude corresponding to that of calcium fluoride at a wavelength of 157 nm.
Figure 30A:
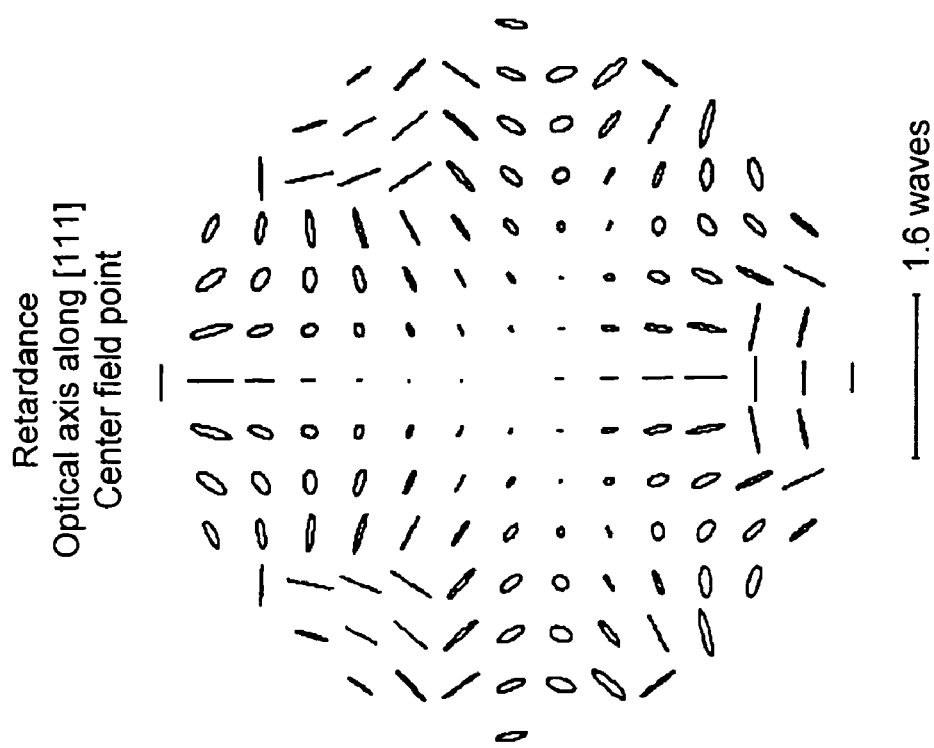

FIGS. 30A and 30B show the net retardance across the system exit pupil for field points at the center and edge of the field, respectively, according to another exemplary arrangement in which all elements are aligned identically in three dimensions, with element [111] crystal axes along optical axis 10. In this exemplary arrangement, the peak retardance due to intrinsic birefringence is approximately 0.8 waves at a wavelength of 193.3 nanometers.

With all elements aligned with their [110], [100], or [111] crystal axes along optical axis 10, and oriented identically in three dimensions, the retardance produced by intrinsic birefringence produces very large wavefront aberration. Without compensation, this aberration strongly exceeds the desirable wavefront error required for photolithography processes, particularly for photolithography processes used to produce the small feature sizes in today's semiconductor manufacturing industry.

Figure 31:
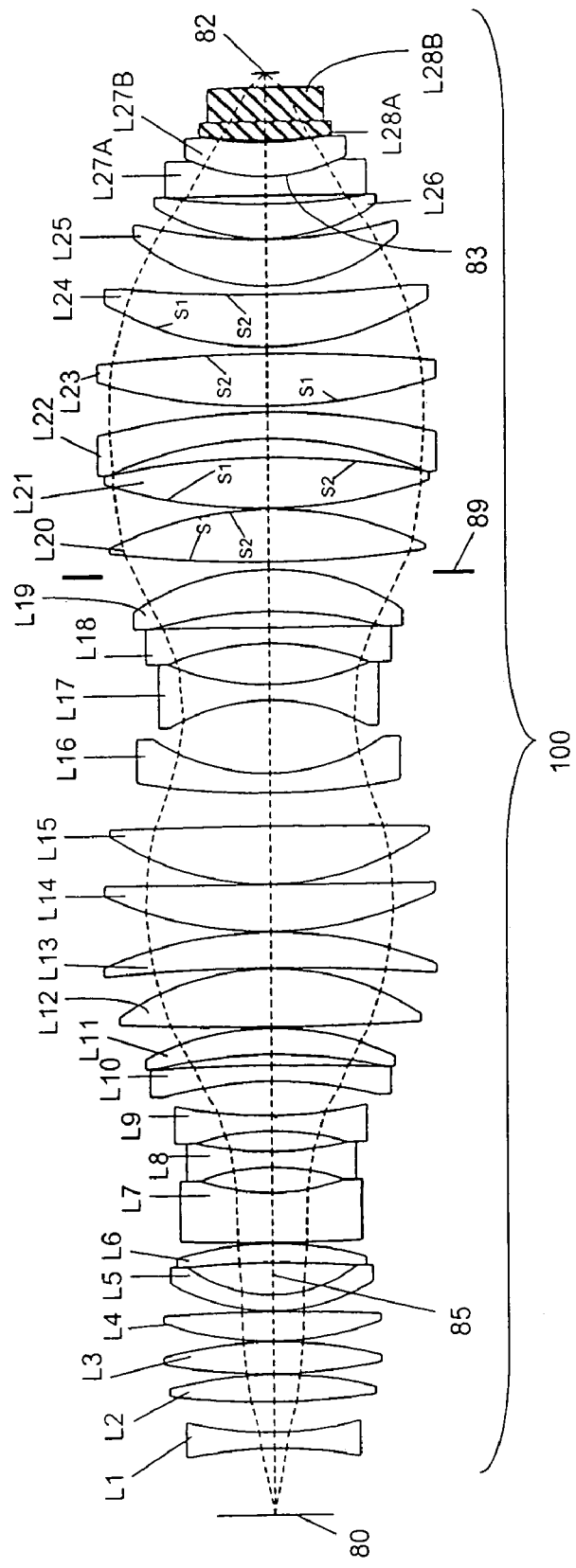
FIG. 31 is a schematic illustration showing the exemplary lens depicted in FIG. 1 with the last two elements split into two segments with different relative rotations about the optical axis and the crystal axes of the elements oriented to compensate for intrinsic birefringence, in which the hatched elements have their [100] crystal lattice direction along the optical axis and all others are oriented along with their [110] crystal lattice direction along the optical axis.

The fourth exemplary embodiment achieves compensation of the retardance produced by intrinsic birefringence by prescribing the orientations of the cubic crystal lattice for each element with respect to its optical axis, and the relative rotations of those elements about the optical axis to correct for intrinsic birefringence of the system. Furthermore in the fourth embodiment, as illustrated in FIG. 31, two of the elements of the exemplary lens system of FIG. 1 have each been split into two segments that have the same total thickness and power, with the thicknesses for the two segments and the curvature of the buried surface between them optimized to minimize the net system retardance. These additional degrees of freedom are shown to improve the achievable retardance compensation without requiring redesign of the lens.

According to the fourth embodiment, a combination of [110] optical elements and [100] optical elements is used to allow the retardance contributions of the individual elements to substantially cancel each other and provide an overall wavefront correction that is acceptable for high numerical aperture lithography systems.

FIG. 31 is a schematic side view of the improved lens. Lens 100 includes object plane 80, which may be a reticle or photomask, image plane 82, which may be a substrate upon which the image is formed, optical axis 85, and aperture stop, AS, 89. The [100] optical elements, L28A and L28B, are hatched. In this embodiment, all other elements L1–L27B are [110] optical elements aligned with their [110] crystal axes along optical axis 85.

The fourth embodiment provides a lens 100 shown in FIG. 31 that includes lens elements L1–L28B having crystal axes and clockings given in Table 13. For [110] optical elements, the clocking of each element is given relative to an orientation that produces peak birefringence along the optical axis that is oriented with the retardance axis substantially parallel to the X axis (horizontal, in the direction perpendicular to the specified field of view). For [100] optical elements, the clocking of each element is given relative to an orientation that produces peak birefringence lobes in the X-Z and Y-Z planes—at radial angles of 0, 90, 180, and 270 degrees.

TABLE 13

| Element | Crystal Axis along Optical Axis | Element Clocking (degrees) |
|---|---|---|
| L1 | [110] | 51.93 |
| L2 | [110] | −82.04 |
| L3 | [110] | −33.00 |
| L4 | [110] | 71.75 |
| L5 | [110] | −35.37 |
| L6 | [110] | 27.46 |
| L7 | [110] | 21.75 |
| L8 | [110] | −70.79 |
| L9 | [110] | −43.04 |
| L10 | [110] | −39.84 |
| L11 | [110] | 35.04 |
| L12 | [110] | −63.29 |
| L13 | [110] | 58.42 |

TABLE 13-continued

| Element | Crystal Axis along Optical Axis | Element Clocking (degrees) |
|---|---|---|
| L14 | [110] | −3.10 |
| L15 | [110] | 67.64 |
| L16 | [110] | 58.53 |
| L17 | [110] | 49.69 |
| L18 | [110] | 68.53 |
| L19 | [110] | 29.79 |
| L20 | [110] | −75.69 |
| L20, Surface 2 | Zernike Surface | −75.69 |
| L21 | [110] | −25.98 |
| L22 | [110] | 54.09 |
| L23 | [110] | 42.29 |
| L24 | [110] | 54.60 |
| L25 | [110] | −21.99 |
| L26 | [110] | 15.35 |
| L27A | [110] | −57.40 |
| L27B | [110] | 68.88 |
| L28A | [100] | 40.25 |
| L28B | [100] | 82.87 |
| Image | — | −0.00000199 |

The fourth exemplary embodiment illustrates another aspect of the present invention, namely, reducing intrinsic birefringence and retardance of a known lens system. This aspect of the present invention includes providing a given lens prescription having good optical qualities and including multiple individual lens elements. For this given lens prescription, at least one of the individual lens elements is replaced by, or split into, two or more sub-elements. The sub-elements each include the same overall radius of curvature and include the same thickness so that the overall optical qualities of the lens prescription are not adversely affected. For each individual element being replaced, the sub-elements are oriented to reduce net system retardance relative to the retardance correction achievable using the individual lens element which they combine to replace.

In one exemplary embodiment, each of the sub-elements may be aligned with the same crystal axis along the optical axis, and the sub-elements may be clocked relative to each other. For example, each of the sub-elements may be a [110] or [100] optical element. In another exemplary embodiment, the elements may include different crystal axes aligned along the optical axis, for example, a [100] optical element and a [110] optical element. This concept is illustrated by comparing lens 2 in FIG. 1 to lens 100 shown in FIG. 31. Lens 2 shown in FIG. 1 includes multiple lens elements, including lens elements L101 and L102. Lens 100 in FIG. 31 is substantially similar to lens 2 of FIG. 1, with the exception being that lens element L101 of FIG. 1 is replaced by two sub-elements—lens sub-elements L27A and L27B of FIG. 31, and lens element L102 of lens 2 in FIG. 1 is replaced by two lens sub-elements, namely, lens sub-elements L28A and L28B shown in FIG. 31.

Another effect produced by intrinsic birefringence in the cubic crystal lattice is variation of the average index of refraction as a function of ray angle through the crystal. In addition to compensating for retardance errors resulting from intrinsic birefringence, the present invention provides for correcting for residual wavefront aberrations and distortion resulting from the variations in average index of refraction. If uncorrected, this variation in average index of refraction may produce astigmatism in the wavefront and may result in distortion of the image. This distortion may include image shift, image rotation, magnification error, or higher order distortion.

As such, in the fourth embodiment, the optical design includes modifications, relative to lens 2 of FIG. 1, to compensate for the effects of variations in average index of refraction. Surface S2 of lens element L20, the right hand surface of the lens element immediately following aperture stop 89, includes a shape defined by Zernike polynomials as described below. The Zernike coefficients are adjusted to compensate for residual astigmatism. The Zernike coefficients may be used to adjust the surface shape of other elements and one or multiple surfaces with an asymmetric variation in curvature, may be utilized in other exemplary embodiments. Also, the radii of curvature of ten surfaces are adjusted to balance residual distortion, and image plane rotation is provided to remove residual image rotation. The resulting radii of curvature and Zernike surface coefficients, $C_j$, are listed in Table 14, and the image plane rotation is given in Table 13.

The Zernike polynomials, $Z_j$, are defined with respect to a circle with the normalization radius listed. Surface sag, $Z(x, y)$, the integral of which describes the surface, is described by the following equation:

$$Z(x, y) = \frac{c(x^2 + y^2)}{1 + \sqrt{1 - c^2(x^2 + y^2)}} + \sum_{j=1}^{4} C_j Z_j$$

where c is the curvature=1/(radius of curvature) and x and y are the Cartesian coordinates on the surface.

TABLE 14

| Surface | Radius of Curvature (mm) |
|---|---|
| L24, Surface S1 | 277.35519 |
| L24, Surface S2 | 1289.10376 |
| L25, Surface S1 | 179.54899 |
| L25, Surface S2 | 446.44705 |
| L26, Surface S1 | 182.12274 |
| L26, Surface S2 | 558.39223 |
| L27A, Surface S1 | −10831.04108 |
| L27A, Surface S2 | 154.82711 |
| L27B, Surface S1 | 154.82711 |
| L27B, Surface S2 | 322.35847 |
| L28A, Surface S1 | 399.66226 |
| L28A, Surface S2 | −2608.81885 |
| L28B, Surface S1 | −2608.81885 |
| L28B, Surface S2 | −1902.32780 |

| Parameter | Zernike Polynomial, $Z_j$ | Zernike Coefficient, $C_j$ |
|---|---|---|
| $C_1$ | $x^2 - y^2$ | $-1.7603 \times 10^{-6}$ |
| $C_2$ | $2xy$ | $-2.5077 \times 10^{-5}$ |
| $C_3$ | $[4(x^2 + y^2) - 3](x^2 - y^2)$ | $1.0700 \times 10^{-5}$ |
| $C_4$ | $2[4(x^2 + y^2) - 3]xy$ | $1.1000 \times 10^{-6}$ |
| Normalization Radius | — | 136.1 mm |

In summary, in the fourth embodiment, two elements—lens elements L101 and L102 of the exemplary lens prescription shown in FIG. 1, were each split into lens sub-elements L27A and L27B, and L28A and L28B, respectively, to provide improved retardance aberration correction. In each case, the radius of curvature of the buried surface produced between the two sub-elements and the thicknesses of the two sub-elements were varied, keeping the total element thickness fixed with respect to the original lens element. Stated alternatively, the combined thickness of lens sub-elements L28A and L28B of FIG. 31 is substantially the same as the thickness of lens element L102 of FIG. 1. Element L101 of FIG. 1 is split into two [110] optical sub-components L27A and L27B of FIG. 31 to provide fine adjustment of the compensation. The thickness and radius of curvature of buried surface 83 provide control over the retardance aberrations at the center and edge of the pupil. Element L102 of FIG. 1 is split into two [100] optical sub-components L28A and L28B of FIG. 31 to provide fine adjustment of the azimuthal compensation. Each [100] sub-component has the same birefringence as a function of ray angle with respect to the optical axis; only the azimuthal dependence varies with element clocking.

Table 15 lists the radii of curvature and thicknesses of the optical sub-elements produced by splitting components L101 and L102.

TABLE 15

| Element | Crystal Axis Direction for Zero Clocking | Element Clocking (degrees) | Front Radius of Curvature (mm) | Back Radius of Curvature (mm) | Thickness (mm) |
|---|---|---|---|---|---|
| L27A | [110] | −57.40 | −10831.04108 | 154.82711 | 17.96182 |
| L27B | [110] | 68.88 | 154.82711 | 322.35847 | 32.03818 |
| L28A | [100] | 40.25 | 399.66226 | −2608.81885 | 17.66426 |
| L28B | [100] | 82.87 | −2608.81885 | −1902.32780 | 32.33575 |

Figure 32B:
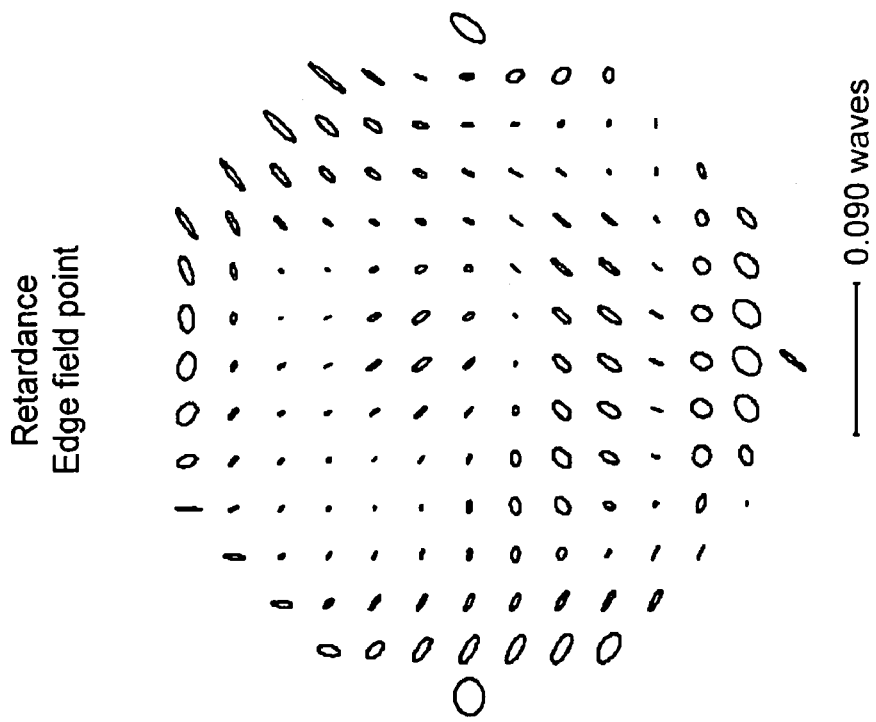
FIGS. 32A and 32B are graphical illustrations showing retardance across the pupil for the exemplary lens depicted in FIG. 31 at central and extreme field points, respectively, due to anti-reflection coatings and intrinsic birefringence of all elements.
Figure 32A:
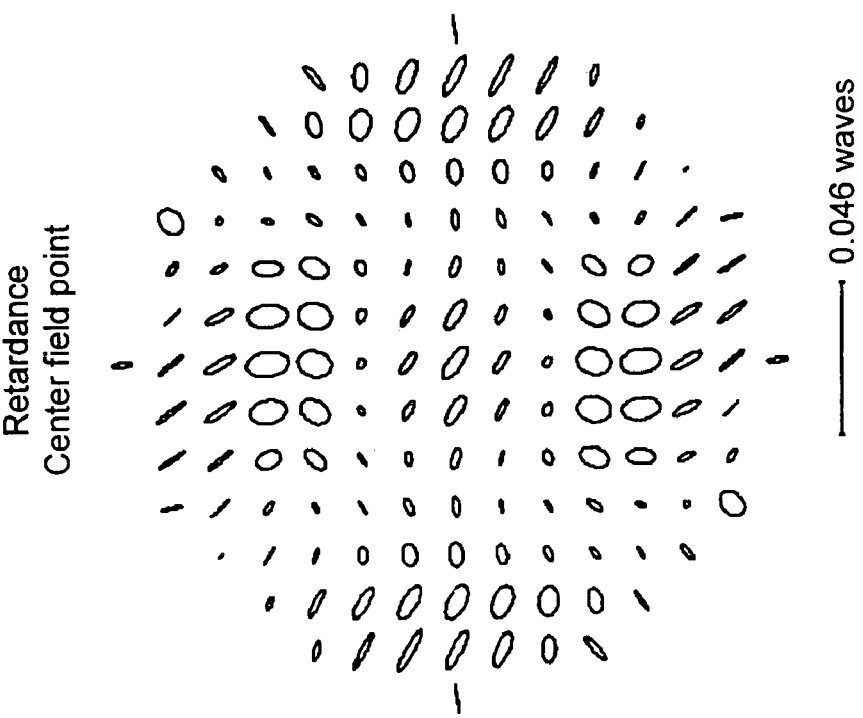

FIGS. 32A and 32B are graphical representations showing the retardance across the system exit pupil for the compensated system produced by the intrinsic birefringence and anti-reflection coatings for field points at the center and edge of the field, respectively. As shown in FIGS. 25A and 25B, the contribution due the coatings is the same order of magnitude as the maximum residual retardance aberrations; thus, the choice of coating can significant effect the system performance. A different coating design might require re-optimization of the lens to obtain best performance. In the uncompensated system, the contribution due the coatings is relatively small and the bulk of the retardance aberration is attributable to intrinsic birefringence.

RMS and maximum retardance over the exit pupil are listed in Table 16 for relative field heights of 0, 0.7, and 1.0. These include the effects of intrinsic birefringence and the single layer anti-reflection coatings. The RMS retardance ranges from 0.0029 to 0.0054 waves at $\lambda_o$=193.3 nm. The compensated system includes a retardance reduced in comparison to the 0.0048 to 0.0055 wave range in RMS retardance due to the anti-reflection coatings without intrinsic birefringence effects.

TABLE 16

| | Retardance (waves at $\lambda_o$ = 193.3 nm) | |
|---|---|---|
| Relative Field Height | RMS | Maximum |
| 0.0 | 0.0029 | 0.0144 |
| 0.7 | 0.0037 | 0.0266 |
| 1.0 | 0.0054 | 0.0326 |

The RMS and peak-to-valley wavefront error are listed in Table 17 for the compensated design that includes the effects of intrinsic birefringence. The wavefront errors are given for relative field heights of 0, 0.7, and 1.0 in the Y direction, and are listed for two orthogonal polarization components. The X component represents the wavefront error for an input polarization in the X direction assuming a linear polarizer along the X direction at the system exit pupil. The Y component represents the wavefront error for an input polarization in the Y direction assuming a linear polarizer along the Y direction at the exit pupil. An RMS wavefront error that varies from 0.003 to 0.007 waves across the field is achieved. The peak-to-valley wavefront error is reduced by a factor ranging from approximately 47 to 124, compared with exemplary lenses in which all elements are [110], [100], or [111] optical elements oriented substantially identically. Thus, this embodiment demonstrates that intrinsic birefringence effects can be reduced to a level acceptable for high numerical aperture lithography.

TABLE 17

| Relative Field Height | RMS Wavefront Error (waves at $\lambda_o$ = 193.3 nm) | | Peak-to-Valley Wavefront Error (waves at $\lambda_o$ = 193.3 nm) | |
|---|---|---|---|---|
| | X Component | Y Component | X Component | Y Component |
| 0.0 | 0.006 | 0.003 | 0.025 | 0.017 |
| 0.7 | 0.007 | 0.006 | 0.038 | 0.031 |
| 1.0 | 0.006 | 0.007 | 0.045 | 0.040 |

Figure 33B:
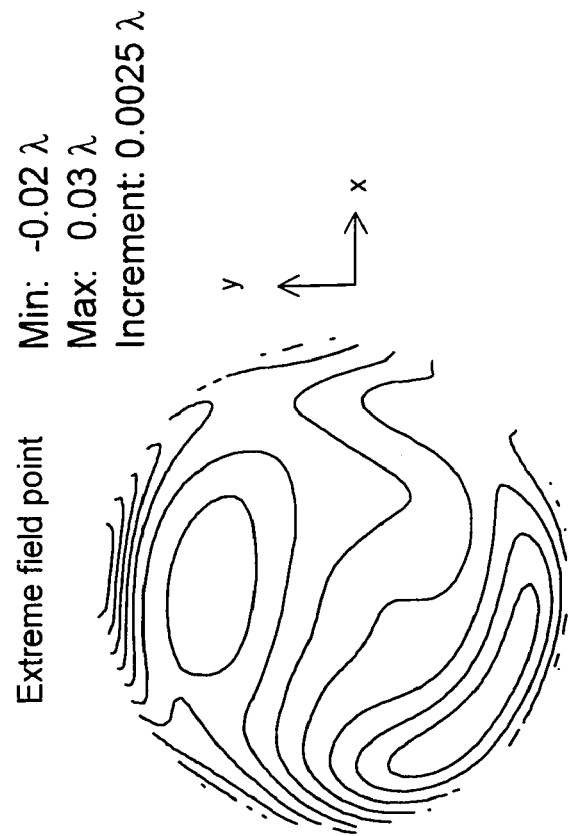
FIGS. 33A, 33B, 33C, and 33D are contour plots showing the residual wavefront error for the exemplary lens depicted in FIG. 31.
Figure 33A:
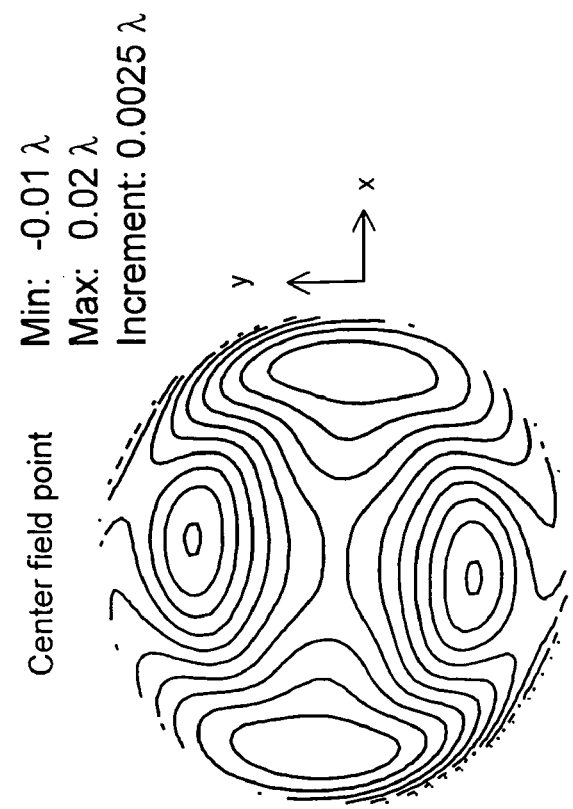
Figure 33D:
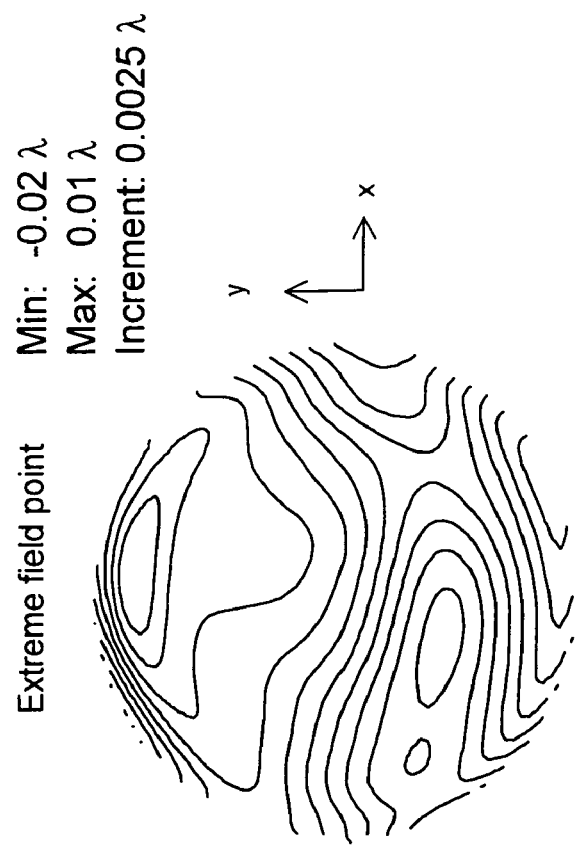
Figure 33C:
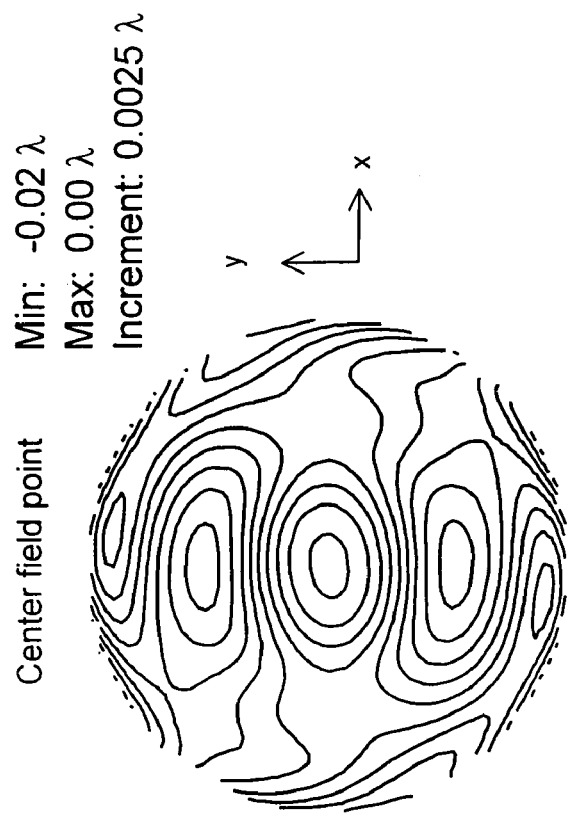

In FIGS. 33A, 33B, 33C, and 33D, wavefront errors are plotted at the system exit pupil as contour maps. FIGS. 33A and 33B show contour plots of the residual wavefront error for the lens depicted in FIG. 31 corresponding to an input polarization in the X direction, perpendicular to the field height, used with an exit pupil analyzer in the X direction for the central and extreme field points, respectively. For the central field point, the maximum peak-to-valley optical path difference is 0.025 waves at a wavelength of 193.3 nanometers, and at the extreme field, the maximum peak-to-valley optical path difference is 0.045 waves. FIGS. 33C and 33D show contour plots of the residual wavefront error for the lens depicted in FIG. 31 corresponding to an input polarization in the Y direction, parallel to the field height, used with an exit pupil analyzer in the Y direction for the central and extreme field points, respectively. For the central field point, the maximum peak-to-valley optical path difference is 0.017 waves at a wavelength of 193.3 nanometers, and at the extreme field, the maximum peak-to-valley optical path difference is 0.040 waves.

The centroid distortion for the compensated design with intrinsic birefringence, calculated based on the point spread function, and the telecentricity error in the Y direction are listed at relative field heights of 0, 0.7, and 1.0 in Table 18 below. As shown, the residual distortion in the X and Y directions is within 0.07 nm, suitable for 157 nm lithography. The distortion is also significantly reduced relative to the distortion of the nominal, uncorrected design given in Table 12. Changes in telecentricity error from the nominal design are negligible.

TABLE 18

| Relative Field Height | X PSF Centroid Distortion (nm) | Y PSF Centroid Distortion (nm) | Y Telecentricity Error (mrad) |
|---|---|---|---|
| 0.0 | 0.00 | 0.00 | 0.00 |
| 0.7 | 0.03 | 0.01 | 0.11 |
| 1.0 | 0.00 | 0.00 | 0.51 |

Table 19 provides a summary of Strehl ratio of the design of lens 100 of FIG. 31. The Strehl ratio values are calculated at field points centered on the point-spread function, i.e., distortion effects were not considered. As shown in Table 19, an aberration free system at 0.75 NA has a Strehl ratio of 0.8434. The performance of the nominal design without intrinsic birefringence effects slightly exceeds the performance of an ideal 0.75 NA lens by 0.0004 to 0.0017.

For the compensated system with intrinsic birefringence, the Strehl ratio is similar to that of the nominal design without considering the effects of intrinsic birefringence, and relative to a 0.75 NA, aberration-free system.

TABLE 19

| Design Layout | On-Axis Field | 70% Field | Extreme Field |
|---|---|---|---|
| Aberration-free lens (0.75 NA) | 0.8434 | 0.8434 | 0.8434 |
| Nominal design, no birefringence | 0.8439 | 0.8447 | 0.8451 |
| Elements aligned to compensate | 0.8435 | 0.8430 | 0.8428 |

EMBODIMENT 5

The fifth exemplary embodiment for application of the compensation techniques for intrinsic birefringence may be described in conjunction with a catadioptric optical system such as a projection lens for photolithography that employs a polarization beam splitter. Such an exemplary lens is disclosed as the second embodiment of U.S. Pat. No. 6,081,382 by Y. Omura, the contents of which are herein incorporated by reference. This exemplary lens is depicted in the schematic illustration of FIG. 34. The system advantageously operates at a central wavelength of $\lambda_o$=193.3 nm and at a numerical aperture of 0.80. The image field is an 8×25 mm rectangular slit field and the lens provides 4× reduction. All lens elements are constructed from fused silica in the exemplary embodiment, but other materials may be used in other exemplary embodiments.

For an optical system employing a polarization beam splitter and utilizing polarized input radiation, it is useful to take into account the polarization state of the beam through different paths through the system. In Embodiment 5, the input polarization may be linear and oriented along the direction of the X-axis; this polarization corresponds to s-polarized light upon reflection at polarization selective surface 208 of beam splitter 240. The X-axis designation is arbitrary and is defined with respect to a Cartesian coordinate system in which the optical axis of the incoming light beam is designated the Z-direction and the X-axis is parallel to the horizontal direction. Beam splitter 240 may be coated to maximize the reflectance of s-polarized light and the transmittance of p-polarized light.

The exemplary lens system includes object field 230, image field 231, optical axis 248, and aperture stop 233. Beam 249 enters prism 207 of beam splitter 240 on the first pass and reflects off polarization selective surface 208 and travels through prism 207 in a downward direction. Upon exiting prism 207 of beam splitter 240, beam 249 travels through quarter wave plate 209 and refractive element 210, reflects from reflective surface 211 of spherical mirror 212, and returns through refractive element 210 and quarter wave plate 209. First quarter wave plate 209 is oriented such that the birefringence axis is at a 45° angle with respect to the polarization orientation of beam 249 on both passes. The double pass through the wave plate and the reflection from reflective surface 211 rotates the polarization state of the beam such that it is transmitted by polarization selective surface 208 on the second pass through beam splitter 240. Following the second pass through prism 207, beam 249 passes through prism 213 of beam splitter 240 and second quarter wave plate 214 having a birefringence axis oriented at 45° with respect to the polarization orientation of the beam which converts the polarization state to circularly-polarized. This is as described in U.S. Pat. No. 6,081,382.

The root-mean-square (RMS) and maximum retardance over the exit pupil are listed in Table 20 for the nominal design without intrinsic birefringence effects, for five positions across the 16×100 mm object field 230. These result from the single-layer anti-reflection coatings used in the model and the quarter wave plates; the effects of polarization selective surface 208 of beam splitter 240 are also included in the model assuming perfect reflection for s-polarized light and perfect transmission for p-polarized light.

TABLE 20

| Object Field (X, Y) in mm | Retardance (waves at $\lambda_o$ = 193.3 nm) | |
|---|---|---|
| | RMS | Maximum |
| (−50, −4) | 0.0054 | 0.0274 |
| (−35, 0) | 0.0045 | 0.0243 |
| (0, 0) | 0.0044 | 0.0237 |
| (35, 0) | 0.0045 | 0.0245 |
| (50, 4) | 0.0042 | 0.0233 |

Figure 34:
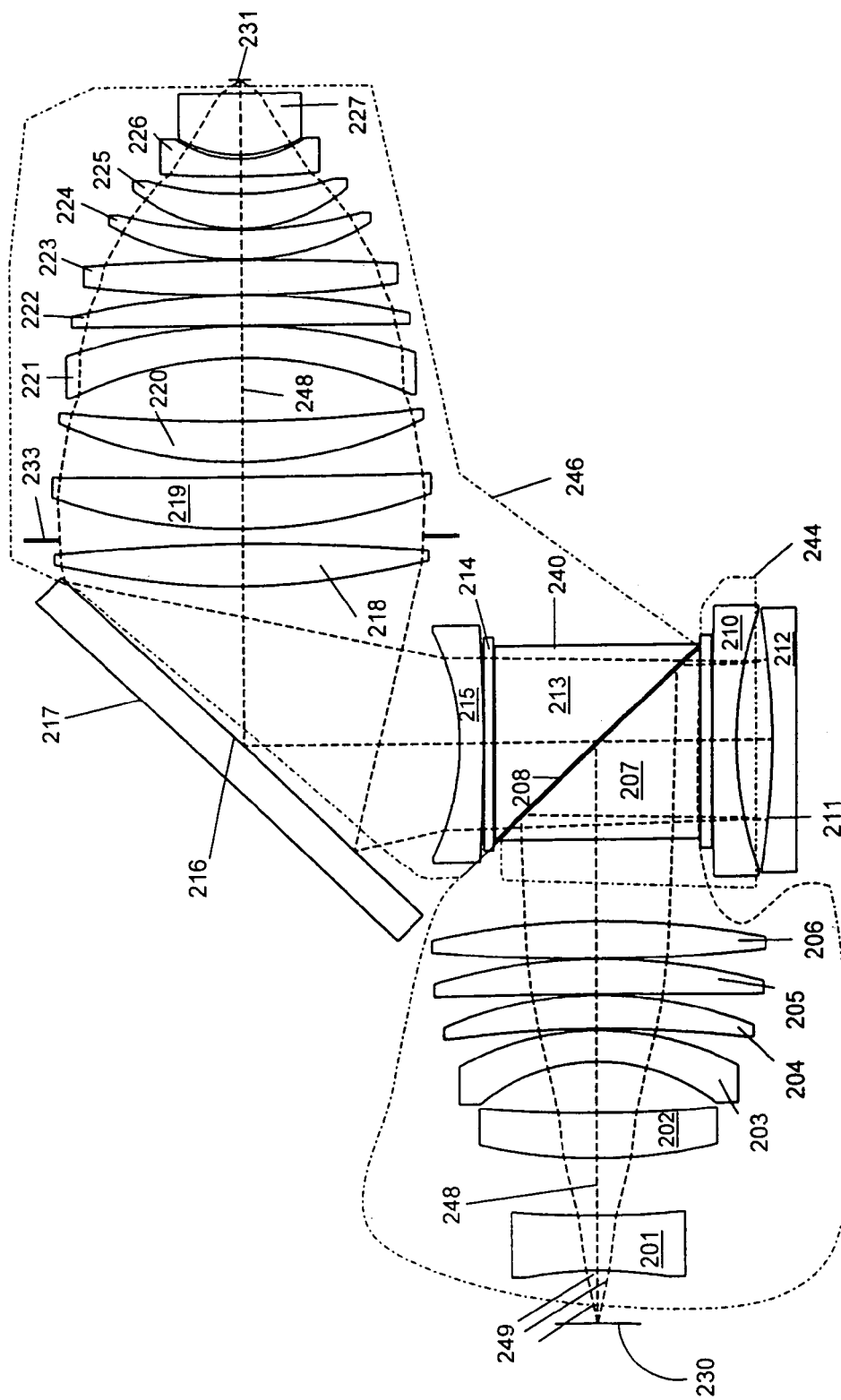
FIG. 34 is a schematic illustration showing an exemplary large format, catadioptric projection lens.
Figures 35A, 35B:
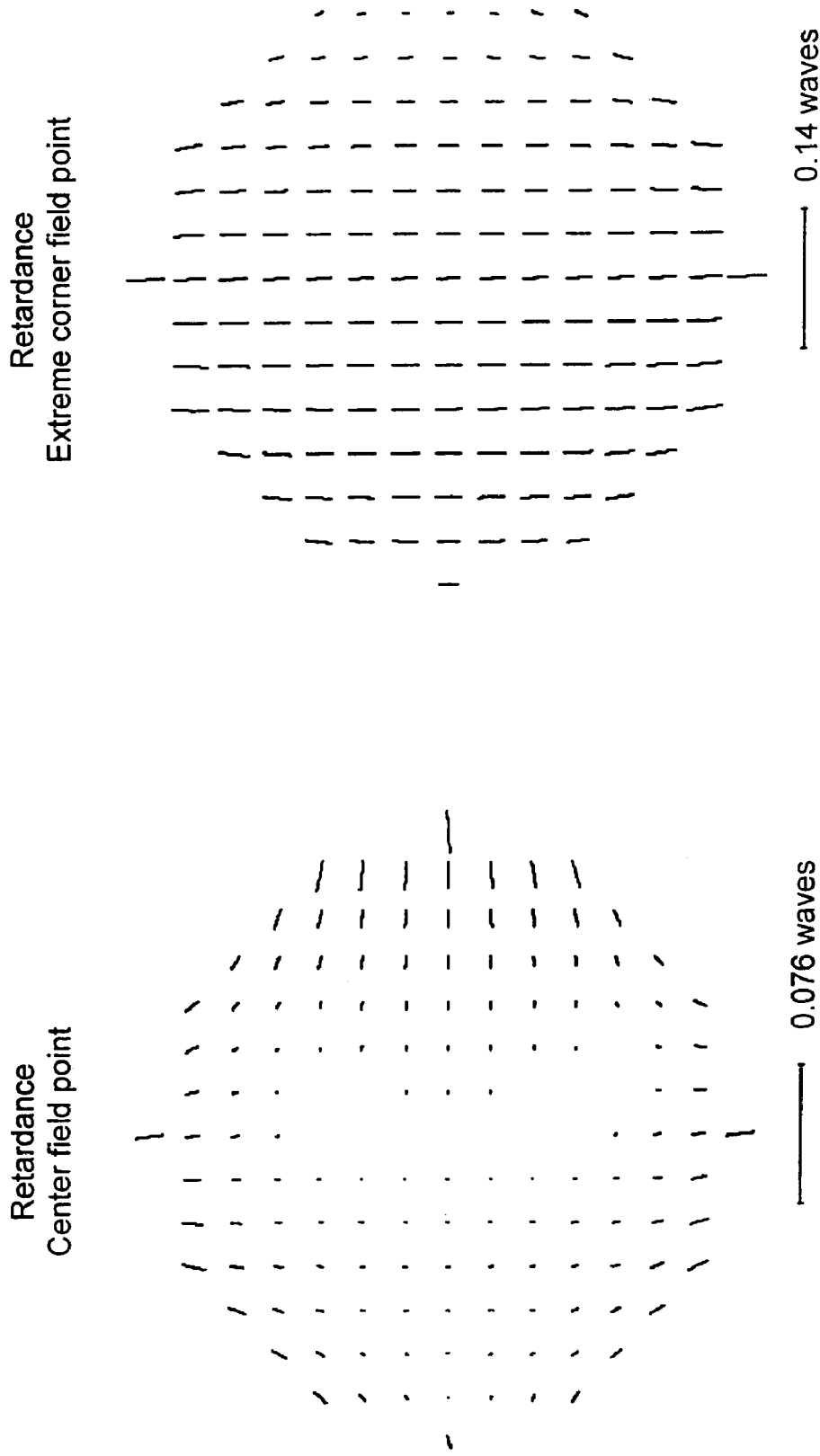
FIGS. 35A and 35B are graphical illustrations showing retardance across the pupil for the lens depicted in FIG. 34 at central and extreme field points, respectively due to single-layer anti-reflection coatings.

FIGS. 35A and 35B depict the retardance across the system exit pupil due to the anti-reflection coatings and wave plates for the field points at the center and extreme corner of the field (X=50 mm and Y=4 mm at object field 230), respectively, for the exemplary lens shown in FIG. 34. FIG. 35A shows that, at the center of the field, the retardance is zero at the center of the pupil and generally increases in magnitude towards the edge of the pupil. At the extreme corner of the rectangular field, the retardance shows a roughly constant linear component, oriented vertically across the exit pupil, as shown in FIG. 35B.

Figure 36B:
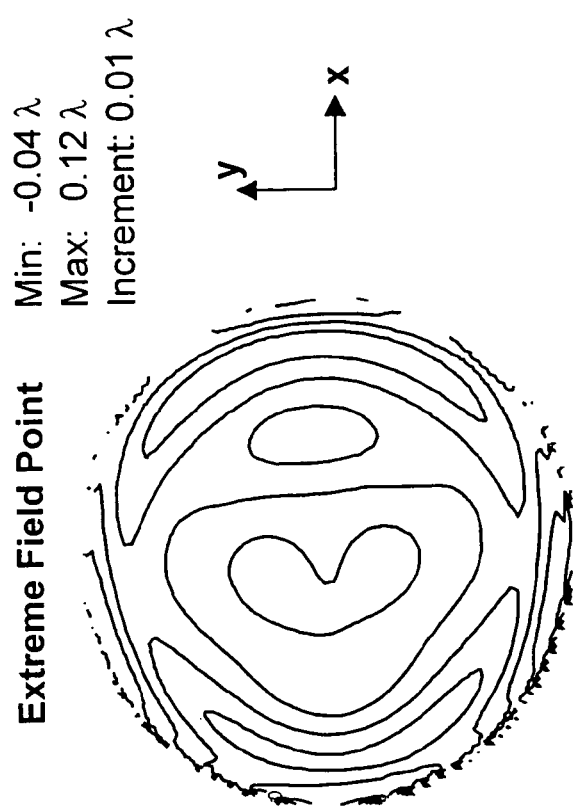
Figure 36A:
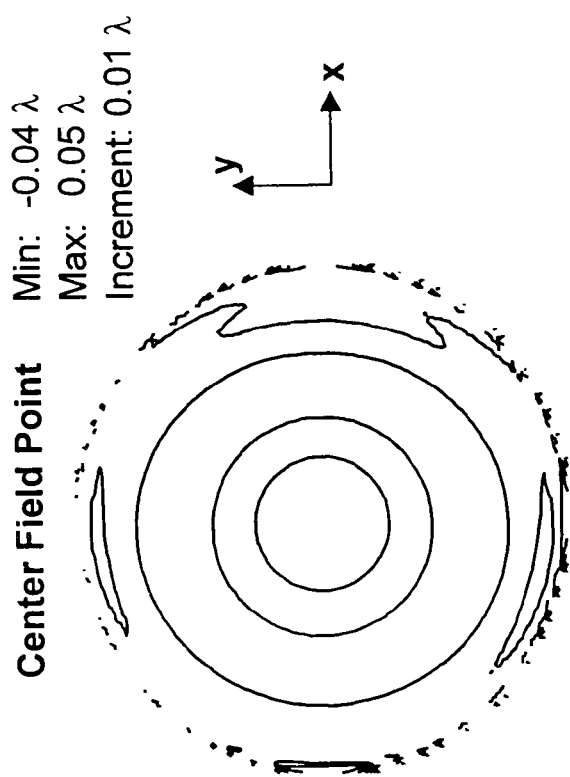

FIGS. 36A, 36B, 36C, and 36D show wavefront errors for the nominal design, without the effects of intrinsic birefringence, plotted at the system exit pupil as contour maps. FIGS. 36A and 36B show contour plots of the residual wavefront error for the lens depicted in FIG. 34 corresponding to an input polarization in the X direction used with an exit pupil analyzer in the X direction for the center and extreme corner of the field (X=50 mm and Y=4 mm at the reticle), respectively. For the wavefront error at the central field point shown in FIG. 36A, the maximum peak-to-valley optical path difference is approximately 0.099 waves at a wavelength of 193.3 nanometers, and for wavefront error at the at the extreme field shown in FIG. 36B, the maximum peak-to-valley optical path difference is approximately 0.160 waves. FIGS. 36C and 36D show contour plots of the residual wavefront error for the lens depicted in FIG. 34 corresponding to an input polarization in the Y direction used with an exit pupil analyzer in the Y direction for the central and extreme field points, respectively. For the wavefront error at the central field point shown in FIG. 36C, the maximum peak-to-valley optical path difference is approximately 0.093 waves at a wavelength of 193.3 nanometers, and for the wavefront error at the extreme field shown in FIG. 36D, the maximum peak-to-valley optical path difference is approximately 0.152 waves.

The RMS and peak-to-valley wavefront errors are listed in Table 21 below for the nominal design, without the effects of intrinsic birefringence, at five exemplary field points. These values represent the wavefront errors at optimum focus, with tilt terms removed to locate each image point at the center of the wavefront in the calculation. Results are given for two orthogonal polarization components. The X component represents the wavefront error assuming a linear polarizer along the X direction at the system exit pupil, and the Y component represents the wavefront error assuming a linear polarizer along the Y direction at the exit pupil. The RMS wavefront error is shown to vary over the field from 0.011 to 0.016 waves at $\lambda$=193 nm.

TABLE 21

| Object Field (X, Y) in mm | RMS Wavefront Error (waves at $\lambda_o$ = 193.3 nm) | | Peak-to-Valley Wavefront Error (waves at $\lambda_o$ = 193.3 nm) | |
|---|---|---|---|---|
| | X Component | Y Component | X Component | Y Component |
| (−50, −4) | 0.015 | 0.015 | 0.161 | 0.149 |
| (−35, 0) | 0.016 | 0.016 | 0.157 | 0.162 |
| (0, 0) | 0.011 | 0.011 | 0.099 | 0.093 |
| (35, 0) | 0.016 | 0.016 | 0.161 | 0.153 |
| (50, 4) | 0.015 | 0.015 | 0.160 | 0.152 |

Table 22 shows the centroid distortion for the nominal design, calculated based on the point spread function (PSF), for the same five exemplary field points. The maximum image distortion is approximately 27.1 nm. The chief ray telecentricity error across the field is within 0.4 mrad.

TABLE 22

| Object Field (X, Y) in mm | X PSF Centroid Distortion (nm) | Y PSF Centroid Distortion (nm) |
|---|---|---|
| (−50, −4) | −24.21 | −3.38 |
| (−35, 0) | −27.13 | −1.35 |
| (0, 0) | 0.00 | −0.03 |
| (35, 0) | 27.13 | 1.36 |
| (50, 4) | 24.19 | 3.45 |

Catadioptric systems with a polarization selective surface generally work well with a single input polarization state. The polarization state that is orthogonal to the design input polarization state is lost at the polarization selective surface. Thus, if the input polarization is fixed, retardance aberrations prior to the polarization selective surface couple light out of the system, causing apodization of the transmitted beam, and contribute a fixed phase to the transmitted wavefront. As such, apodization is advantageously minimized to maintain efficiency and high-performance imaging. This may be achieved when the retardance aberrations prior to the polarization selective surface are either along or orthogonal to the input polarization state. Thus for this catadioptric embodiment, retardance aberrations are advantageously minimized by properly orienting and shaping lens elements after the second wave plate, such as second wave plate 214. For the surfaces prior to polarization selective surface 208, the component of the retardance aberration that is neither along nor orthogonal to the design polarization state is advantageously minimized. This approach may be more helpful than minimizing the retardance in lens elements prior to the polarization selective surface. Relative designations "before" and "after" are used in reference to the path of a beam traveling from the object plane to the image plane, throughout the specification.

Figures 37A, 37B:
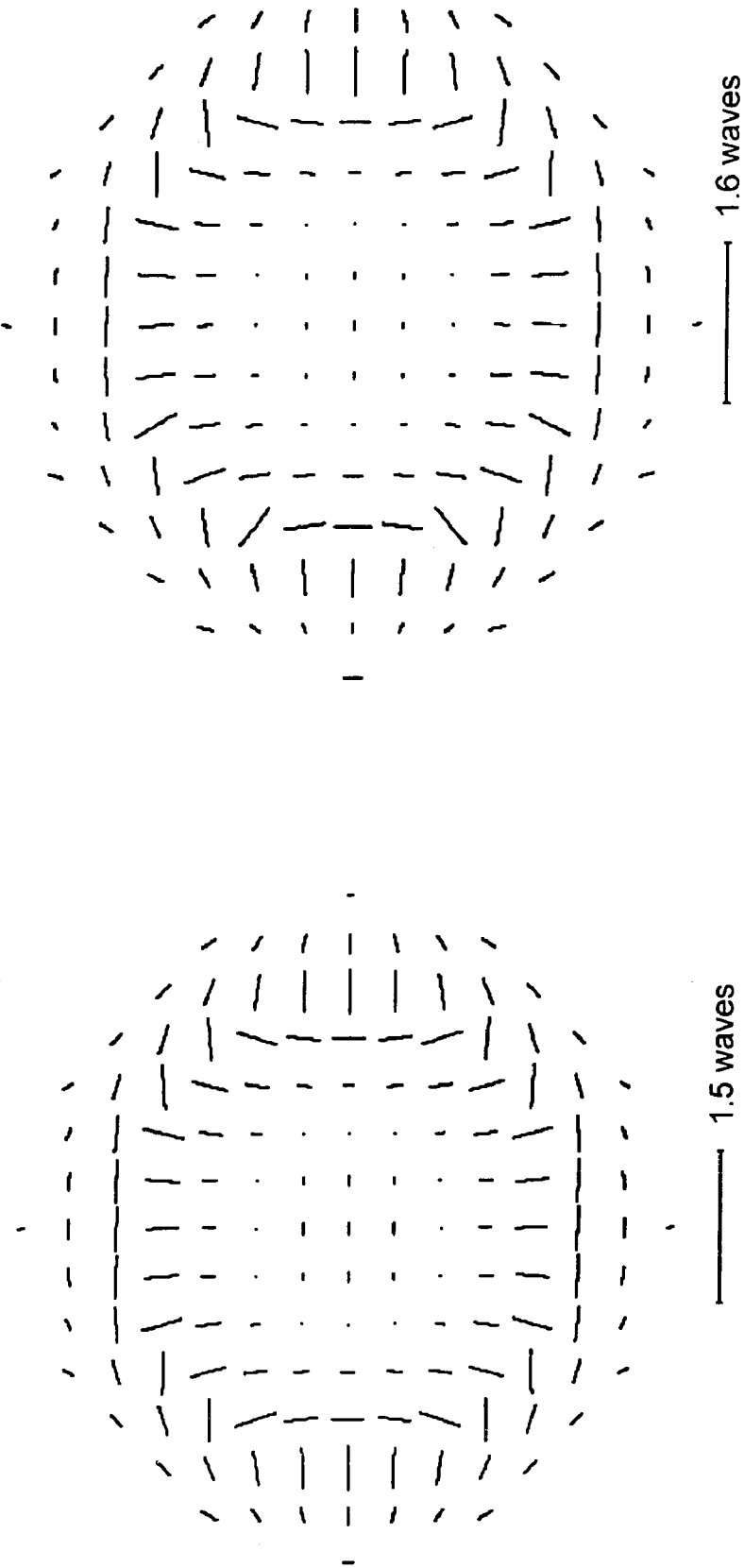
FIGS. 37A and 37B are graphical illustrations showing retardance across the pupil for the lens depicted in FIG. 34 at central and extreme field points, respectively, in an exemplary embodiment in which all elements between the second wave plate and the image plane are identically aligned in three dimensions, with the optical axis along the [110] crystal lattice direction and a peak birefringence magnitude corresponding to that of calcium fluoride at a wavelength of 157 nm.

FIGS. 37A and 37B show the net retardance across the system exit pupil for field points at the center and extreme corner of the field (X=50 mm and Y=4 mm at the reticle), respectively, in the exemplary embodiment in which the components preceding second wave plate 214 are assumed to have no intrinsic birefringence and in which the components following second wave plate 214 are [110] optical elements identically aligned in three dimensions, in the exemplary catadioptric optical system illustrated in FIG. 34, at a wavelength of 193.3 nanometers. In the retardance plots of FIGS. 37A, 37B and similar figures, the retardance orientation rotates by 90 degrees at one-half-wave intervals, i.e., the effect of a 0.75 wave retarder at 0 degrees is the same as a 0.25 wave retarder at 90 degrees. Thus, the peak retardance due to intrinsic birefringence for the exemplary embodiment described in FIGS. 37A and 37B, is approximately 0.75 waves at a wavelength of 193.3 nanometers, with small variation with object field height.

Figure 38B:
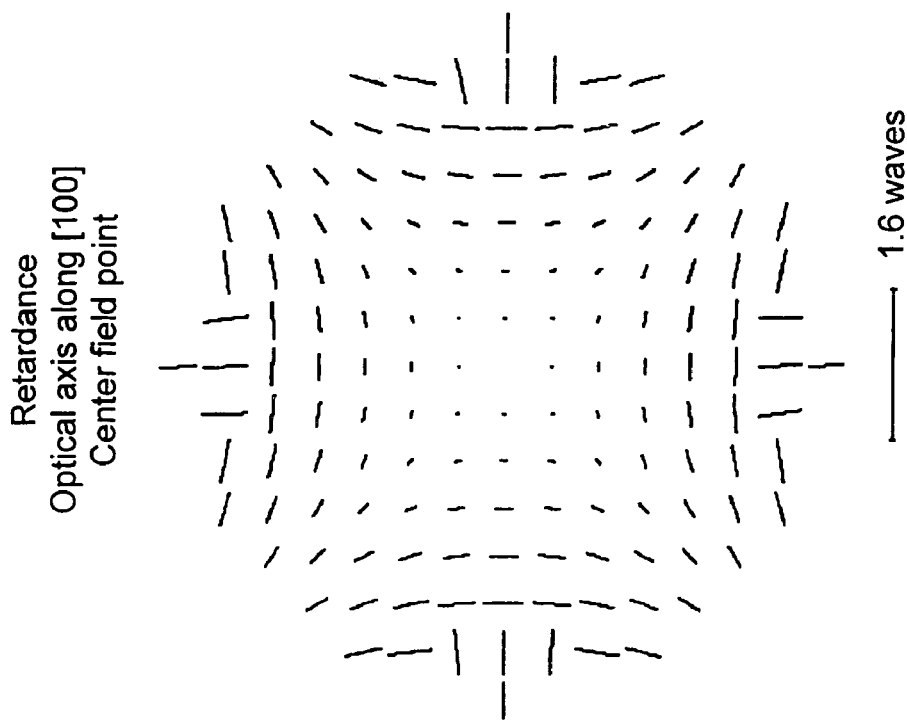
FIGS. 38A and 38B are graphical illustrations showing retardance across the pupil for the lens depicted in FIG. 34 at central and extreme field points, respectively, in an exemplary embodiment in which all elements between the second wave plate and the image plane are identically aligned in three dimensions, with the optical axis along the [100] crystal lattice direction and a peak birefringence magnitude corresponding to that of calcium fluoride at a wavelength of 157 nm.
Figure 38A:
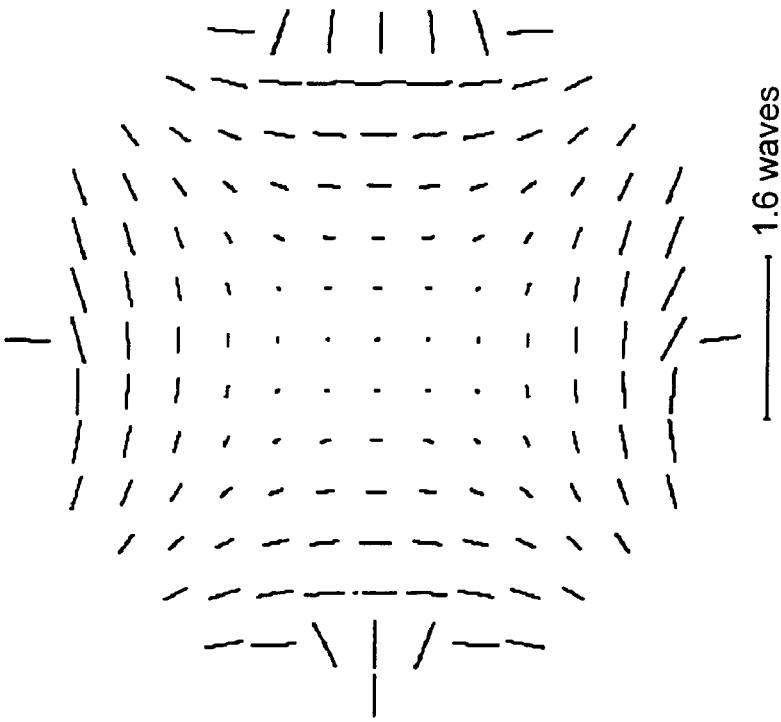

In FIGS. 38A and 38B, the net retardance across the system exit pupil is depicted for field points at the center and extreme corner of the field, respectively, in the exemplary embodiment in which the components preceding second wave plate 214 are assumed to have no intrinsic birefringence and in which the components following the second wave plate 214 are [100] optical elements identically aligned in three dimensions in the exemplary catadioptric optical system illustrated in FIG. 34, at a wavelength of 193.3 nanometers. The peak retardance due to intrinsic birefringence in this example is approximately 0.60 waves at a wavelength of 193.3 nanometers, with small variation with object field height.

Figures 39A, 39B:
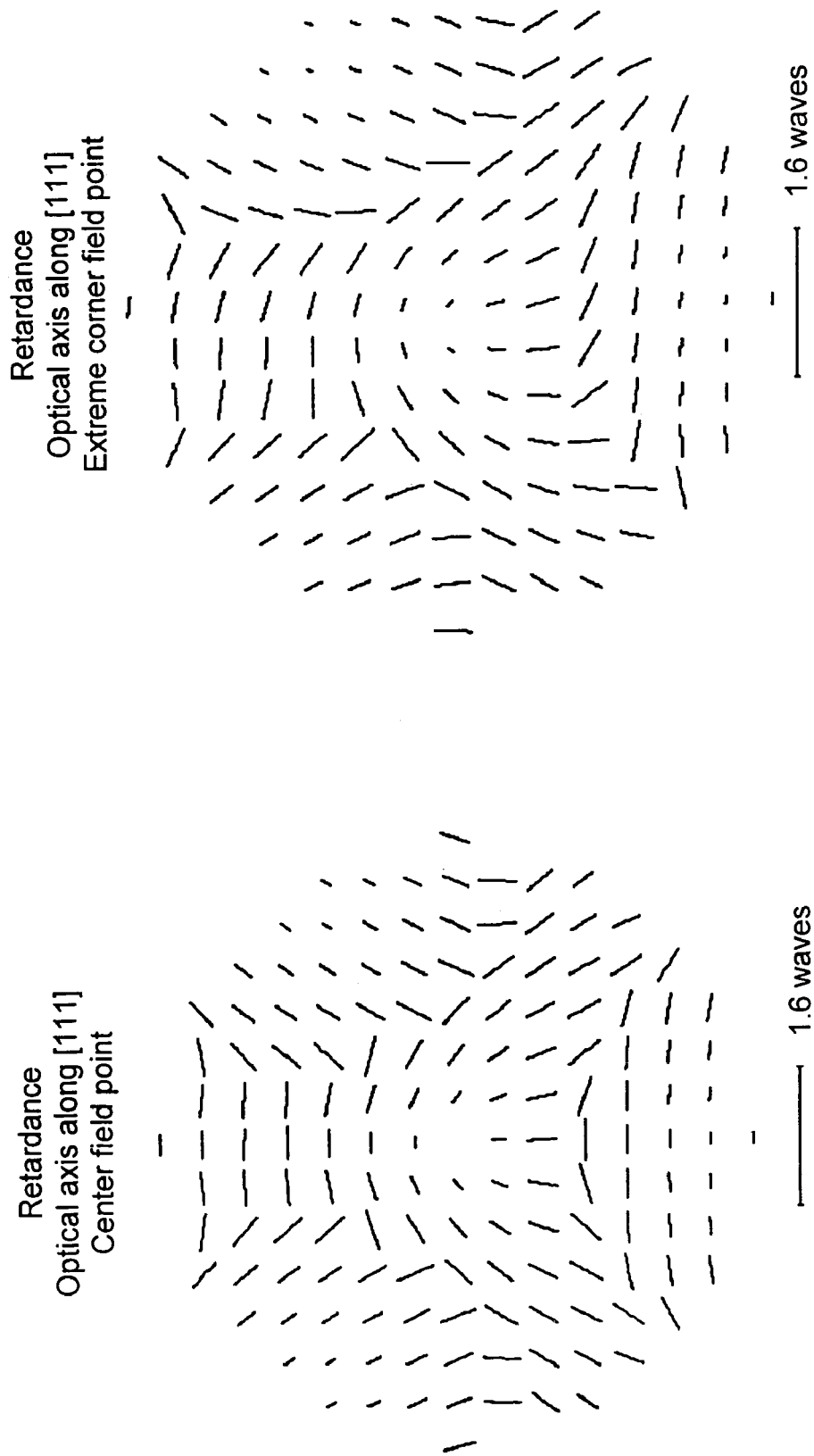
FIGS. 39A and 39B are graphical illustrations showing retardance across the pupil for the lens depicted in FIG. 34 at central and extreme field points, respectively, in an exemplary embodiment in which all elements between the second wave plate and the image plane are identically aligned in three dimensions, with the optical axis along the [111] crystal lattice direction and a peak birefringence magnitude corresponding to that of calcium fluoride at a wavelength of 157 nm.

FIGS. 39A and 39B show the net retardance across the system exit pupil for field points at the center and extreme corner of the field, respectively, in the exemplary embodiment in which the components preceding second wave plate 214 are assumed to have no intrinsic birefringence and in which the components following second wave plate 214 are [111] optical elements identically aligned in three dimensions in the exemplary catadioptric optical system illustrated in FIG. 34, at a wavelength of 193.3 nanometers. The peak retardance due to intrinsic birefringence in this example is approximately 0.90 waves at a wavelength of 193.3 nanometers.

Additional performance degradation may result from retardance aberrations produced by elements preceding second wave plate 214. In particular, retardance aberrations produced by elements preceding polarization selective surface 208 may, in general, cause light to couple out of the system, resulting in pupil intensity non-uniformity, and this may also change the transmitted wavefront.

With elements following second quarter wave plate 214 identically aligned in three dimensions such that their [110], [100], or [111] crystal axes lie along optical axis 248, the intrinsic birefringence produces very large retardance aberrations and in turn wavefront aberrations, as shown in the preceding figures. Without compensation, this unacceptably large aberration significantly exceeds the allowable wavefront error in high-performance photolithography, in particular, photolithography used to produce distortion-free patterns needed in today's semiconductor manufacturing industry.

For compensating intrinsic birefringence effects in a catadioptric system such as described in the present embodiment, there are additional considerations for optimizing the performance compared with compensation in an all-refractive system, such as those described in Embodiments 3 and 4.

Figure 40:
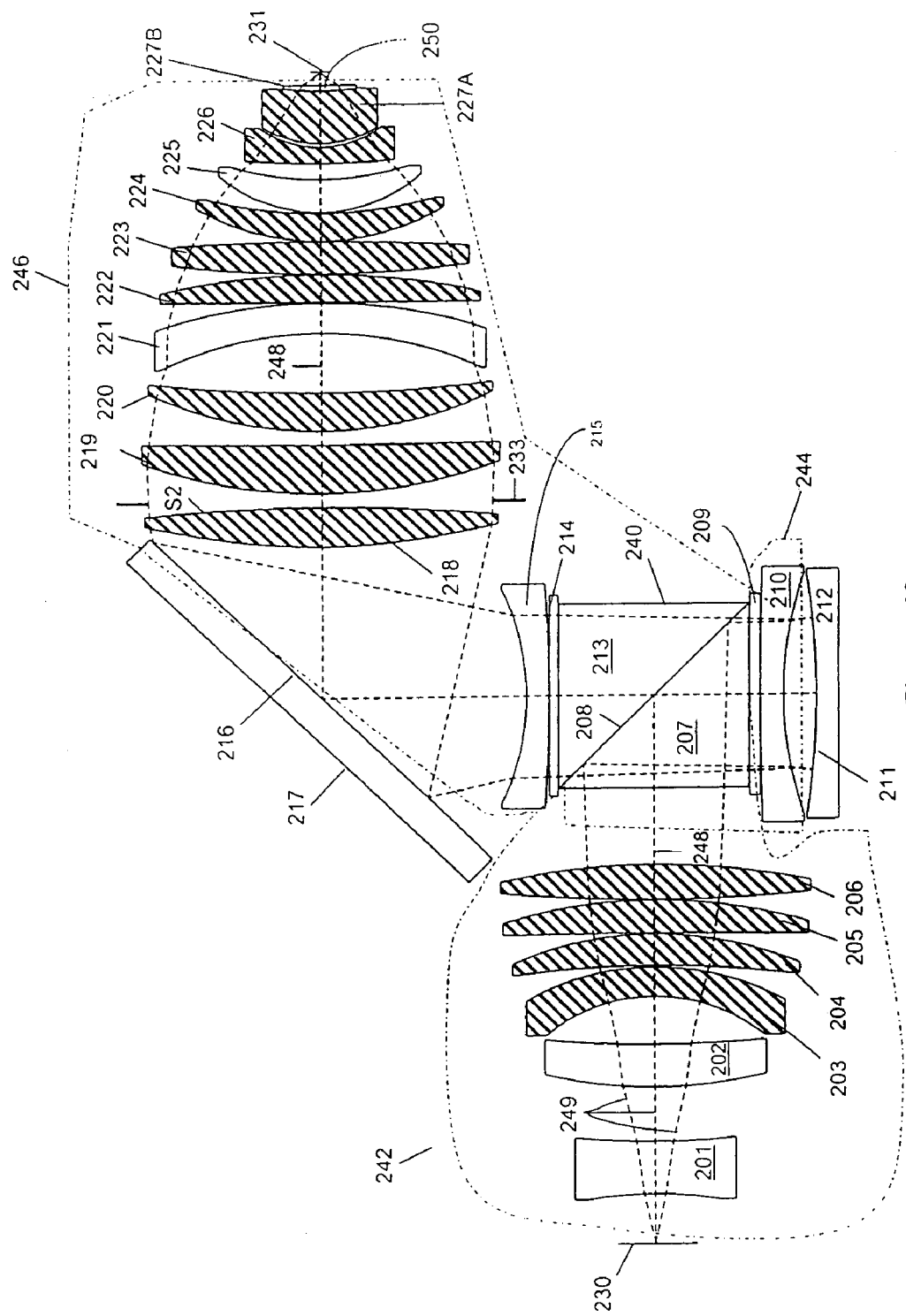
FIG. 40 is a schematic illustration of the exemplary lens shown in FIG. 34 with the last element of FIG. 34 split into two sub-elements, in which the hatched elements are [110] cubic crystalline optical elements, and all others are [100] cubic crystalline optical elements.

FIG. 40 is a schematic side view of the lens according to exemplary embodiment 5, in which each of [110] optical elements 203–206, 218–220, 222–224 and 226–227A are hatched. The lens, according to exemplary embodiment 5, is substantially similar to the lens shown in FIG. 34, with the notable exception being that the refractive lens elements are advantageously oriented with respect to their crystal lattices and element 227 of the lens in FIG. 34 is split into two lens elements 227A and 227B in the lens of the fifth embodiment shown in FIG. 40. This exemplary catadioptric system has an NA of approximately 0.80 and may advantageously be used to manufacture integrated circuits. More specifically, the system may be used in a lithography tool such as a stepper, projection printer, or the like, used in the semiconductor manufacturing industry to produce a sequence of patterns on substrates to produce an integrated circuit or other semiconductor device.

Because polarization selective surface 208 is employed in the exemplary catadioptric system of the fifth exemplary embodiment, it is useful to balance or minimize the retardance produced by several different groups of elements. The front group 242 of elements includes the lens elements 201–206 preceding beam splitter 240 and the first pass through prism 207 of beam splitter 240 up to polarization selective surface 208. Second group 244 comprises the second pass through prism 207 of beam splitter 240 following reflection by polarization selective surface 208, first quarter wave plate 209, refractive lens element 210, and reflective surface 211 of spherical mirror 212, and the return path to polarization selective surface 208 through prism 207. Third group 240 comprises prism 213 of beam splitter 240 following transmission through polarization sensitive surface 208, second quarter wave plate 214, and elements 215 and 218–227B between the beam splitter and wafer, also referred to as the image side of beam splitter 240. Elements 201–206 are disposed on the object side of beam splitter 240.

According to an exemplary embodiment, input beam 249 is linearly polarized in the horizontal direction, parallel to the X-axis and in the long direction of the rectangular object field. For a given ray, depending on the orientation of the local birefringence axis of the crystal material with respect to the input polarization, the intrinsic birefringence generally causes the ray to split into two rays with orthogonal polarization orientations. Thus, intrinsic birefringence in the front group 242 of elements may result in light being lost at polarization selective surface 208, since light that is polarized in the vertical direction will be transmitted through the beam splitter rather than reflected. Since the birefringence magnitude and axis orientation varies with propagation direction through the crystal, intensity non-uniformity may result across the system exit pupil.

In the present embodiment, the linear polarization of input beam 249 may be utilized to minimize the effects of intrinsic birefringence in front group 242. If a given lens element is oriented with its [110] crystal axis along the common optical axis 248 (see FIG. 5A), and the local birefringence axis for the ray along the optical axis is oriented horizontally (i.e., parallel to the input polarization), rays at small angles with respect to the optical axis correspond to extraordinary rays, and very little energy will couple into the vertical polarization state.

Similarly, if the element is oriented with its [110] crystal axis along common optical axis 248 and the local birefringence axis along the optical axis is oriented vertically, that is, perpendicular to the input polarization, rays at small angles with respect to the optical axis correspond to ordinary rays, and very little energy will couple into the horizontal polarization state.

For a [100] optical element, the birefringence magnitude is comparatively small for rays at small angles with respect to the optical axis. The lens elements may be aligned such that the birefringence lobes are at azimuthal angles of 0, 90, 180, and 270° (see FIG. 5B) in order to minimize the component of the retardance that is neither parallel nor orthogonal to the input polarization state.

In this embodiment, the crystal lattice orientations of the elements in front group 242 are selected from the three crystal lattice orientations to minimize both the horizontal and vertical variation in retardance. According to other exemplary embodiments of similar catadioptric systems, and in which circular input polarization is used, and a quarter wave plate is employed immediately prior to the beam splitter to convert the polarization of the beam to linearly-polarized light, the optical elements may advantageously be clocked to minimize the RMS retardance, or produce circular residual retardance aberrations to match the input polarization state.

Still referring to FIG. 40, the first two lens elements 201 and 202 are [100] optical elements, clocked to have birefringence lobes oriented at azimuthal angles of 0, 90, 180, and 270° in the exemplary embodiment. Lens elements 203, 204, 205, and 206 are oriented so that the optical axis is along their [110] lattice directions, with relative clockings of 0, 90, 90, and 0°, with respect to an orientation that gives a horizontal birefringence axis along the optical axis.

Prism 207 of beam splitter 240 is oriented such that its [100] crystal axis lies along optical axis 248 for the first pass of input beam 249, again with birefringence lobes oriented at azimuthal angles of 0, 90, 180, and 270°. Upon reflection from the 45° polarization selective surface 208, the beam maintains an equivalent direction through the crystal. According to another embodiment, beam splitter 240 may be a polarization beam splitter formed of a cubic crystalline material and aligned such that its [110] lattice direction lies substantially along optical axis 248 and the local birefringence axis for the ray entering the beam splitter along the optical axis is oriented horizontally, parallel to the input polarization orientation, such that upon reflection from the 45° polarization selective surface 208, the beam maintains an equivalent direction through the crystal.

The RMS and maximum retardance over the exit pupil are listed in Table 23 for five positions across object field 230; these include the effects of intrinsic birefringence in the elements 201–206 preceding beam splitter 240 and segment 207 of beam splitter 240 up to the reflective surface 211 of spherical mirror 212, as well as retardance due to the single-layer anti-reflection coatings used in the model. The effects of the quarter wave plates and polarization selective surface of the beam splitter are not included.

TABLE 23

| X Object Field Height (mm) | Y Object Field Height (mm) | Retardance (waves at $\lambda_o$ = 193.3 nm) | |
|---|---|---|---|
| | | RMS | Maximum |
| −50 | −4 | 0.0135 | 0.0799 |
| −35 | 0 | 0.0155 | 0.0681 |
| 0 | 0 | 0.0087 | 0.0350 |
| 35 | 0 | 0.0138 | 0.0617 |
| 50 | 4 | 0.0096 | 0.0604 |

Figures 41A, 41B:
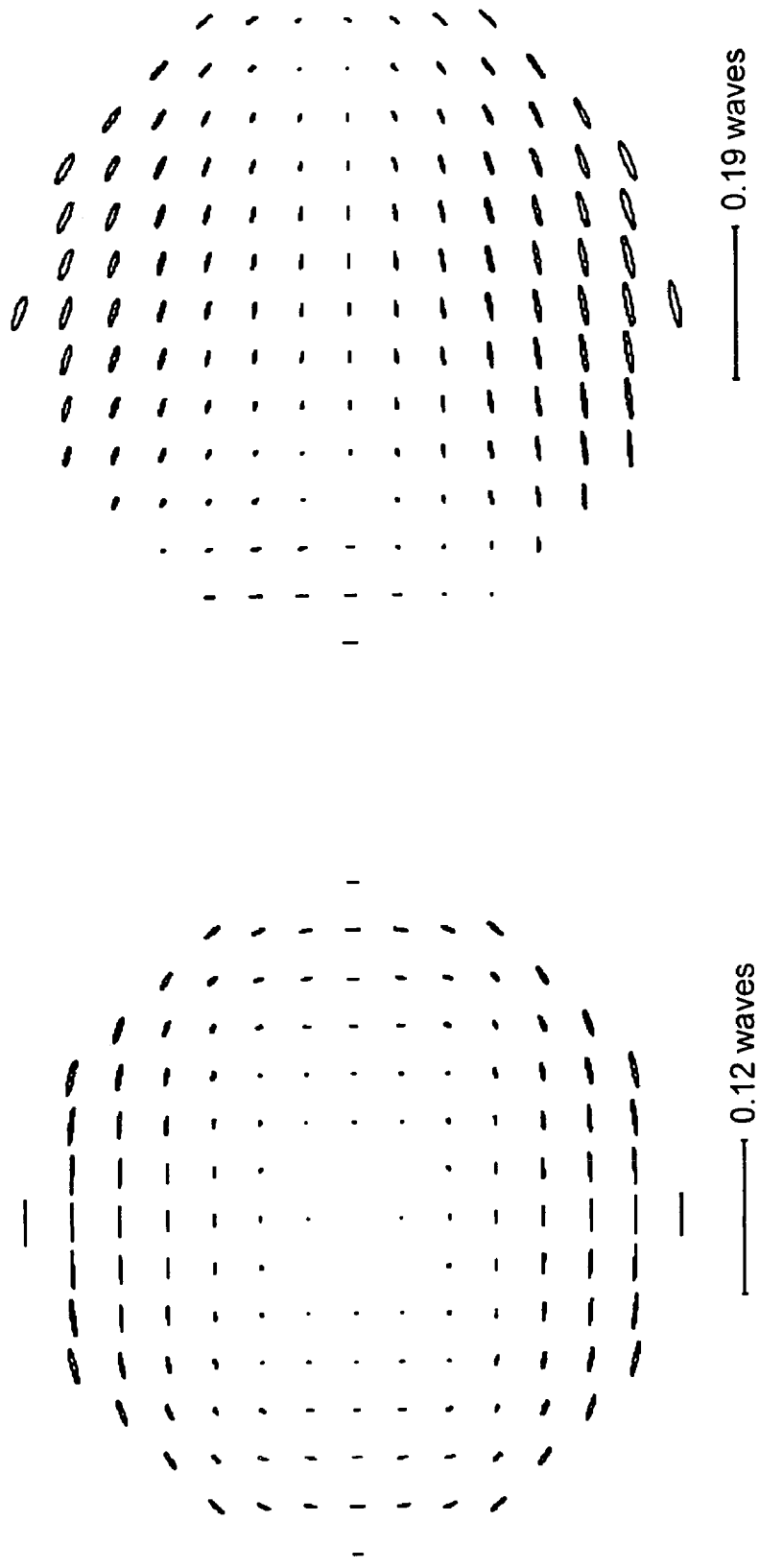
FIGS. 41A and 41B are graphical illustrations showing retardance across the pupil for the exemplary lens depicted in FIG. 40 at central and extreme field points, respectively, due to anti-reflection coatings and the intrinsic birefringence of the front six elements, with the crystal lattice orientation of the front six elements chosen to minimize the variation in the retardance along horizontal and vertical directions.

FIGS. 41A and 41B depict the retardance across the system exit pupil due to the intrinsic birefringence of front group 242 and anti-reflection coatings for the field points at the center and extreme corner of the field (X=50 mm and Y=4 mm at the reticle), respectively. FIG. 41A shows that, at the center of the field, the retardance is zero at the center of the pupil and increases in magnitude towards the edge of the pupil. At the outer corner of the field, FIG. 41B shows that the retardance includes a linear component, oriented roughly horizontally over the pupil.

For the center of the field, the system transmittance varies from a normalized value of 1.0 at the center of the pupil to a minimum value of approximately 0.930 at the edge of the pupil. For the extreme or outer corner of the field, the normalized system transmittance varies from 1.0 at the center of the pupil, to a minimum of approximately 0.915 at the edge of the pupil. In the second group 244 of elements, in which the beam reflects off reflective surface 211 and returns to polarization selective surface 208 of beam splitter 240, there are relatively fewer degrees of freedom for minimizing the retardance. In this element group, therefore, each individual lens element component may be aligned with its [100] crystal axis along the optical axis, with peak birefringence lobes oriented at azimuthal angles of 0, 90, 180, and 270°. This minimizes the component of the retardance that is neither parallel nor orthogonal to the axis of the polarization selective surface. Because the ray angles are relatively small with respect to the optical axis (within 11° from the optical axis) and the birefringence lobes in the beam splitter path are preferentially oriented, the effects of the intrinsic birefringence are minimized.

After transmission through polarization selective surface 208 of the beam splitter, prism 213 of beam splitter 240 is also oriented to be a [100] optical element and oriented to have birefringence lobes at 0, 90, 180, and 270°, to minimize the effects of the intrinsic birefringence since ray angles are small with respect to the optical axis (within 6°) and the birefringence lobes are again preferentially oriented.

According to another embodiment, prism 213 of beam splitter 240 may be aligned such that its [110] lattice direction lies substantially along optical axis 248 and the local birefringence axis for the ray traveling along the optical axis and entering prism 213 is substantially perpendicular to the polarization direction of the ray; this embodiment may be used in conjunction, for example, with a cubic crystalline prism 207 oriented such that its [110] lattice direction lies substantially along optical axis 248 and the local birefringence axis for the input ray traveling along the optical axis is substantially parallel to the input polarization direction, to minimize net retardance.

In the present embodiment, beam splitter 240 may be oriented such that the input beam is polarized horizontally, corresponding to s-polarized light at the polarization selective surface 208, and polarization selective surface 208 is coated to preferentially reflect s-polarized light. In other exemplary embodiments, the beam splitter may be designed to transmit the beam on the first pass through the beam splitter and reflect the beam on the second pass, and the crystal orientations of the segments would again be selected to minimize net retardance and maintain an equivalent lattice direction along the optical axis upon reflection.

Third group 246 includes elements 213–227B. For the third group 246 of elements, compensation of the retardance produced by the intrinsic birefringence is again achieved by selective orientation of the crystal axis alignment for each lens element with respect to the optical axis, the relative rotations of those elements about the optical axis, and by splitting last element 227 of the exemplary lens embodiment shown in FIG. 34, into two sub-elements 227A and 227B that provide the same total thickness and power but include individual thicknesses and a curvature of buried surface 250 between them that is optimized to minimize retardance. As in the previous embodiments, a combination of [110] and [100] optical elements are utilized to allow the retardance contributions of the individual elements in third group 246 of elements to be balanced, thereby correcting for intrinsic birefringence and reducing retardance.

In this embodiment, elements 215, 221, and 225 and quarter wave plates 209 and 214 are [100] optical elements oriented such that the peak birefringence lobes are oriented at azimuthal angles of 0, 90, 180, and 270°. Also, the two sub-elements include first sub-element 227A oriented with its [110] crystal axis along optical axis 248 and second sub-element 227B with its [100] crystal axis along optical axis 248. The crystal axis orientation and clockings of each of the components are given in Table 24 below. The table includes refractive lens elements 201–206, 210, 215, 218–226 and 227A and 227B, beam splitter prisms 207 and 213 and wave plates 209 and 214. For [110] optical elements, the clocking of each element is given relative to an orientation that produces peak birefringence along the optical axis that is oriented with the retardance axis substantially parallel to the X axis (horizontal, in the long direction of the specified field of view). For [100] optical elements, the clocking of each element is given relative to an orientation that produces peak birefringence lobes in the X-Z and Y-Z planes, at azimuthal angles of 0, 90, 180, and 270°.

TABLE 24

| Element | Crystal Axis Direction along Optical Axis | Element Clocking (degrees) |
| --- | --- | --- |
| 201 | [100] | 0 |
| 202 | [100] | 0 |
| 203 | [110] | 0 |
| 204 | [110] | 90 |
| 205 | [110] | 90 |
| 206 | [110] | 0 |
| Prism 207, Segment 1 | [100] | 0 |
| Prism 207, Segment 2 | [100] | 0 |
| Wave Plate 209, Pass 1 | [100] | 0 |
| 210, Pass 1 | [100] | 0 |
| 210, Pass 2 | [100] | 0 |
| Wave Plate 209, Pass 2 | [100] | 0 |
| Prism 207, Segment 3 | [100] | 0 |
| Prism 213, Segment 4 | [100] | 0 |
| Wave Plate 214 | [100] | 0 |
| 215 | [100] | 126.80 |
| 218 | [110] | 51.77 |
| 218, toroidal rear surface S2 | — | −30.00 |
| 219 | [110] | 149.94 |
| 220 | [110] | −81.22 |
| 221 | [100] | 179.17 |
| 222 | [110] | −0.27 |
| 223 | [110] | 60.98 |
| 224 | [110] | 45.86 |
| 225 | [100] | −69.14 |
| 226 | [110] | 90.29 |
| 227A | [110] | −30.24 |
| 227B | [100] | 11.80 |

RMS and maximum retardance over the exit pupil are listed in Table 25 below for five exemplary field positions and include the effects of intrinsic birefringence for the elements following the second quarter wave plate 214 and the single layer anti-reflection coatings used in the model. The RMS retardance ranges from 0.0062 to 0.0084 waves at $\lambda_o$=193.3 nm, across the field.

TABLE 25

| X Object Field | Y Object Field | Retardance (waves at $\lambda_o$ = 193.3 nm) | |
| --- | --- | --- | --- |
| Height (mm) | Height (mm) | RMS | Maximum |
| −50 | −4 | 0.0084 | 0.0518 |
| −35 | 0 | 0.0078 | 0.0473 |
| 0 | 0 | 0.0062 | 0.0390 |

TABLE 25-continued

| X Object Field | Y Object Field | Retardance (waves at $\lambda_o$ = 193.3 nm) | |
| --- | --- | --- | --- |
| Height (mm) | Height (mm) | RMS | Maximum |
| 35 | 0 | 0.0078 | 0.0473 |
| 50 | 4 | 0.0084 | 0.0518 |

Figure 42B:
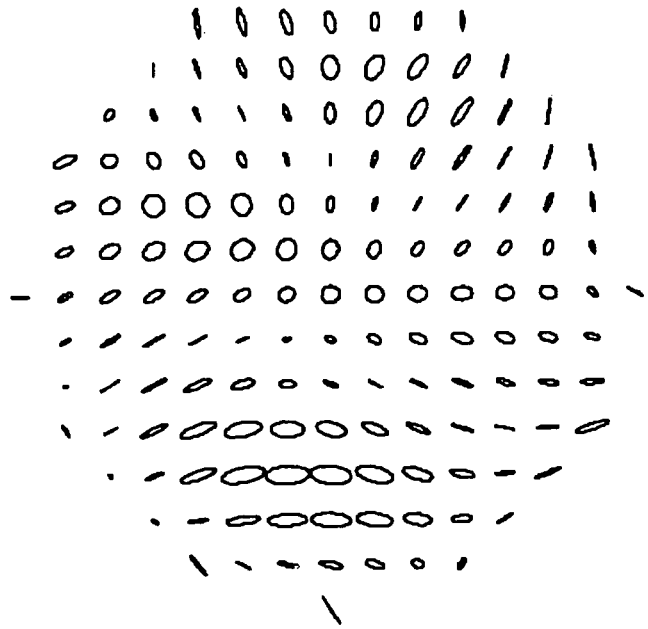
FIGS. 42A and 42B are graphical illustrations showing retardance across the pupil for the lens depicted in FIG. 40 at central and extreme field points, respectively, due to anti-reflection coatings and intrinsic birefringence of the group of elements between the second wave plate and the image plane.
Figure 42A:
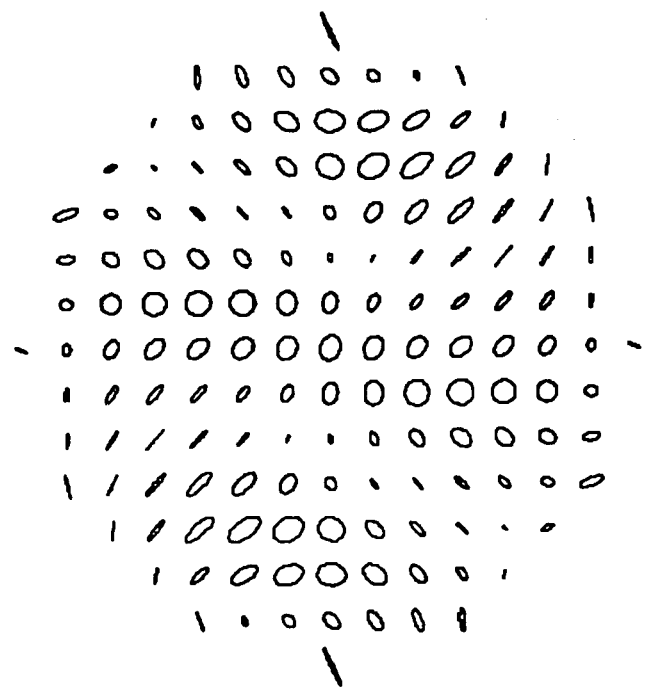

FIGS. 42A and 42B depict the retardance across the system exit pupil for field points at the center and extreme corner of the field (X=50 mm and Y=4 mm at the reticle), respectively, for the compensated system as detailed in Table 24, produced by the intrinsic birefringence of the group of elements following second wave plate 214 (in third group 246) and also due to anti-reflection coatings.

The total RMS and maximum retardance over the exit pupil are listed in Table 26 for five indicated field positions, including the effects of intrinsic birefringence for all elements and the single layer anti-reflection coatings used in the model. RMS retardance ranges from 0.0076 to 0.0123 waves at $\lambda_o$=193.3 nm. In one embodiment, RMS retardance may be minimized in the group of elements following the second wave plate, rather than the total retardance. Such reduction of retardance may sufficiently lower levels of retardance for the overall system, without the necessity of performing the same optimization on all element groups.

TABLE 26

| X Object Field | Y Object Field | Retardance (waves at $\lambda_o$ = 193.3 nm) | |
| --- | --- | --- | --- |
| Height (mm) | Height (mm) | RMS | Maximum |
| −50 | −4 | 0.0123 | 0.0824 |
| −35 | 0 | 0.0105 | 0.0689 |
| 0 | 0 | 0.0076 | 0.0493 |
| 35 | 0 | 0.0113 | 0.0733 |
| 50 | 4 | 0.0130 | 0.0828 |

FIGS. 43A and 43B are graphical representations depicting the retardance across the system exit pupil produced by the intrinsic birefringence of all elements and anti-reflection coatings for field points at the center and corner of the field (X=50 mm and Y=4 mm at the reticle), respectively, for the compensated system, as detailed in Table 24.

Similar to the refractive example of Embodiment 3, surface S2 of refractive optical element 218 immediately preceding aperture stop 233, is a toroidal surface in which the radius of curvature in orthogonal directions is varied along with the clocking of the surface to compensate for astigmatism due to variations in average index of refraction. The radii of curvature for the toroidal surface are listed in Table 27 below, and the local X- and Y-axes of the surface are rotated by −30° about the optical axis relative to the system X- and Y-axes.

TABLE 27

| Surface | Radius of Curvature (mm) |
| --- | --- |
| 218, Surface S2, local X direction | 1543.4724 |
| 218, Surface S2, local Y direction | 1543.4659 |

The fifth exemplary embodiment also illustrates that final element 227 of the exemplary lens shown in FIG. 34 and based on a known lens prescription, was split into sub-elements 227A and 227B shown in FIG. 40, to provide improved retardance aberration correction. The radius of curvature of the buried surface 250 between the elements and the thicknesses of the two segments were varied, keeping the total element thickness unchanged with respect to single element 227. Table 28 provides the radius of curvature and thicknesses of the two segments.

TABLE 28

| Element | Crystal Axis Direction for Zero Clocking | Element Clocking (degrees) | Front Radius of Curvature (mm) | Back Radius of Curvature (mm) | Thickness (mm) |
|---|---|---|---|---|---|
| 227A | [110] | −30.24 | 92.4548 | 263.3382 | 47.9615 |
| 227B | [100] | 11.80 | 263.3382 | −4239.8801 | 5.0385 |

Figure 44B:
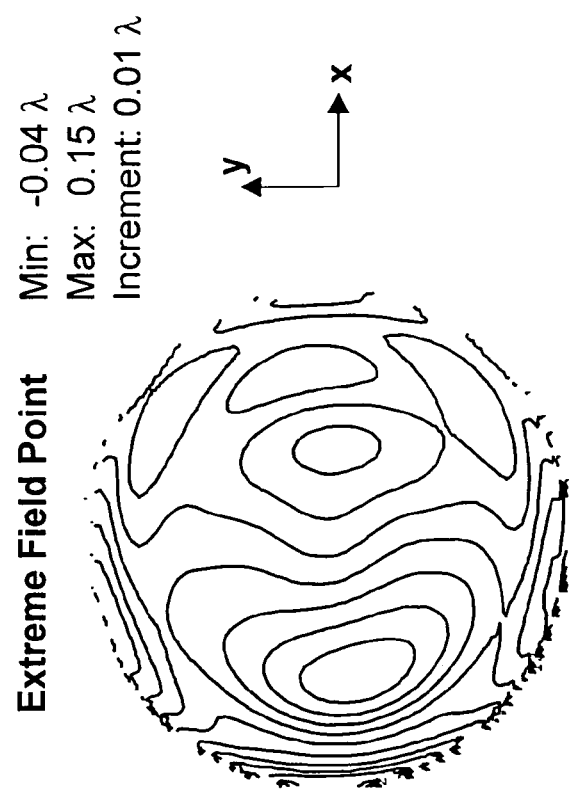
FIGS. 44A, 44B, 44C, and 44D are contour plots showing the residual wavefront error for the lens depicted in FIG. 40.
Figure 44A:
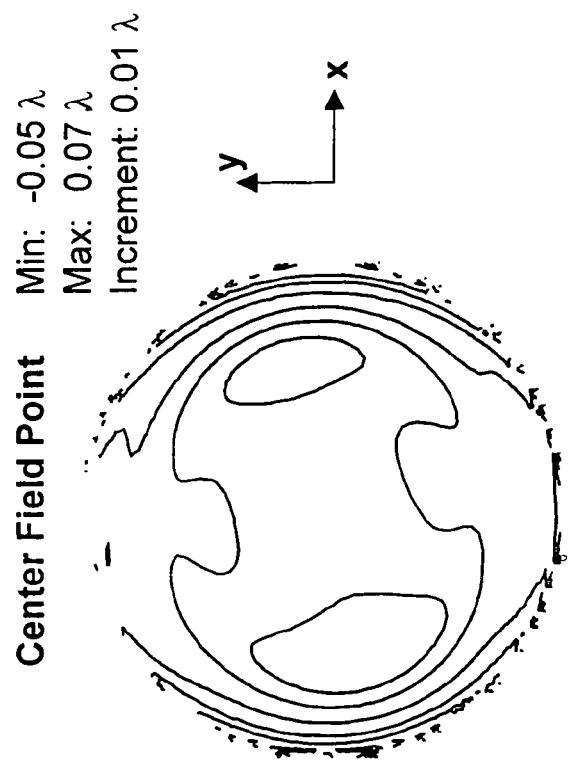
Figure 44D:
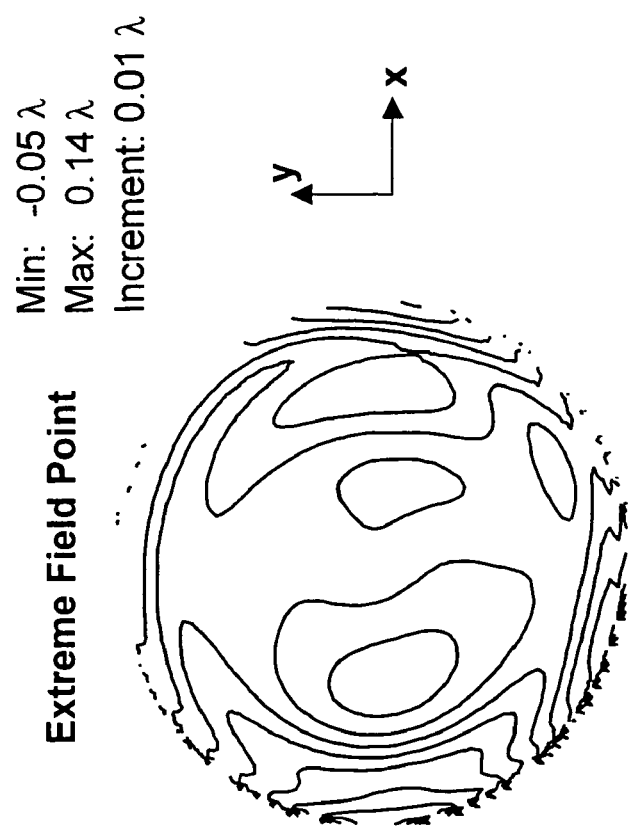
Figure 44C:
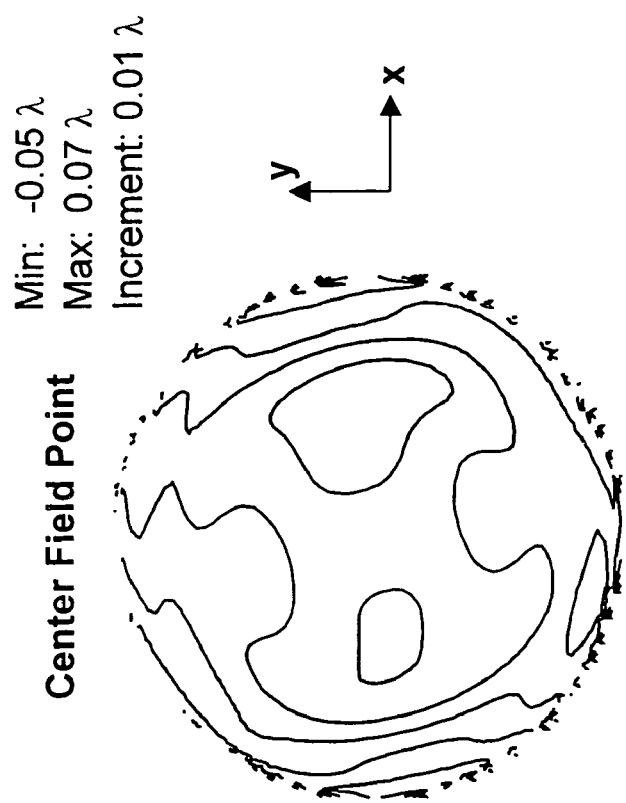

FIGS. 44A, 44B, 44C, and 44D are contour plots of wavefront errors plotted at the exit pupil for the optical system illustrated in FIG. 40. FIGS. 44A and 44B are contour plots of the residual wavefront error corresponding to an input polarization in the X direction used with an exit pupil analyzer in the X direction for the center and extreme corner of the field (X=50 mm and Y=4 mm at the reticle), respectively. For the wavefront error at the central field point shown in FIG. 44A, the maximum peak-to-valley optical path difference is approximately 0.125 waves at a wavelength of 193.3 nanometers, and for wavefront error at the at the extreme field shown in FIG. 44B, the maximum peak-to-valley optical path difference is approximately 0.191 waves. FIGS. 44C and 44D are contour plots of the residual wavefront error corresponding to an input polarization in the Y direction used with an exit pupil analyzer in the Y direction for the central and extreme field points, respectively. For the wavefront error at the central field point shown in FIG. 44C, the maximum peak-to-valley optical path difference is approximately 0.117 waves at a wavelength of 193.3 nanometers, and for the wavefront error at the extreme field shown in FIG. 44D, the maximum peak-to-valley optical path difference is approximately 0.192 waves.

The RMS and peak-to-valley wavefront errors are listed in Table 29 for the compensated design, including the effects of intrinsic birefringence, at five field points. These values represent the wavefront errors at optimum focus, but tilt terms have been removed to locate each image point at the center of the point-spread function. Results are given for two orthogonal polarization components. The X component represents the wavefront error assuming a linear polarizer along the X direction at the system exit pupil, and the Y component represents the wavefront error assuming a linear polarizer along the Y direction at the exit pupil.

TABLE 29

| | RMS Wavefront Error (waves at $\lambda_o$ = 193.3 nm) | | Peak-to-Valley Wavefront Error (waves at $\lambda_o$ = 193.3 nm) | |
|---|---|---|---|---|
| Object Field (X, Y) in mm | X Component | Y Component | X Component | Y Component |
| (−50, −4) | 0.018 | 0.016 | 0.185 | 0.189 |
| (−35, 0) | 0.019 | 0.017 | 0.176 | 0.180 |
| (0, 0) | 0.012 | 0.011 | 0.125 | 0.117 |
| (35, 0) | 0.018 | 0.017 | 0.177 | 0.184 |
| (50, 4) | 0.018 | 0.016 | 0.191 | 0.192 |

Table 29 shows that the RMS wavefront error varies across the field from 0.011 to 0.019 waves at λ=193 nm. This is comparable to the range of 0.011 to 0.016 waves described in Table 21 for the nominal design embodiment calculated without considering the effects of intrinsic birefringence The maximum change in RMS wavefront error from the nominal design embodiment calculated without considering the effects of intrinsic birefringence is 0.003 waves. It can be seen that a significant compensation for wavefront errors caused by intrinsic birefringence has been achieved by the techniques of the present invention. For comparison, according to a comparative exemplary embodiment in which all elements following the second wave plate are [110] optical elements oriented with the same three-dimensional crystal lattice directions, the peak retardance is approximately 0.75 waves, as shown in FIGS. 37A and 37B. The maximum peak-to-valley wavefront error for the compensated design with intrinsic birefringence is 0.192 waves, which is comparable to the maximum peak-to-valley wavefront error of 0.162 waves for the nominal design without intrinsic birefringence.

Table 30 shows the centroid distortion for the exemplary embodiment in which the effects of intrinsic birefringence are compensated for, as described above. This centroid distortion is calculated based on the point spread function and is listed for five exemplary field points. The maximum image distortion is approximately −38.5 nm, and the maximum change in distortion from the nominal design is approximately −13.8 nm. Distortion was not considered in this embodiment, but further design variables, such as discussed in conjunction with Embodiments 3 and 4 may be used to balance changes in distortion due to the intrinsic birefringence effects in the compensated system. The chief ray telecentricity error across the field is within 0.4 mrad and changes in chief ray telecentricity error are negligible.

TABLE 30

| Object Field (X, Y) in mm | X PSF Centroid Distortion (nm) | Y PSF Centroid Distortion (nm) |
|---|---|---|
| (−50, −4) | −38.01 | −5.48 |
| (−35, 0) | −38.53 | −1.18 |
| (0, 0) | −0.11 | −0.05 |
| (35, 0) | 38.26 | 1.13 |
| (50, 4) | 37.70 | 5.53 |

Table 31 provides a summary of the performance of the exemplary system in terms of the Strehl ratio. Strehl ratio values in Table 31 are calculated at field points centered on the wavefront in the exit pupil (i.e., wavefront distortion effects were removed).

As shown in Table 31, an aberration free system has a Strehl ratio of 0.8178 at a numerical aperture of 0.80. For the nominal design without intrinsic birefringence effects considered, the Strehl ratio is reduced by a maximum value of 0.0084. For the compensated system with intrinsic birefringence, the Strehl ratio is reduced from that of an aberration free system by a maximum value of 0.0151.

TABLE 31

| | Object Field (X, Y) in mm | | | | |
|---|---|---|---|---|---|
| Design Layout | (−50, −4) | (−35, 0) | (0, 0) | (35, 0) | (50, 4) |
| Aberration-free lens (0.80 NA) | 0.8178 | 0.8178 | 0.8178 | 0.8178 | 0.8178 |
| Nominal, no birefringence considered | 0.8102 | 0.8096 | 0.8134 | 0.8094 | 0.8101 |
| Elements aligned to compensate | 0.8056 | 0.8063 | 0.8110 | 0.8045 | 0.8027 |

Also as described in conjunction with previous embodiments, one or more stress birefringent elements, wave plates, or combinations thereof may additionally be used to correct for residual birefringence variation and constant residual retardance which remains in the catadioptric system after the above-described system corrections have been made.

Referring again to FIG. 40, according to yet another exemplary embodiment, stress may be applied to a reflective element such as mirror surfaces 211 or 216 to alter the base radius of curvature in orthogonal directions. This stress may correct for residual astigmatism in the exemplary catadioptric optical system. As described in conjunction with embodiment three, the use of at least one optical element whose base radius of curvature differs in orthogonal directions may additionally or alternatively be used to compensate for residual astigmatism due to variations in the average index of refraction in the cubic crystalline optical elements.

According to other exemplary catadioptric embodiments, some of the lens elements may be formed of non-cubic crystalline material or additional lens elements formed of non-cubic crystalline material may be used. Various suitable non-cubic crystalline materials such as dry fused silica may be used.

According to still other catadioptric embodiments, the principles of the present invention may be applied to catadioptric systems that do not include beam splitters or wave plates, such as described in U.S. Pat. No. 6,195,213 B1 to Omura et al., the contents of which are hereby incorporated by reference.

In summary, embodiment five demonstrates that the principles of the present invention may be applied to a catadioptric optical system to significantly reduce intrinsic birefringence effects and system retardance, to levels acceptable for high numerical aperture lithography.

EMBODIMENT 6

Figure 45:
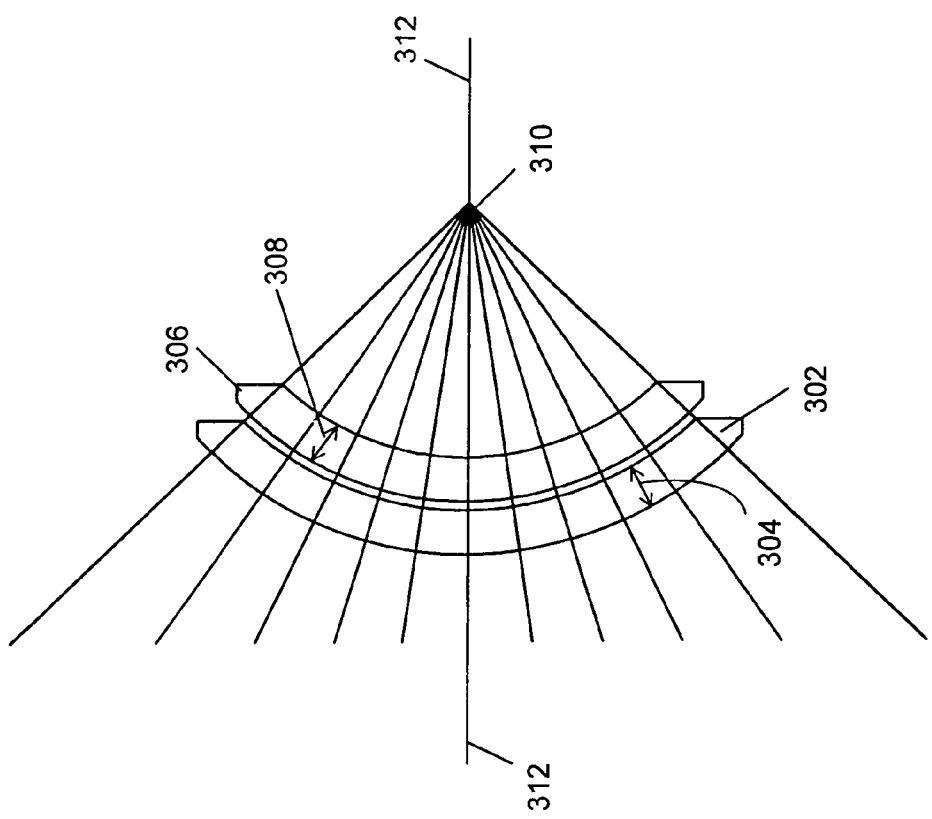
FIG. 45 is a schematic illustration of an exemplary optical system with two cubic crystalline elements concentric about the focal point of a converging beam.

FIG. 45 shows an exemplary arrangement of an optical system used to demonstrate the basic technique for mitigating the effects of intrinsic birefringence using an element including a stress-induced birefringence. This illustrated optical system consists of two cubic crystalline optical elements concentric about focal point 310 of a converging beam. The beam passes through two cubic crystalline elements 302 and 306 whose radii of curvature are specified to be concentric with focal point 310. Cubic crystalline optical elements 302 and 306 have thicknesses 304 and 308, respectively. In an exemplary embodiment, each of thicknesses 304 and 308 may be 5 mm and cubic crystalline elements 302 and 306 may be assumed to have a birefringence magnitude, $n_e - n_o$, of $-12 \times 10^{-7}$, corresponding to the intrinsic birefringence of calcium fluoride measured at a wavelength of 157 nm. Cubic crystalline optical elements 302 and 306 may each be [110] cubic crystalline optical elements aligned along common optical axis 312, with a relative clocking of 90 degrees about optical axis 312. According to other exemplary embodiments, the relative clocking of the elements may vary, the crystal orientation of the elements may vary, and additional elements may be included.

First optical element 302 includes a compressive hoop stress of approximately 19 lbs./in$^2$ applied around the perimeter of the element to minimize net RMS retardance of the system. Various techniques may be used to stress the element, and tensile and compressive stresses of various other magnitudes may be used in other exemplary embodiments.

FIG. 46A is a graphical representation depicting the individual retardance contribution due to the stress-induced birefringence of first element 302 and excluding the effects of intrinsic birefringence. FIG. 46A includes a peak retardance of 0.0142 waves and RMS retardance of 0.0047 waves.

FIG. 46B depicts the net retardance for optical system of this exemplary embodiment including the stress-induced birefringence, and shows a maximum residual retardance of 0.0186 waves and RMS retardance of 0.0065 waves. The resulting retardance variation over the pupil shown in FIG. 46B is similar to the retardance variation given in FIG. 9C as a result of the addition of a 2.3 mm thick [100] cubic crystalline third optical element. According to the embodiment using the stress-induced birefringence, the maximum peak and RMS net retardance values are comparable to the respective values of 0.0139 and 0.0041 waves for the embodiment described in FIG. 9C. In this manner, stress-induced birefringence applied to one of the [110] optical elements is shown to provide similar correction as the addition of a [100] cubic crystalline element.

Such application of stress-induced birefringence to a [110] optical element of an exemplary optical system including two [110] optical elements, is intended to be exemplary only. The stress-induced birefringence may be applied to the other [110] optical element 306 in another exemplary embodiment. Furthermore, this technique may be advantageously applied to various other optical systems including various numbers of elements clocked at various angles with respect to one another. The stress-induced birefringence may be applied to [100], [111] or non-cubic crystalline optical elements such as dry fused silica, for example. According to one exemplary embodiment, a third, non-birefringent element may be added to the arrangement shown in FIG. 45 (such as the arrangement shown in FIG. 6, for example) and the stress-induced birefringence may be applied thereto.

The previously-described method for measuring or using computer modeling to determine the retardance of an optical system, identifying an optical element or elements to have stress-induced birefringence applied thereto, then applying the compressive or tensile stress as a hoop or other stress to the identified optical element, may be likewise used in the present embodiment, to produce stress-induced birefringence as described above, and to reduce residual retardance.

The principles described in embodiment 6, may be applied to the previously described exemplary lens systems. In particular, stress-induced birefringence may be applied to the illustrated elements or additional elements added to the illustrated embodiments.

The preceding six exemplary embodiments are intended to be illustrative, not restrictive of the present invention. Furthermore, it is intended that the various exemplary techniques for compensating the effects of intrinsic birefringence, including retardance aberrations, wavefront aberrations produced by variations in average index of refraction, and variations in system transmittance, described in conjunction with one of the exemplary embodiments, may also be applied to the other exemplary embodiments. For example, the selection of multiple [110] optical elements together with at least one [100] optical element, the relative clocking of the elements, [111] optical elements, stress-induced birefringent elements with radially varying stress, stress induced birefringent elements with stress varying along axes perpendicular to the optical axis, the selection of various other lens orientations, the optimization of lens element thicknesses, spacings, radii of curvature and aspheric coefficients, and the other exemplary techniques and elements may be used to correct for intrinsic birefringence in the various exemplary optical systems. Similarly, another aspect of the present invention—the method for compensating for residual astigmatism due to variations in the average index of refraction in the cubic crystalline optical elements, through the use of at least one optical element whose base radius of curvature differs in orthogonal directions, may be used in any of the previous embodiments.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A lithographic apparatus comprising:
    a radiation system configured to condition a beam of radiation;
    a patterning device configured to pattern the beam of radiation to form a patterned beam of radiation; and
    a projection system configured to project the patterned beam of radiation onto a surface of a substrate, the projection system including a plurality of cubic crystalline optical elements that each impart retardance to the patterned beam of radiation, said plurality of cubic crystalline optical elements being aligned along an optical axis of the projection system and including two adjacent crystalline optical elements having a common crystalline lattice direction oriented along said optical axis, each of said two adjacent crystalline optical elements having a substantially rotationally symmetric surface about said optical axis and having increased intrinsic birefringence magnitude at a set of lobes at a set of locations arranged in an azimuthal direction about said optical axis, and a first of said two adjacent crystalline optical elements being rotated about said optical axis with respect to a second of the adjacent crystalline optical elements with a predetermined rotation angle such that the set of lobes of the first of said two adjacent crystalline optical elements is positioned at locations azimuthally offset from the set of locations of the set of lobes of the second of the adjacent crystalline optical elements, said plurality of crystalline optical elements being selected and positioned along said optical axis and said rotation angle being selected such that, for each of two substantially perpendicular polarization states of said beam of radiation having a radiation wavelength of about 193 nm, said patterned beam of radiation has less than about 0.012 waves RMS of wavefront aberration across an exit pupil of the projection system.

2. The apparatus of claim 1, wherein the projection system is a refractive system having a numerical aperture greater than about 0.7.

3. The apparatus of claim 1, further comprising a birefringent element that produces radially-oriented retardance that increases from a center to an edge of the birefringent element.

4. The apparatus of claim 3, wherein the birefringent element is a meniscus and the radially-oriented retardance is produced by applying a hoop stress to the edge of the element.

5. The apparatus of claim 1, wherein the plurality of cubic crystalline elements include elements having a birefringence magnitude opposite in sign so as to substantially cancel retardance produced by intrinsic birefringence.

6. The apparatus of claim 5, wherein the plurality of cubic crystalline elements include calcium fluoride and barium fluoride lens elements.

7. The apparatus of claim 1, wherein the plurality of cubic crystalline elements include calcium fluoride elements.

8. The apparatus of claim 1, wherein a surface of one of said plurality of cubic crystalline elements is non-rotationally symmetric or includes an asymmetric variation in curvature.

9. The apparatus of claim 1, wherein said surface is positioned adjacent to an aperture stop of said projection system.

10. The apparatus of claim 1, wherein said wavefront aberration varies less than about 0.003 waves RMS across said exit pupil for each of the two substantially perpendicular polarization states of said beam of radiation.

11. The apparatus of claim 1, wherein the common crystalline lattice direction is a [111] lattice direction.

12. The apparatus of claim 1, wherein the projection system comprises a catadioptric system including at least one reflective surface.

13. The apparatus of claim 1, wherein the projection system further comprises a plurality of fused silica lens elements.

14. The apparatus of claim 1, wherein the projection system has less than about 0.010 waves RMS of wavefront aberration across an exit pupil of the projection system at a radiation of about 193 nm for each of the two substantially perpendicular polarization states of said beam of radiation.

15. The apparatus of claim 1, wherein said two cubic crystalline optical elements are oriented such that peak intrinsic birefringence lobes of said two cubic crystalline optical elements are rotated with respect to each other.

16. The apparatus of claim 15, wherein said rotation angle is about 60°.

17. The apparatus of claim 1, wherein said projection system includes at least about 15 lens elements.

18. The apparatus of claim 17, wherein said projection system includes at least about 25 lens elements.

19. A device manufacturing method comprising:
    patterning a beam of radiation to form a patterned beam of radiation, and
    projecting the patterned beam of radiation with a projection system, the projection system including a plurality of cubic crystalline optical elements that each impart retardance to the patterned beam of radiation, said plurality of cubic crystalline optical elements being aligned along an optical axis of the projection system and including two adjacent crystalline optical elements having a common crystalline lattice direction oriented along said optical axis, each of said two adjacent crystalline optical elements having a substantially rotationally symmetric surface about said optical axis and having increased intrinsic birefringence magnitude at a set of lobes at a set of locations arranged in an azimuthal direction about said optical axis, and a first of said two adjacent crystalline optical elements being rotated about said optical axis with respect to a second of the adjacent crystalline optical elements with a predetermined rotation angle such that the set of lobes of the first of said two adjacent crystalline optical elements is positioned at locations azimuthally offset from the set of locations of the set of lobes of the second of the adjacent crystalline optical elements, said plurality of crystalline optical elements being selected and positioned along said optical axis and said rotation angle being selected such that, for each of two substantially perpendicular polarization states of said beam of radiation having a radiation wavelength of about 193 nm, said patterned beam of radiation has less than about 0.012 waves RMS of wavefront aberration across an exit pupil of the projection system.

* * * * *